United States Patent
Yoda et al.

(10) Patent No.: US 10,867,649 B2
(45) Date of Patent: Dec. 15, 2020

(54) MAGNETIC MEMORY DEVICE

(71) Applicant: KABUSHIKI KAISHA TOSHIBA, Tokyo (JP)

(72) Inventors: Hiroaki Yoda, Kanagawa (JP); Satoshi Takaya, Kanagawa (JP); Yuichi Ohsawa, Kanagawa (JP); Naoharu Shimomura, Tokyo (JP); Katsuhiko Koui, Kanagawa (JP); Yushi Kato, Tokyo (JP); Shinobu Fujita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 44 days.

(21) Appl. No.: 16/273,387

(22) Filed: Feb. 12, 2019

(65) Prior Publication Data
US 2020/0020374 A1 Jan. 16, 2020

(30) Foreign Application Priority Data
Jul. 10, 2018 (JP) .................. 2018-130943

(51) Int. Cl.
*G11C 11/16* (2006.01)
*H01L 43/04* (2006.01)
*G11C 11/15* (2006.01)

(52) U.S. Cl.
CPC ............ *G11C 11/161* (2013.01); *G11C 11/15* (2013.01); *G11C 11/1655* (2013.01); *G11C 11/1657* (2013.01); *H01L 43/04* (2013.01)

(58) Field of Classification Search
CPC ................................... G11C 11/161
See application file for complete search history.

(56) References Cited

U.S. PATENT DOCUMENTS

| 7,095,646 B2 | 8/2006 | Slaughter et al. |
| 2012/0020148 A1 | 1/2012 | Dimitrov |
| 2015/0213867 A1* | 7/2015 | Wu ..................... G11C 11/5607 365/158 |
| 2017/0278567 A1 | 9/2017 | Klein et al. |

(Continued)

FOREIGN PATENT DOCUMENTS

| JP | 2005-535111 | 11/2005 |
| JP | 4620459 | 1/2011 |

(Continued)

*Primary Examiner* — Douglas King
(74) *Attorney, Agent, or Firm* — Finnegan, Henderson, Farabow, Garrett & Dunner, L.L.P.

(57) ABSTRACT

According to one embodiment, a magnetic memory device includes a first conductive layer, a first stacked body, and a controller. The first conductive layer includes a first region, a second region, and a third region between the first region and the second region. The first stacked body includes a first magnetic layer, a second magnetic layer provided between the third region and the first magnetic layer in a first direction crossing a second direction, and a first nonmagnetic layer provided between the first magnetic layer and the second magnetic layer. The second direction is from the first region toward the second region. The controller electrically is connected to the first region, the second region, and the first magnetic layer. The controller performs at least first to third operations. In the operations, the controller sets the first stacked body to first to third resistance state.

20 Claims, 33 Drawing Sheets

(56) References Cited

U.S. PATENT DOCUMENTS

| | | | |
|---|---|---|---|
| 2018/0040359 A1* | 2/2018 | Inokuchi | G11C 11/1673 |
| 2019/0067561 A1* | 2/2019 | Avci | G11C 11/18 |
| 2019/0094315 A1* | 3/2019 | Inubushi | G11B 5/3929 |

FOREIGN PATENT DOCUMENTS

| | | |
|---|---|---|
| JP | 6256965 B1 | 1/2018 |
| JP | 2018-22544 | 2/2018 |

* cited by examiner

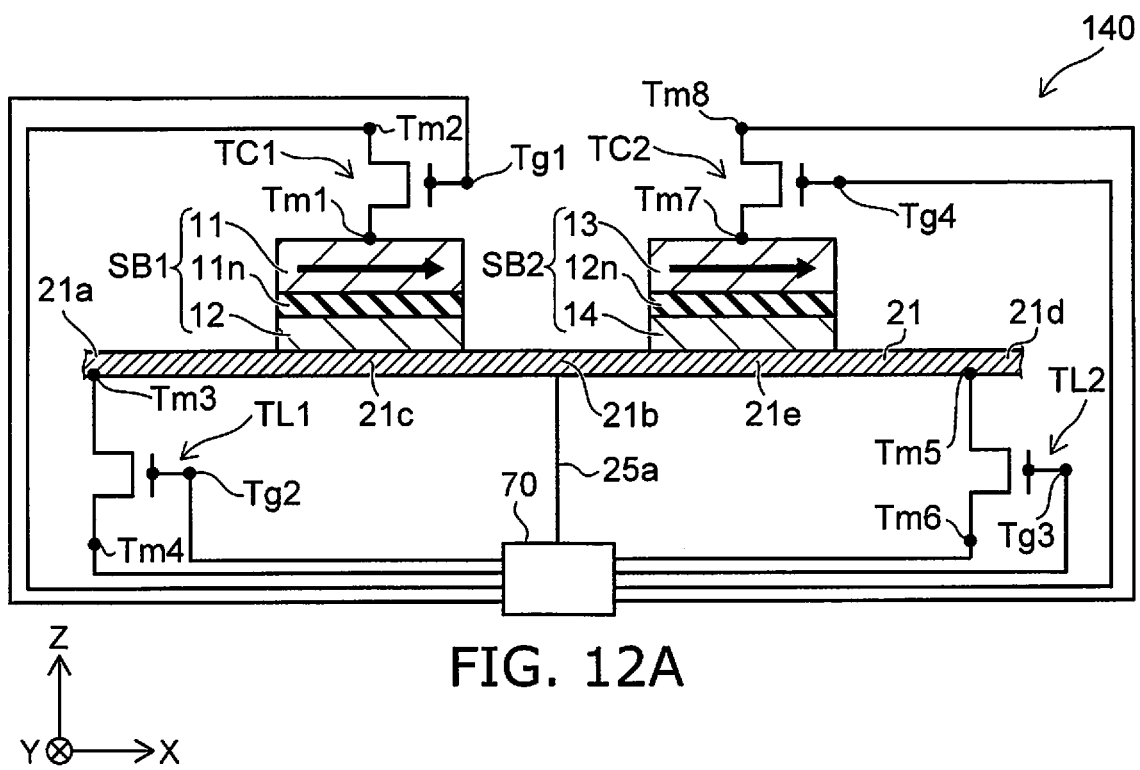
FIG. 12A
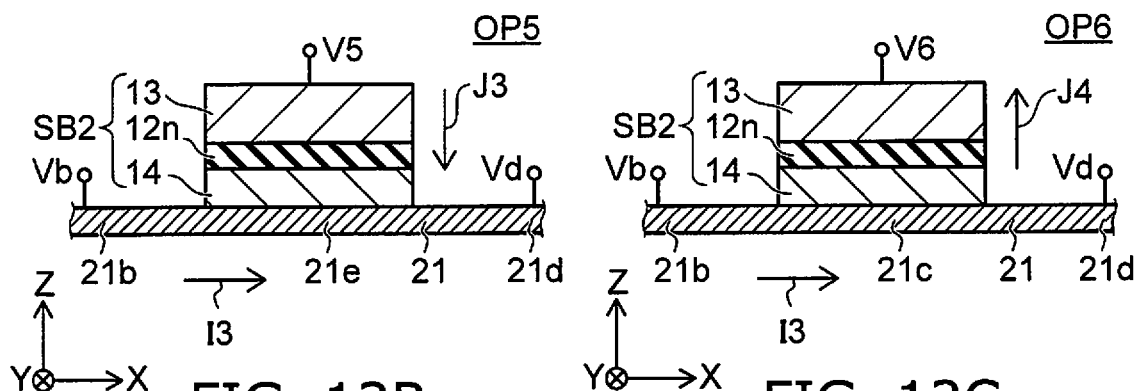
FIG. 12B
FIG. 12C
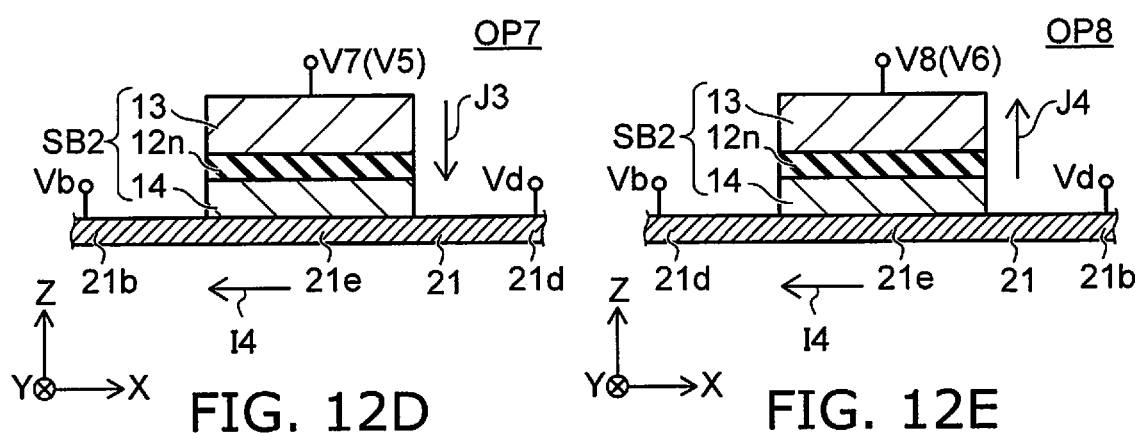
FIG. 12D
FIG. 12E

MAGNETIC MEMORY DEVICE

CROSS-REFERENCE TO RELATED APPLICATIONS

This application is based upon and claims the benefit of priority from Japanese Patent Application No. 2018-130943, filed on Jul. 10, 2018; the entire contents of which are incorporated herein by reference.

FIELD

Embodiments described herein relate generally to a magnetic memory device.

BACKGROUND

It is desirable to increase the storage density of a magnetic memory device.

BRIEF DESCRIPTION OF THE DRAWINGS

FIG. 12A to FIG. 12E are schematic views illustrating a magnetic memory device according to the first embodiment;

DETAILED DESCRIPTION

Figure 1A:
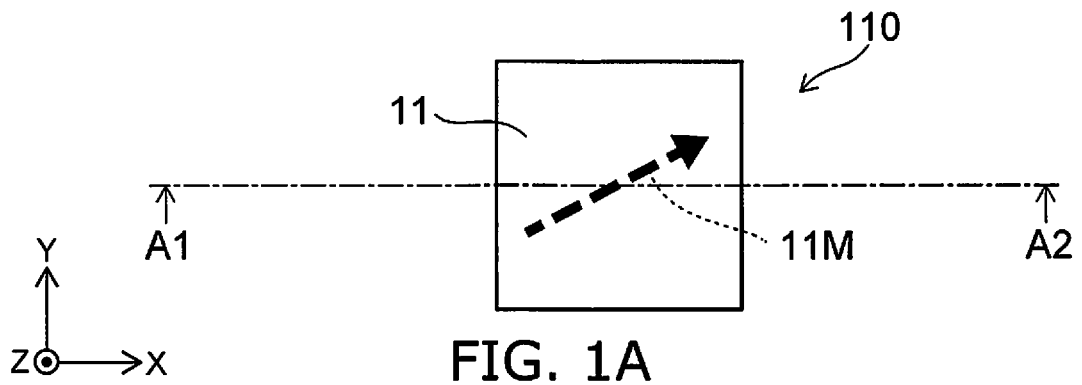
FIG. 1A to FIG. 1C are schematic views illustrating a magnetic memory device according to a first embodiment.

According to one embodiment, a magnetic memory device includes a first conductive layer, a first stacked body, and a controller. The first conductive layer includes a first region, a second region, and a third region between the first region and the second region. The first stacked body includes a first magnetic layer, a second magnetic layer provided between the third region and the first magnetic layer in a first direction crossing a second direction, and a first nonmagnetic layer provided between the first magnetic layer and the second magnetic layer. The second direction is from the first region toward the second region. The controller electrically is connected to the first region, the second region, and the first magnetic layer. The controller performs at least first to third operations. In the first operation, the controller sets the first stacked body to a first resistance state by supplying a first current to the first conductive layer in an orientation from the first region toward the second region while setting the first magnetic layer to a first potential. In the second operation, the controller sets the first stacked body to a second resistance state different from the first resistance state by supplying the first current to the first conductive layer while setting the first magnetic layer to a second potential different from the first potential. In the third operation, the controller sets the first stacked body to a third resistance state different from the first resistance state and different from the second resistance state by supplying a second current to the first conductive layer in an orientation from the second region toward the first region while setting the first magnetic layer to a third potential different from the second potential.

According to another embodiment, a magnetic memory device includes a first conductive layer, a first stacked body, and a controller. The first conductive layer includes a first region, a second region, and a third region between the first region and the second region. The first stacked body includes a first magnetic layer, a second magnetic layer provided between the third region and the first magnetic layer in a first direction crossing a second direction, and a first nonmagnetic layer provided between the first magnetic layer and the second magnetic layer. The second direction is from the first region toward the second region. The controller electrically is connected to the first region, the second region, and the first magnetic layer. The first nonmagnetic layer has a crystal structure of a cubic crystal. A lattice length of the cubic crystal along the first direction is different from a lattice length of the cubic crystal along a direction perpendicular to the first direction. The controller performs at least first to fourth operations. In the first operation, the controller sets the first stacked body to a first resistance state by setting the first magnetic layer to a first potential. In the second operation, the controller sets the first stacked body to a second resistance state different from the first resistance state by setting the first magnetic layer to a second potential different from the first potential. In the third operation, the controller sets the first stacked body to a third resistance state different from the first resistance state and different from the second resistance state by supplying a first current to the first conductive layer in an orientation from the first region toward the second region. In the fourth operation, the controller sets the first stacked body to a fourth resistance state different from the first resistance state, different from the second resistance state, and different from the third resistance state by supplying a second current to the first conductive layer in an orientation from the second region toward the first region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
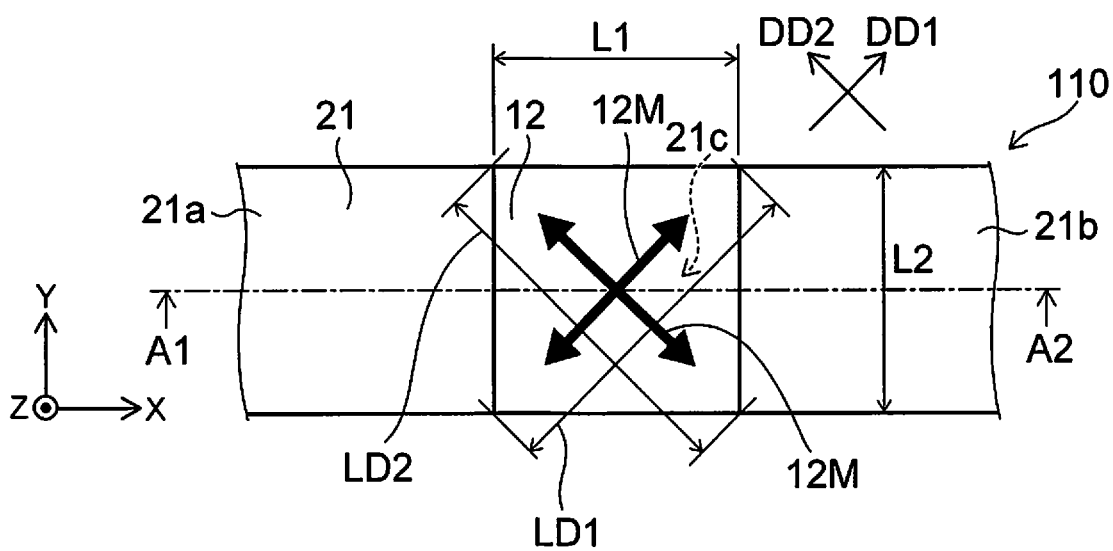
Figure 1C:
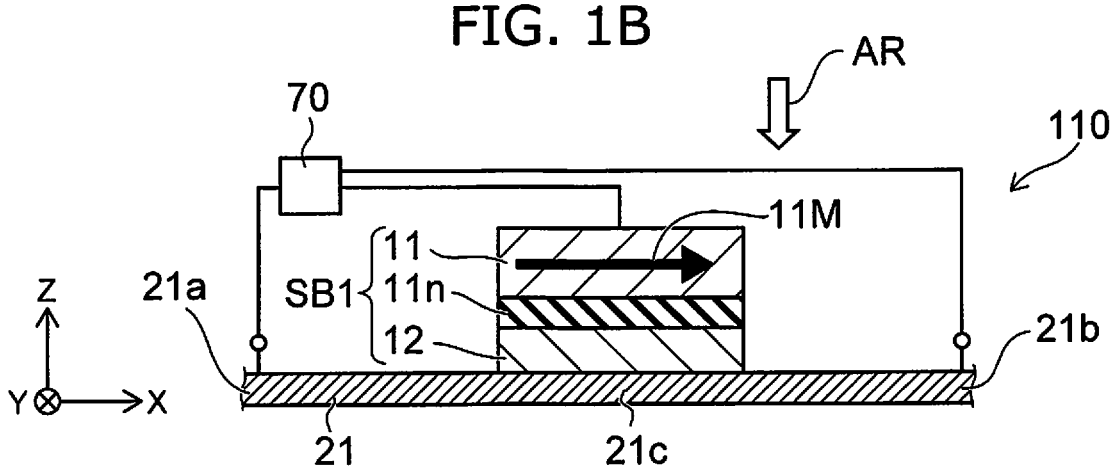

FIG. 1A to FIG. 1C are schematic views illustrating a magnetic memory device according to a first embodiment.

FIG. 1A and FIG. 1B are plan views when viewed along arrow AR of FIG. 1C. Some of the components are illustrated as being extracted in these drawings. FIG. 1C illustrates a line A1-A2 cross section of FIG. 1A and FIG. 1B.

As shown in FIG. 1C, the magnetic memory device 110 according to the embodiment includes a first conductive layer 21, a first stacked body SB1, and a controller 70.

The first conductive layer 21 includes a first region 21a, a second region 21b, and a third region 21c. The third region 21c is provided between the first region 21a and the second region 21b. These regions are continuous with each other. The first conductive layer 21 includes a metallic element. The metallic element includes, for example, Ta. Other examples of the material of the first conductive layer 21 are described below.

The first stacked body SB1 includes a first magnetic layer 11, a second magnetic layer 12, and a first nonmagnetic layer 11n. The second magnetic layer 12 is provided between the third region 21c and the first magnetic layer 11 in a first direction. The first direction crosses a second direction from the first region 21a toward the second region 21b.

The first direction is taken as a Z-axis direction. One direction perpendicular to the Z-axis direction is taken as an X-axis direction. A direction perpendicular to the X-axis direction and the Z-axis direction is taken as a Y-axis direction.

In the example, the second direction corresponds to the X-axis direction. For example, the direction from the second magnetic layer 12 toward the first magnetic layer 11 corresponds to the first direction (the Z-axis direction).

The first nonmagnetic layer 11n is provided between the first magnetic layer 11 and the second magnetic layer 12. Other layers may be provided between the first magnetic layer 11 and the first nonmagnetic layer 11n. Other layers may be provided between the second magnetic layer 12 and the first nonmagnetic layer 11n.

For example, the second magnetic layer 12 contacts the first conductive layer 21 (the third region 21c).

The first magnetic layer 11 is, for example, ferromagnetic. The second magnetic layer 12 is, for example, ferromagnetic. The first magnetic layer 11 and the second magnetic layer 12 include, for example, at least one selected from the group consisting of Fe and Co. The first nonmagnetic layer 11n includes, for example, MgO. The first nonmagnetic layer 11n may include, for example, at least one selected from the group consisting of Ga, Al, and Cu. Other examples of the materials of the first magnetic layer 11, the second magnetic layer 12, and the first nonmagnetic layer 11n are described below.

FIG. 1A illustrates the planar configuration of the first magnetic layer 11. FIG. 1B illustrates the planar configurations of the second magnetic layer 12 and the first conductive layer 21. As shown in FIG. 1B, the first conductive layer 21 has, for example, a band configuration extending in the X-axis direction. In the example as shown in FIG. 1A and FIG. 1B, the first magnetic layer 11 and the second magnetic layer 12 are rectangles. These magnetic layers are, for example, substantially squares. As described below, various modifications of the configuration of at least one of these magnetic layers are possible.

The first magnetic layer 11 is, for example, a fixed magnetic layer. The second magnetic layer 12 is, for example, a free magnetic layer. A first magnetization 11M of the first magnetic layer 11 (referring to FIG. 1A) does not change easily compared to a second magnetization 12M of the second magnetic layer 12 (referring to FIG. 1B). For example, the first magnetic layer 11 functions as a reference layer. For example, the second magnetic layer 12 functions as a memory layer.

For example, the orientation of the first magnetization 11M is substantially fixed in the state of use of the magnetic memory device 110. The orientation of the second magnetization 12M is modifiable. In the example as shown in FIG. 1B, the second magnetization 12M is oriented in four orientations.

As one example, the orientation of the magnetization is described as an angle referenced to the +Y direction. In the example shown in FIG. 1A, the orientation of the first magnetization 11M is substantially "≈0.35π" (radians). In the description, "≈" means "about." Hereinbelow, the description of the units is omitted as appropriate in the case where the units of the angle for the direction is radians. In the example shown in FIG. 1B, the orientation (the angle) of the second magnetization 12M is substantially one of 1π/4, 3π/4, 5π/4, or 7π/4. The orientation (the angle) of the second magnetization 12M is, for example, one of "≈1π/4," "≈3π/4," "≈5π/4," or "≈7π/4." As described below, four resistance states are obtained according to the differences between the orientation of the first magnetization 11M and the four orientations of the second magnetization 12M.

For example, the first stacked body SB1 functions as a magnetic variable resistance element. For example, a TMR (Tunnel Magneto Resistance Effect) occurs in the first stacked body SB1. For example, the electrical resistance of the path including the first magnetic layer 11, the first nonmagnetic layer 11n, and the second magnetic layer 12 changes according to the difference between the orientation of the first magnetization 11M and the orientation of the second magnetization 12M. The first stacked body SB1 includes, for example, a magnetic tunnel junction (MTJ). For example, the first stacked body SB1 corresponds to a MTJ element. For example, the first stacked body SB1 may correspond to a GMR element.

For example, the first stacked body SB1 corresponds to one memory portion (memory cell).

The controller 70 is electrically connected to the first region 21a, the second region 21b, and the first magnetic layer 11. As shown in FIG. 1C, an interconnect is provided between the controller 70 and the first region 21a. An interconnect is provided between the controller 70 and the second region 21b. An interconnect is provided between the controller 70 and the first magnetic layer 11. As described below, switch elements (e.g., transistors, etc.) may be provided partway through these interconnects.

The controller 70 performs various operations. The operations include, for example, first to fourth operations described below. The first to fourth operations correspond to program operations of information.

FIG. 2A to FIG. 2D are schematic views illustrating the operations of the magnetic memory device according to the first embodiment.

The controller 70 is not illustrated in these drawings. These drawings correspond respectively to first to fourth operations OP1 to OP4.

Figure 2A:
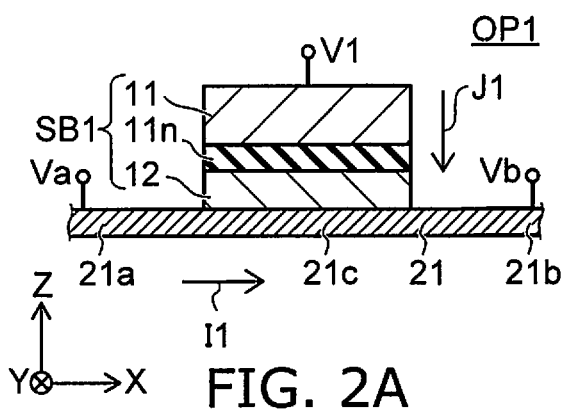
FIG. 2A to FIG. 2D are schematic views illustrating the operations of the magnetic memory device according to the first embodiment.

In the first operation OP1 as shown in FIG. 2A, the controller 70 sets the first stacked body SB1 to a first resistance state by supplying a first current I1 to the first conductive layer 21 while setting the first magnetic layer 11 to a first potential V1. The first current I1 has the orientation from the first region 21a toward the second region 21b.

Figure 2B:
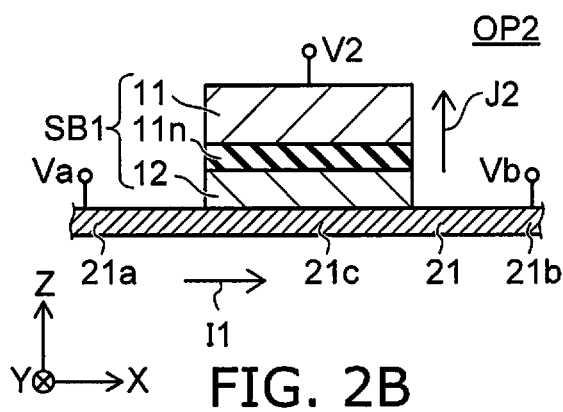

In the second operation OP2 as shown in FIG. 2B, the controller 70 sets the first stacked body SB1 to a second resistance state by supplying the first current I1 recited above to the first conductive layer 21 while setting the first magnetic layer 11 to a second potential V2. The second potential V2 is different from the first potential V1. The second resistance state is different from the first resistance state.

Figure 2C:
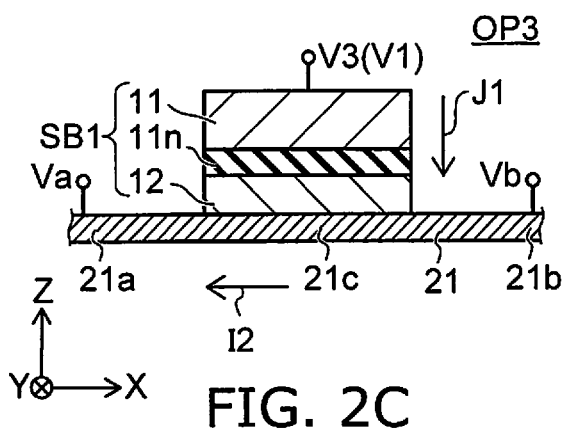

In the third operation OP3 as shown in FIG. 2C, the controller 70 sets the first stacked body SB1 to a third resistance state by supplying a second current I2 to the first conductive layer 21 while setting the first magnetic layer 11 to a third potential V3. The third potential V3 is different from the second potential V2. For example, the third potential V3 may be substantially the same as the first potential V1. The second current I2 has the orientation from the second region 21b toward the first region 21a. The third resistance state is different from the first resistance state and different from the second resistance state.

Figure 2D:
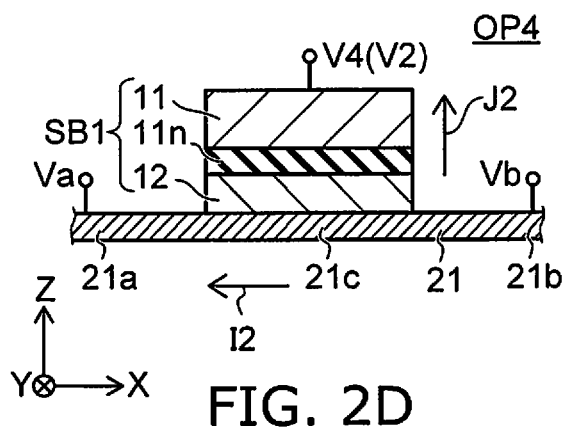

In the fourth operation OP4 as shown in FIG. 2D, the controller 70 sets the first stacked body SB1 to a fourth resistance state by supplying the second current I2 recited above to the first conductive layer 21 while setting the first magnetic layer 11 to a fourth potential V4. The fourth potential V4 is different from the third potential V3. The fourth potential V4 may be substantially the same as the second potential V2. The fourth resistance state is different from the first resistance state, different from the second resistance state, and different from the third resistance state.

In the case where the third potential V3 is the same as the first potential V1, and the fourth potential V4 is the same as the second potential V2, there are two types of potentials. On the other hand, the current that flows in the first conductive layer 21 has the two types of the first current I1 and the second current I2. For example, the second magnetization 12M can be controlled to have four types of orientations by the combination of the two types of potentials and the two types of currents.

An example of the control of the orientation of the magnetization will now be described. To simplify the description hereinbelow, the third potential V3 is taken to be the same as the first potential V1; and the fourth potential V4 is taken to be the same as the second potential V2.

FIG. 3A to FIG. 3F are schematic views illustrating operations of the magnetic memory device according to the first embodiment.

Figure 3A:
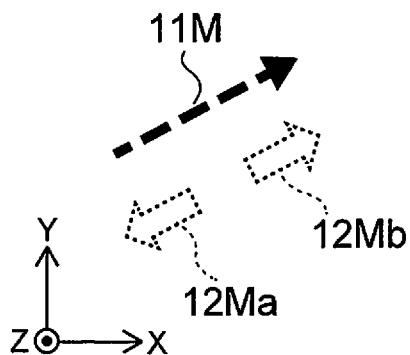
FIG. 3A to FIG. 3F are schematic views illustrating operations of the magnetic memory device according to the first embodiment.

FIG. 3A shows an example of the control of the second magnetization 12M by the potential of the first magnetic layer 11. A current (a stacking direction current) along the Z-axis direction is caused to flow in the first stacked body SB1 by applying the first potential V1 or the second potential V2. The orientation of the stacking direction current is, for example, the +Z direction or the −Z direction. It is considered that two types of vectors occur in the second magnetization 12M of the second magnetic layer 12 according to the orientation of the stacking direction current. For example, the two types of vectors are "parallel" or "antiparallel" to the first magnetization 11M of the first magnetic layer 11. It is considered that these vectors are based on, for example, a spin torque transfer (STT) effect.

For example, a vector 12Ma that is one of "parallel" or "antiparallel" to the first magnetization 11M is applied to the second magnetization 12M by applying the first potential V1 (or the third potential V3). For example, a vector 12Mb that is the other of "parallel" or "antiparallel" to the first magnetization 11M is applied to the second magnetization 12M by applying the second potential V2 (or the fourth potential V4).

Figure 3B:
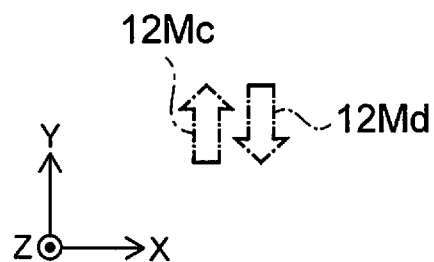
Figure 3C:
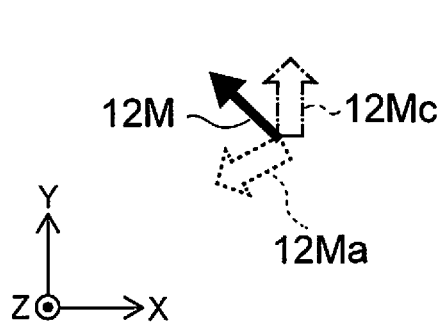
Figure 3D:
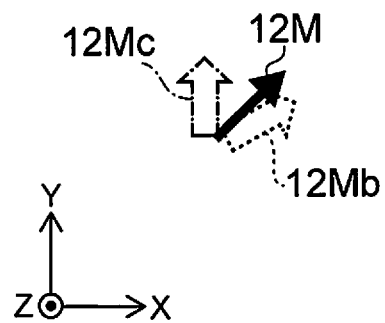
Figure 3E:
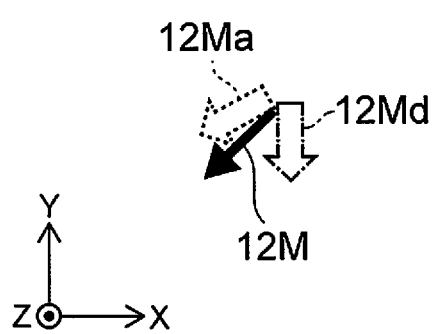
Figure 3F:
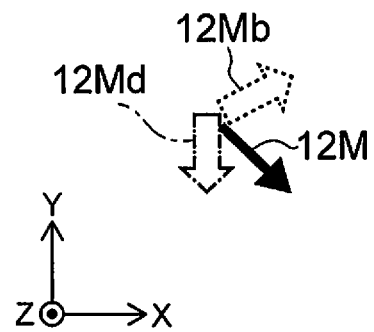

FIG. 3B shows an example of the control of the second magnetization 12M by the two types of currents flowing in the first conductive layer 21. It is considered that two types of vectors occur in the second magnetization 12M of the second magnetic layer 12 due to the current flowing in the first conductive layer 21. For example, the two types of vectors have two types of orientations crossing the direction of the current of the first conductive layer 21. It is considered that these vectors are based on, for example, a spin-orbit torque (SOT) effect.

For example, one of a vector 12Mc in the +Y direction or a vector 12Md in the −Y direction is applied by the first current I1. For example, the other of the vector 12Mc in the +Y direction or the vector 12Md in the −Y direction is applied by the second current I2.

FIG. 3C to FIG. 3F illustrate the second magnetization 12M when the combinations of the four types of vectors 12Ma to 12Md recited above occur. The second magnetization 12M can be controlled to be in the orientations of the combined vectors of the four types of vectors. For example, STT programming and SOT programming are superimposed. As shown in these drawings, the second magnetization 12M has four types of orientations. The four types of orientations are tilted with respect to the first magnetization 11M. Four types of electrical resistance states that correspond to the two types of orientations are obtained.

Thus, in the magnetic memory device 110 according to the embodiment, a ternary or higher-value resistance state is obtained. A ternary or higher-value memory state is obtained in one memory cell. Thereby, the storage density can be increased. According to the embodiment, a magnetic memory device can be provided in which the storage density can be increased.

In the embodiment, three operations among the first to fourth operations OP1 to OP4 may be performed. For example, the first to third operations OP1 to OP3 may be performed.

An example of a read operation of the magnetic memory device 110 will now be described. In the read operation, the information relating to the change of the resistance of the current path including the first stacked body SB1 is detected. For example, a sufficiently small current (the read current) is supplied to the first stacked body SB1; and a characteristic (the change of a resistance, a current, or a voltage) corresponding to the change of the resistance state of the first stacked body SB1 at this time is detected. For example, the read operation can be performed by a sense amplifier, etc.

Figure 4:
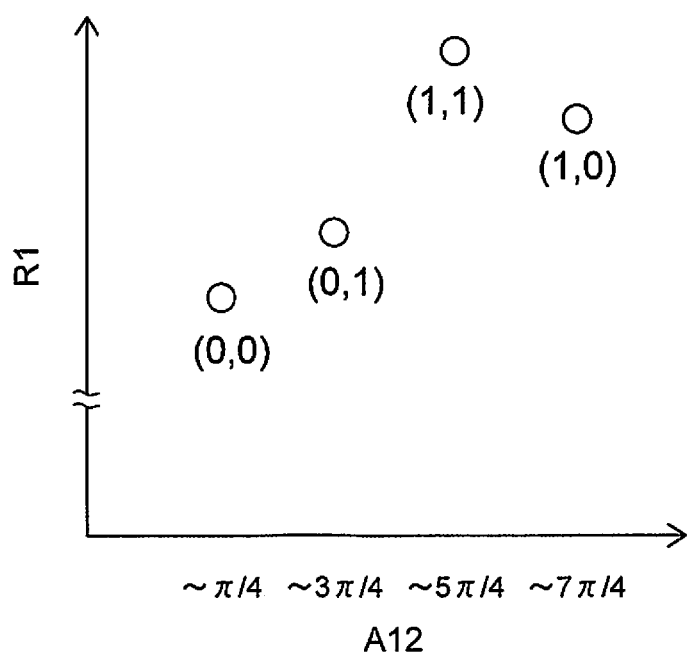
FIG. 4 is a graph illustrating the characteristic of the magnetic memory device according to the first embodiment.

FIG. 4 is a graph illustrating the characteristic of the magnetic memory device according to the first embodiment.

The horizontal axis of FIG. 4 is an angle A12 of the second magnetization 12M. In the example, this angle is referenced to the +Y direction. The vertical axis is a resistance R1 of the first stacked body SB1.

As shown in FIG. 4, four types of resistances R1 that correspond to the four types of angles A12 of the second magnetization 12M are obtained. The four types of resistances R1 correspond to the first to fourth resistance states. The four types of resistance states correspond to four types of information ((0, 0), (0, 1), (1, 1), and (1, 0)). Thus, in the embodiment, ternary or higher-value information can be stored.

In the case where ternary or higher-value information is stored in one memory cell, the difference between the ternary or higher-value resistances is smaller than the difference between binary resistances. For example, a small difference of the resistance can be read by reading using a "self-referencing method," etc.

In the embodiment as shown in FIG. 2A and FIG. 2C, for example, a current J1 flows through the first stacked body SB1 in the first operation OP1 and the third operation OP3 (the program operations). As shown in FIG. 2B and FIG. 2D, another current J2 flows through the first stacked body SB1 in the second operation OP2 and the fourth operation OP4 (the program operations). The current J1 is a current in one of the direction from the first magnetic layer 11 toward the second magnetic layer 12 or the direction from the second magnetic layer 12 toward the first magnetic layer 11. The current J2 is a current in the other of the direction from the first magnetic layer 11 toward the second magnetic layer 12 or the direction from the second magnetic layer 12 toward the first magnetic layer 11.

For example, the first potential V1 is higher than a potential Vb of the second region 21b in the first operation OP1. The second potential V2 is lower than a potential Va of the first region 21a in the second operation OP2. The third potential V3 is higher than the potential Va of the first region 21a in the third operation OP3. The fourth potential V4 is lower than the potential Vb of the second region 21b in the fourth operation OP4.

For example, the first potential V1 is higher than the potential Va of the first region 21a in the first operation OP1. The second potential V2 is lower than the potential Vb of the second region 21b in the second operation OP2. The third potential V3 is higher than the potential Vb of the second region 21b in the third operation OP3. The fourth potential V4 is lower than the potential Va of the first region 21a in the fourth operation OP4.

In the embodiment, the first magnetization 11M of the first magnetic layer 11 has a component perpendicular to the first direction (the Z-axis direction). The component is a component along the X-Y plane. The component is tilted with respect to the second direction (the X-axis direction). Thereby, the number of types of angles between the orientation of the first magnetization 11M and the multiple orientations of the second magnetization 12M can be increased. For example, the angle between the second direction (the X-axis direction) and the component of the first magnetization 11M perpendicular to the Z-axis direction is not less than 5 degrees and not more than 40 degrees, not less than 50 degrees and not more than 85 degrees, not less than 95 degrees and not more than 130 degrees, not less than 140 degrees and not more than 175 degrees, not less than 185 degrees and not more than 220 degrees, not less than 230 degrees and not more than 265 degrees, not less than 275 degrees and not more than 310 degrees, or not less than 320 degrees and not more than 355 degrees.

In the example described in reference to FIG. 1A, the orientation of the first magnetization 11M is "≈0.35π;" and the angle recited above is about 27 degrees.

In the magnetic memory device 110 as shown in FIG. 1B, the planar configuration of the second magnetic layer 12 is substantially a quadrilateral. For example, the second magnetic layer 12 has a first length L1 along the second direction (the X-axis direction), and a second length L2 along a third direction. The third direction crosses a plane including the first direction (the Z-axis direction) and the second direction (the X-axis direction). In the example, the third direction is the Y-axis direction.

As shown in FIG. 1B, one direction perpendicular to the first direction (the Z-axis direction) and tilted with respect to the second direction (the X-axis direction) is taken as a first diagonal direction DD1. In the example shown in FIG. 1B, the angle between the first diagonal direction DD1 and the second direction (the X-axis direction) is about 45 degrees (e.g., not less than 35 degrees and not more than 55 degrees). A length LD1 along the first diagonal direction DD1 of the second magnetic layer 12 is longer than the first length L1 and longer than the second length L2.

As shown in FIG. 1B, a direction that crosses the first diagonal direction DD1, is perpendicular to the first direction (the Z-axis direction), and is tilted with respect to the second direction (the X-axis direction) is taken as a second diagonal direction DD2. In the example shown in FIG. 1B, the angle between the second diagonal direction DD2 and the second direction (the X-axis direction) is about 135 degrees (e.g., not less than 125 degrees and not more than 145 degrees). A length LD2 along the second diagonal direction DD2 of the second magnetic layer 12 is longer than the first length L1 and longer than the second length L2.

For example, the length LD1 and the length LD2 correspond to the lengths of the diagonal lines of the planar configuration of the second magnetic layer 12 (substantially a quadrilateral).

For example, the second magnetization 12M is easily aligned with, for example, the four types of orientations connecting the substantially central portion of the second magnetic layer 12 and the four corner portions of the second magnetic layer 12.

On the other hand, the orientation of the first magnetization 11M is set to be tilted with respect to the four types of orientations recited above.

In one example, the planar configuration of the second magnetic layer 12 is substantially a square. For example, the difference between the first length L1 and the second length L2 is 0.1 times the first length L1 or less.

In the magnetic memory device 110, the second magnetic layer 12 is a rectangle. The second magnetic layer 12 may have strain. The easy magnetization axis of the second magnetic layer 12 is easily aligned with the diagonal directions of the rectangle. For example, the induced magnetic anisotropy due to the strain may be small; and the magnetic anisotropy due to the shape may be dominant. In such a case, the easy magnetization axis is easily aligned with the four diagonal directions.

Figure 5A:
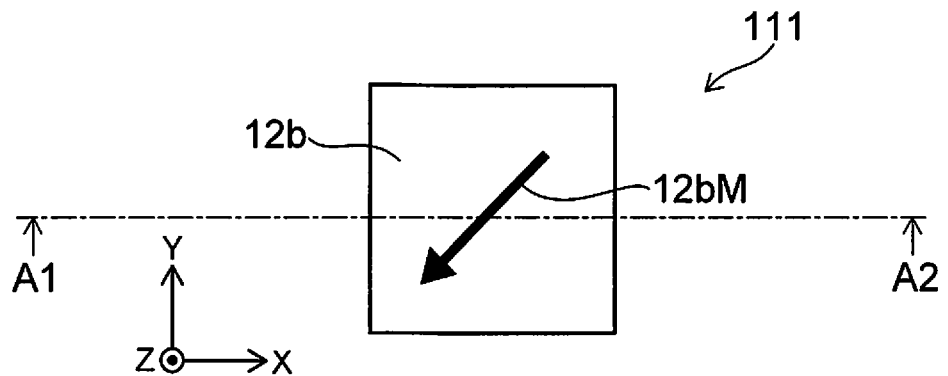
FIG. 5A to FIG. 5C are schematic views illustrating a magnetic memory device according to the first embodiment.
Figure 5B:
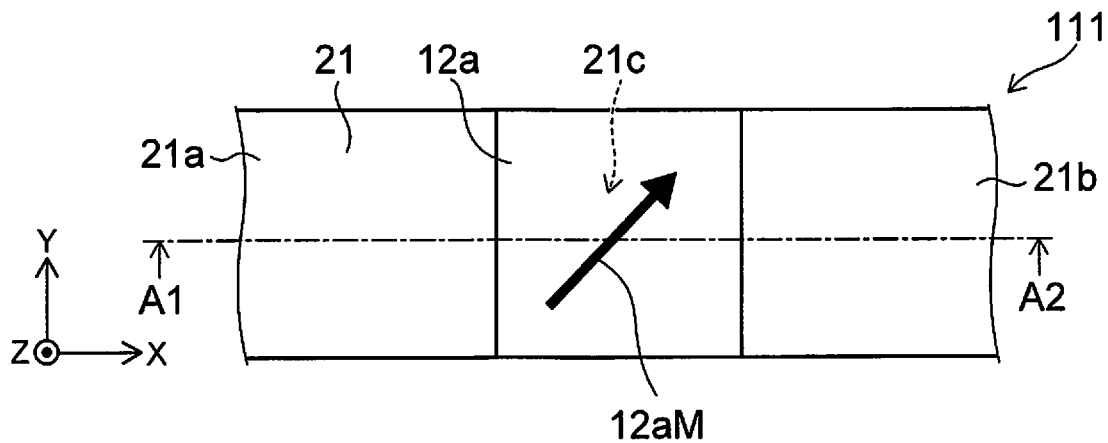
Figure 5C:
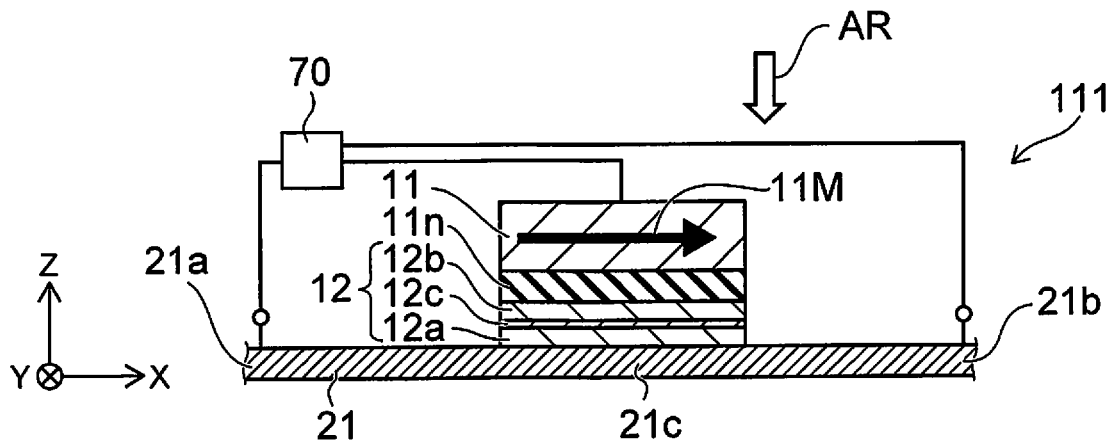

FIG. 5A to FIG. 5C are schematic views illustrating a magnetic memory device according to the first embodiment.

FIG. 5A and FIG. 5B are plan views when viewed along arrow AR of FIG. 5C. Some of the components are illustrated as being extracted in these drawings. FIG. 5C illustrates a line A1-A2 cross section of FIG. 5A and FIG. 5B.

As shown in FIG. 5C, the magnetic memory device 111 according to the embodiment also includes the first conductive layer 21, the first stacked body SB1, and the controller 70. The first stacked body SB1 includes the first magnetic layer 11, the second magnetic layer 12, and the first nonmagnetic layer 11n. In the example, the second magnetic layer 12 includes at least three films. Otherwise, the configuration of the magnetic memory device 111 is similar to the configuration of the magnetic memory device 110.

As shown in FIG. 5C, the second magnetic layer 12 includes a first magnetic film 12a, a second magnetic film 12b, and a nonmagnetic film 12c. The second magnetic film 12b is provided between the first magnetic film 12a and the first nonmagnetic layer 11n. The nonmagnetic film 12c is provided between the first magnetic film 12a and the second magnetic film 12b.

In one example, the nonmagnetic film 12c includes Ir; and the thickness of the nonmagnetic film 12c is not less than 0.3 nm and not more than 0.5 nm. In one other example, the nonmagnetic film 12c includes Ru; and the thickness of the nonmagnetic film 12c is not less than 0.3 nm and not more than 0.5 nm. The thickness is the length along the Z-axis direction. For example, the first magnetic film 12a and the second magnetic film 12b are antiferromagnetically coupled to each other by such a nonmagnetic film 12c. For example, the second magnetic layer 12 has a SAF (Synthetic Anti-Ferro) structure. The thickness of the nonmagnetic film 12c may be modified from the range recited above according to the method for forming the nonmagnetic film 12c. For example, the thickness of the nonmagnetic film 12c may correspond to the thickness of the first peak based on the RKKY (Ruderman-Kittel-Kasuya-Yoshida) theory.

FIG. 5A illustrates the second magnetic film 12b. FIG. 5B illustrates the first magnetic film 12a and the first conductive layer 21. For example, a magnetization 12bM of the second magnetic film 12b (referring to FIG. 5A) is substantially antiparallel to a magnetization 12aM of the first magnetic film 12a (referring to FIG. 5B).

The leakage magnetic field of such a second magnetic layer 12 can be reduced. For example, if a leakage magnetic field exists, the effects of the leakage magnetic field between multiple memory cells occurs easily in the case where the multiple memory cells are provided. Therefore, there are cases where the storage operation is unstable. By using the second magnetic layer 12 recited above, the leakage magnetic field can be suppressed; and the reduction of the distance between the multiple memory cells is easy. Thereby, the storage density can be increased further.

For example, a flop-mode magnetization reversal is obtained in the second magnetic layer 12 having the SAF structure. For example, the control of the magnetization described in reference to FIG. 3A to FIG. 3F is possible.

Figure 6A:
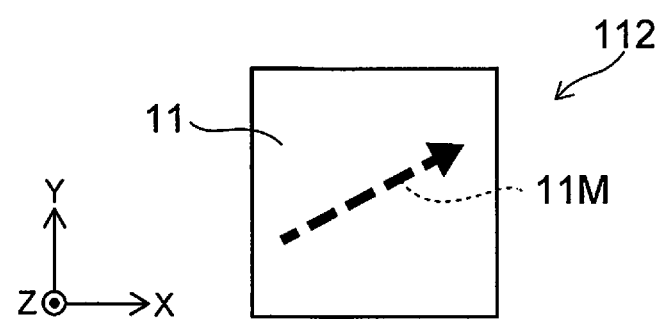
FIG. 6A and FIG. 6B are schematic plan views illustrating a magnetic memory device according to the first embodiment.
Figure 6B:
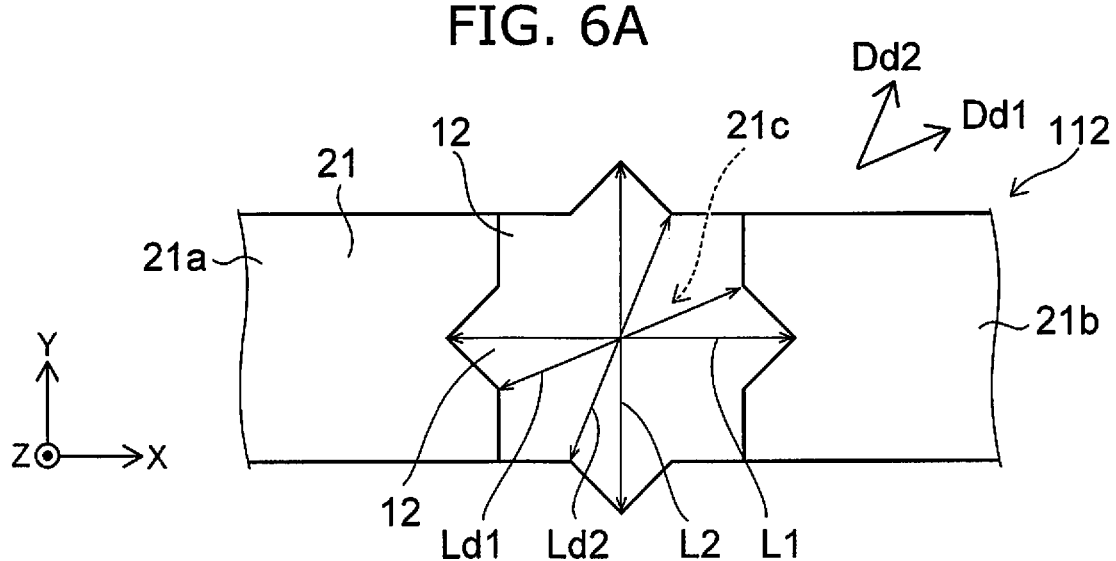

FIG. 6A and FIG. 6B are schematic plan views illustrating a magnetic memory device according to the first embodiment.

FIG. 6A illustrates the first magnetic layer 11. FIG. 6B illustrates the second magnetic layer 12 and the first conductive layer 21.

In the magnetic memory device 112 according to the embodiment, the planar configuration of the second magnetic layer 12 is a concave polygon. Otherwise, the configuration of the magnetic memory device 112 is similar to, for example, the configuration of the magnetic memory device 110.

In the example, the planar configuration of the second magnetic layer 12 includes eight convex portions. Concave portions are provided respectively between the eight convex portions. For example, the second magnetization 12M of the second magnetic layer 12 is easily oriented in the directions from the substantially central portion of the second magnetic layer 12 toward the eight convex portions.

As shown in FIG. 6B, for example, the second magnetic layer 12 has the first length L1 along the second direction (the X-axis direction), and the second length L2 along the third direction (a direction crossing a plane including the first direction and the second direction, i.e., the Y-axis direction).

One direction perpendicular to the first direction (the Z-axis direction) is taken as a first concave portion direction Dd1. The angle between the first concave portion direction Dd1 and the second direction (the X-axis direction) is 22.5 degrees. A length Ld1 along the first concave portion direction Dd1 of the second magnetic layer 12 is shorter than the first length L1 and shorter than the second length L2.

Another one direction perpendicular to the first direction (the Z-axis direction) is taken as a second concave portion direction Dd2. The angle between the second concave portion direction Dd2 and the third direction (the Y-axis direction) is 22.5 degrees. A length Ld2 along the second concave portion direction Dd2 of the second magnetic layer 12 is shorter than the first length L1 and shorter than the second length L2.

The first length L1 and the second length L2 correspond to diagonal lengths between vertices of convex portions of the planar configuration of the second magnetic layer 12. The length Ld1 and the length Ld2 correspond to diagonal lengths between concave portions of the planar configuration of the second magnetic layer 12.

Because the planar configuration of the second magnetic layer 12 is a concave polygon, the controllability of the orientation of the second magnetization 12M of the second magnetic layer 12 is higher. On the other hand, the orientation of the first magnetization 11M of the first magnetic layer 11 is set to be tilted with respect to the orientation of the second magnetization 12M.

As one example, the orientation of the magnetization is described as an angle referenced to the +Y direction. In the example shown in FIG. 5B, the orientation of the second magnetization 12M is one of "≈1π/4," "≈2π/4," "≈3π/4," "≈4π/4," "≈5π/4," "≈6π/4," "≈7π/4," or "≈8π/4." On the other hand, in the example shown in FIG. 5A, the orientation of the first magnetization 11M is "≈0.9π." In such a case, eight types of angles between the first magnetization 11M and the second magnetization 12M are obtained.

Figure 7:
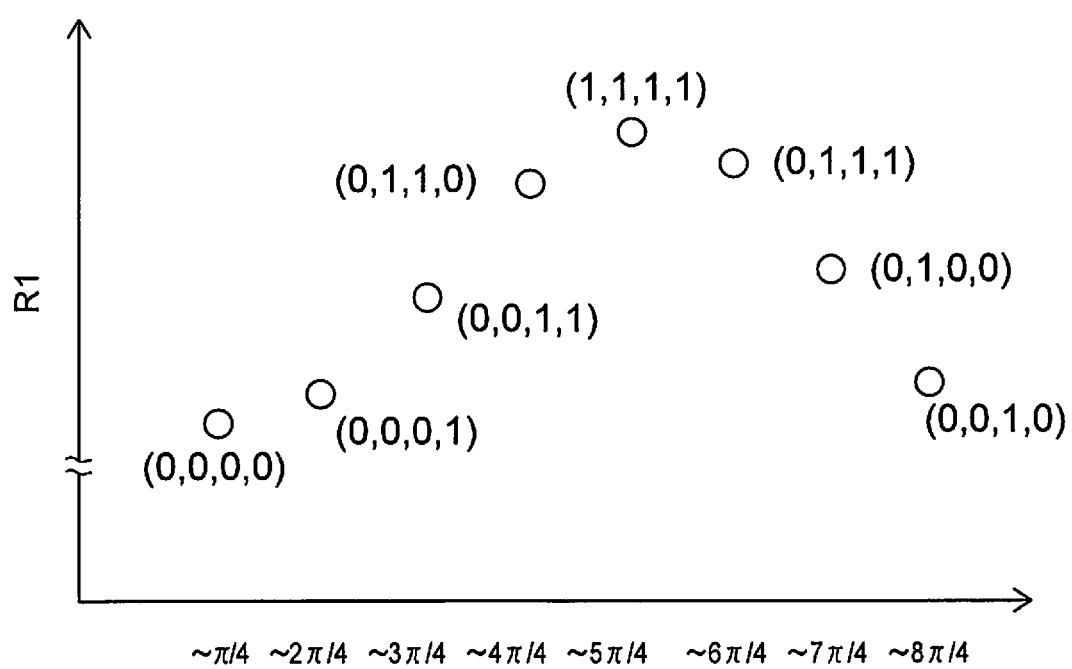
FIG. 7 is a graph illustrating a characteristic of the magnetic memory device according to the first embodiment.

FIG. 7 is a graph illustrating a characteristic of the magnetic memory device according to the first embodiment.

The horizontal axis of FIG. 7 is the angle A12 of the second magnetization 12M. In the example, this angle is referenced to the +Y direction. The vertical axis is the resistance R1 of the first stacked body SB1.

As shown in FIG. 7, eight types of resistances R1 that correspond to the eight types of angles A12 of the second magnetization 12M are obtained. The eight types of resistances R1 correspond to first to eighth resistance states. According to the magnetic memory device 112, for example, four bits of information can be stored in one memory cell. In one example, the program operation of the magnetic memory device 112 is performed using STT and SOT. At this time, the first current I1, the second current I2, the current J1, and the current J2 are set appropriately. For example, misprogramming can be suppressed by performing a "verify." The accuracy of the data can be increased.

Figure 8A:
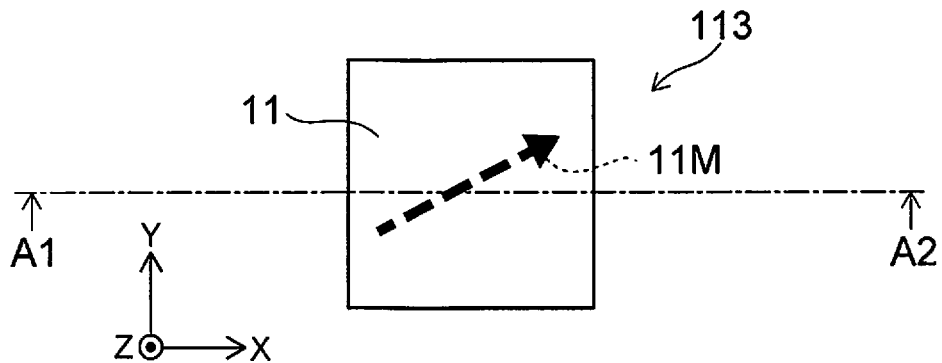
FIG. 8A to FIG. 8C are schematic views illustrating a magnetic memory device according to the first embodiment.
Figure 8B:
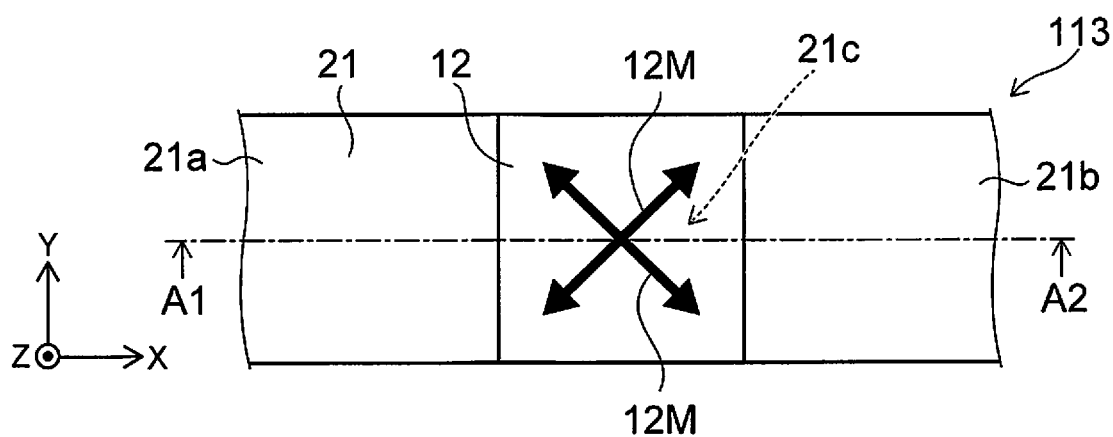
Figure 8C:
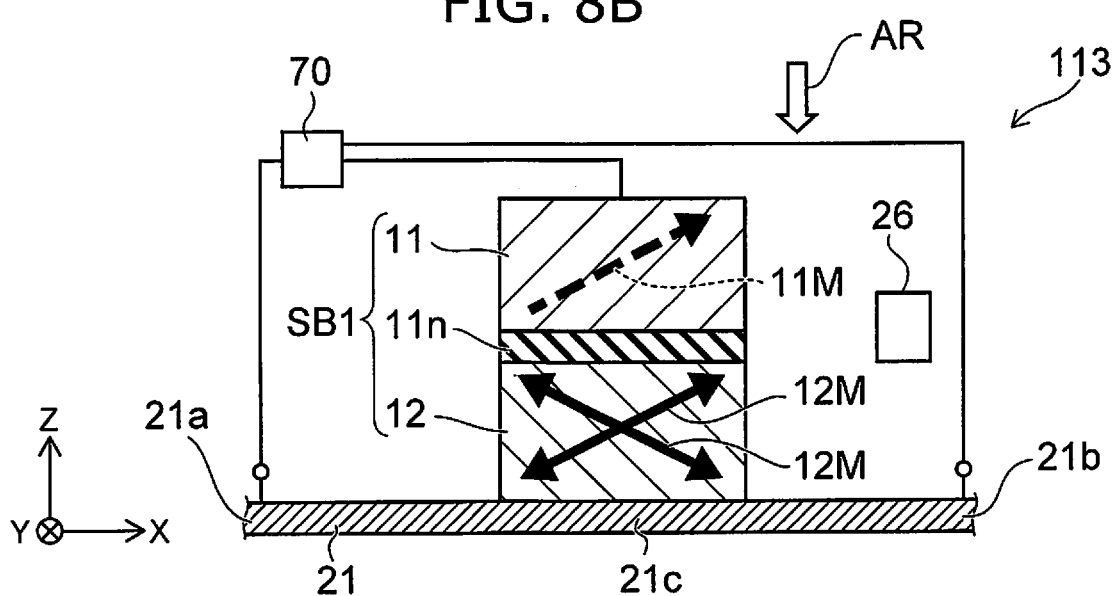

FIG. 8A to FIG. 8C are schematic views illustrating a magnetic memory device according to the first embodiment.

FIG. 8A is a plan view illustrating the first magnetic layer 11. FIG. 8B is a plan view illustrating the second magnetic layer 12. FIG. 8C is a cross-sectional view.

In the magnetic memory device 113 according to the embodiment as shown in FIG. 8C, the first magnetization 11M of the first magnetic layer 11 is tilted with respect to the first direction (the Z-axis direction). The second magnetization 12M of the second magnetic layer 12 is tilted with respect to the first direction. Otherwise, the configuration of the magnetic memory device 113 may be similar to, for example, the configuration of the magnetic memory device 110.

In the example as shown in FIG. 8A, the orientation of the component of the first magnetization 11M along the X-Y plane is tilted with respect to the second direction (the X-axis direction). In the example as shown in FIG. 8B, the component of the second magnetization 12M along the X-Y plane is aligned with the four diagonal directions of the rectangle of the second magnetic layer 12.

In the magnetic memory device 113, for example, a magnetic field (e.g., a current-produced magnetic field) along the Z-axis direction is applied to the first stacked body SB1. For example, the magnetic field along the Z-axis direction may be generated by an interconnect 26, etc. (referring to FIG. 8C). For example, the orientation of the second magnetization 12M can be controlled using the current-produced magnetic field (having two types of orientations), the first current I1, the second current I2, the current J1, and the current J2. For example, the orientation of the second magnetization 12M has eight types. Eight resistance states are obtained by the eight types of orientations of the second magnetization 12M. For example, a program operation in which STT and SOT are superimposed is performed in the magnetic memory device 113.

In the magnetic memory device 113, the thickness (the length along the Z-axis direction) of the second magnetic layer 12 is set to be thick, e.g., 4 nm or more (e.g., about 5 nm). Thereby, the component of the second magnetization 12M along the Z-axis direction is obtained easily.

Figure 9A:
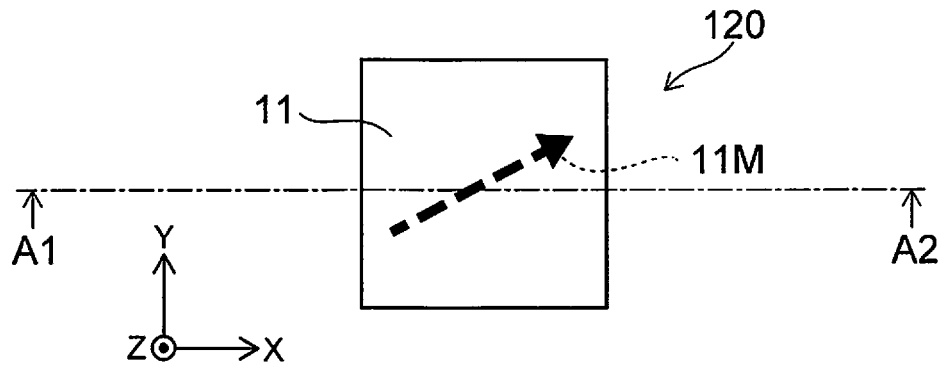
FIG. 9A to FIG. 9C are schematic views illustrating a magnetic memory device according to the first embodiment.
Figure 9B:
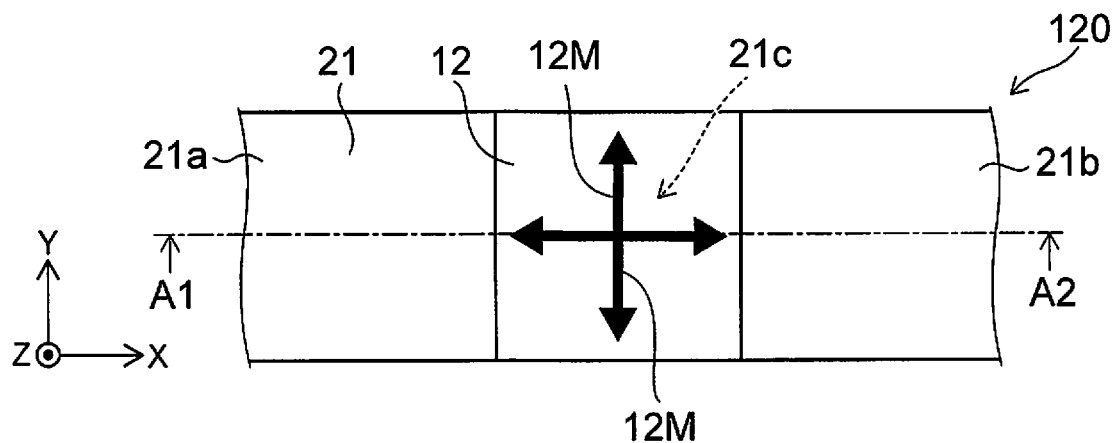
Figure 9C:
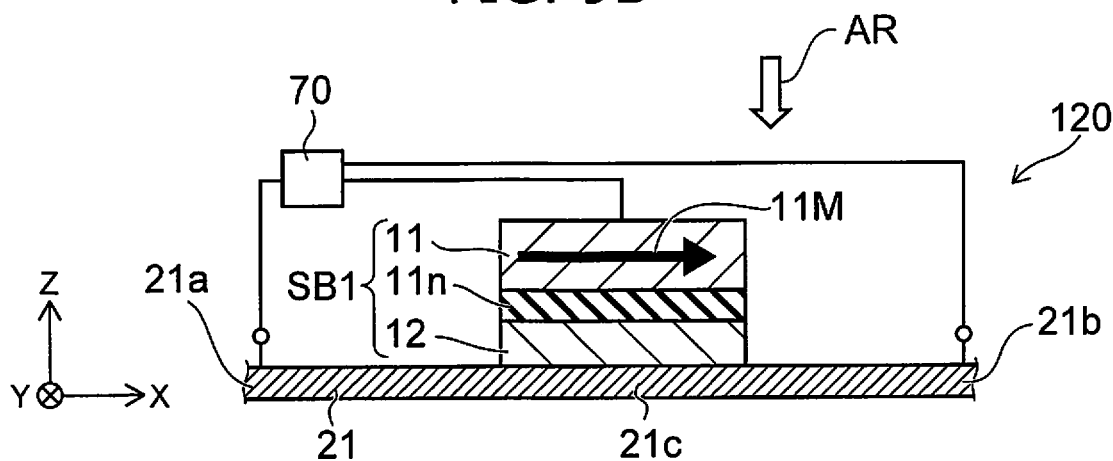

FIG. 9A to FIG. 9C are schematic views illustrating a magnetic memory device according to the first embodiment.

FIG. 9A is a plan view illustrating the first magnetic layer 11. FIG. 9B is a plan view illustrating the second magnetic layer 12. FIG. 9C is a cross-sectional view.

In the magnetic memory device 120 according to the embodiment as shown in FIG. 9B, the second magnetization 12M of the second magnetic layer 12 is aligned with the second direction (the X-axis direction) or the third direction (the Y-axis direction). For example, the planar configuration of the second magnetic layer 12 is a rectangle; and when strain is generated in the second magnetic layer 12, the easy magnetization axis of the second magnetic layer 12 are aligned easily in the second direction (the X-axis direction) or the third direction (the Y-axis direction). For example, when referenced to the +Y direction, the orientation of the second magnetization 12M is one of "≈2π/4," "≈4π/4," "≈6π/4," or "≈8λ/4."

As shown in FIG. 9A, the first magnetization 11M is tilted with respect to the second magnetization 12M. In the example, when referenced to the +Y direction, the orientation of the first magnetization 11M is "≈4π." Four types of angles between the first magnetization 11M and the second magnetization 12M are obtained.

Figure 10:
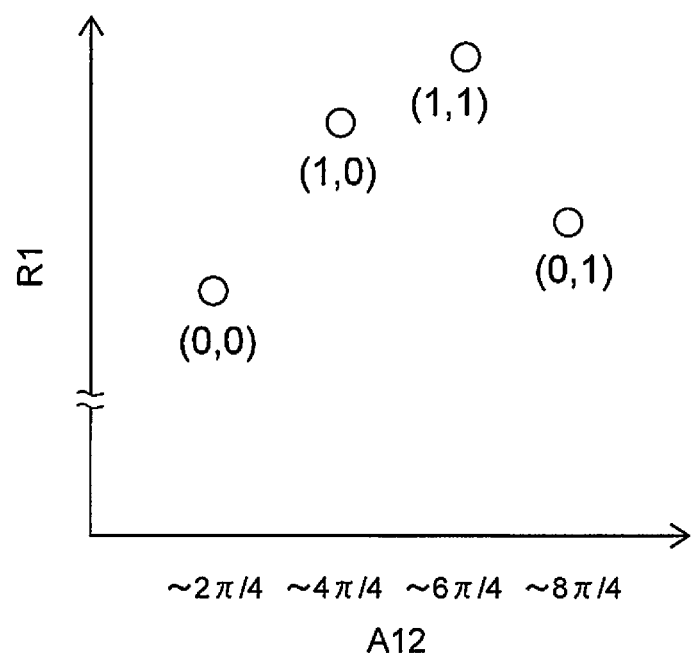
FIG. 10 is a graph illustrating a characteristic of the magnetic memory device according to the first embodiment.

FIG. 10 is a graph illustrating a characteristic of the magnetic memory device according to the first embodiment.

The horizontal axis of FIG. 10 is the angle A12 of the second magnetization 12M. In the example, this angle is referenced to the +Y direction. The vertical axis is the resistance R1 of the first stacked body SB1.

As shown in FIG. 10, four types of resistances R1 that correspond to the four types of angles A12 of the second magnetization 12M are obtained. The four types of resistances R1 correspond to the first to fourth resistance states. Thus, in the magnetic memory device 120, ternary or higher-value information can be stored.

In the magnetic memory device 120 as described above, strain is generated in the second magnetic layer 12. At this time, strain is generated also in the first nonmagnetic layer 11n. For example, crystal growth of the first nonmagnetic layer 11n is performed on the second magnetic layer 12. The second magnetic layer 12 is affected by the crystalline state of the first nonmagnetic layer 11n. The first nonmagnetic layer 11n is affected by the crystalline state of the second magnetic layer 12. The state of the second magnetic layer 12 can be ascertained using information relating to the state of the first nonmagnetic layer 11n (e.g., the state of the strain). For example, the second magnetic layer 12 has strain when the first nonmagnetic layer 11n has strain. For example, in the magnetic memory device 120, the easy magnetization axis of the rectangular second magnetic layer 12 is easily aligned with the second direction (the X-axis direction) or the third direction (the Y-axis direction) when the first nonmagnetic layer 11n has strain.

For example, the first nonmagnetic layer 11n has a crystal structure of a cubic crystal. In such a case, the lattice length of the cubic crystal along the first direction (the Z-axis direction) is different from the lattice length of the cubic crystal along a direction perpendicular to the first direction (one direction along the X-Y plane). The difference of the lattice lengths is based on the strain. For example, in the case where the first nonmagnetic layer 11n includes MgO, the lattice length along the first direction of MgO is different from the lattice length of MgO along one direction along the X-Y plane.

In the magnetic memory device 120, for example, the second magnetization 12M can be controlled to have the orientation of "≈2π/4" or "≈6π/4" by the first potential V1 (the current J1) or the second potential V2 (the current J2) applied to the first magnetic layer 11. For example, the second magnetization 12M can be controlled to have the orientation of "≈4π/4" or "≈8π/4" by the first current I1 or the second current I2 supplied to the first conductive layer 21. For example, programming based on STT and programming based on SOT are performed.

FIG. 11A to FIG. 11D are schematic views illustrating magnetic memory devices according to the first embodiment.

Figure 11A:
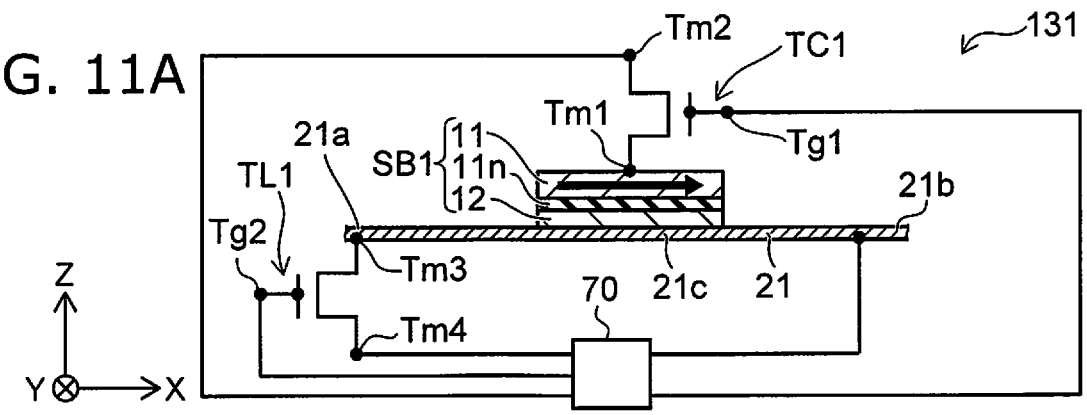
FIG. 11A to FIG. 11D are schematic views illustrating magnetic memory devices according to the first embodiment.

As shown in FIG. 11A, a magnetic memory device 131 according to the embodiment further includes a first cell transistor TC1 and a first conductive layer transistor TL1 in addition to the first conductive layer 21, the first stacked body SB1, and the controller 70.

The first cell transistor TC1 includes a first end portion Tm1, a second end portion Tm2, and a first gate Tg1. The first end portion Tm1 is one of the source or the drain of the first cell transistor TC1. The second end portion Tm2 is the other of the source or the drain of the first cell transistor TC1. The first end portion Tm1 is electrically connected to the first magnetic layer 11. The second end portion Tm2 and the first gate Tg1 are electrically connected to the controller 70.

The first conductive layer transistor TL1 includes a third end portion Tm3, a fourth end portion Tm4, and a second gate Tg2. The third end portion Tm3 is one of the source or the drain of the first conductive layer transistor TL1. The fourth end portion Tm4 is the other of the source or the drain of the first conductive layer transistor TL1. The third end portion Tm3 is electrically connected to one of the first region 21a or the second region 21b. In the example, the third end portion Tm3 is electrically connected to the first region 21a. The fourth end portion Tm4 and the second gate Tg2 are electrically connected to the controller 70.

For example, the first region 21a, the second region 21b, the first stacked body SB1, the first cell transistor TC1, and the first conductive layer transistor TL1 may be included in one memory cell. The one memory cell is set to the selected state or the unselected state; and the program operation or the read operation is performed.

For example, the second end portion Tm2 is set to a Vdd voltage; and the fourth end portion Tm4 is set to a Vss voltage. Or, the second end portion Tm2 is set to the Vss voltage; and the fourth end portion Tm4 is set to the Vdd voltage. At this time, for example, the second region 21b is set to a "Vdd/2" voltage.

In one example, the direction from the first end portion Tm1 toward the second end portion Tm2 is aligned with the first direction (the Z-axis direction). The direction from the third end portion Tm3 toward the fourth end portion Tm4 is aligned with the first direction. As described below, the first cell transistor TC1 and the first conductive layer transistor TL1 may be, for example, "vertical transistors." For example, the occupied surface area of these transistors can be small. The storage density can be increased further.

Figure 11B:
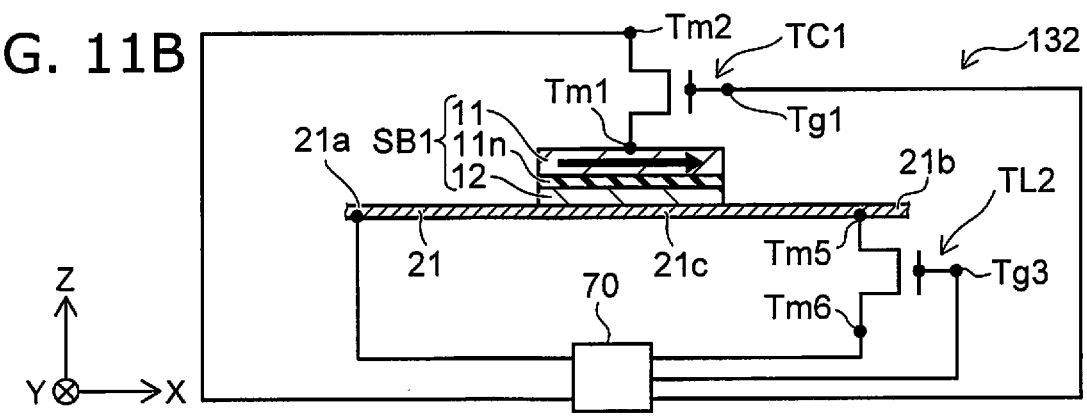

As shown in FIG. 11B, a magnetic memory device 132 according to the embodiment further includes the first cell transistor TC1 and a second conductive layer transistor TL2 in addition to the first conductive layer 21, the first stacked body SB1, and the controller 70. The first cell transistor TC1 of the magnetic memory device 132 is similar to the first cell transistor TC1 of the magnetic memory device 131.

The second conductive layer transistor TL2 includes a fifth end portion Tm5, a sixth end portion Tm6, and a third gate Tg3. The fifth end portion Tm5 is one of the source or the drain of the second conductive layer transistor TL2. The sixth end portion Tm6 is the other of the source or the drain of the second conductive layer transistor TL2. The fifth end portion Tm5 is electrically connected to the other of the first region 21a or the second region 21b. In the example, the fifth end portion Tm5 is electrically connected to the second region 21b. The sixth end portion Tm6 and the third gate Tg3 are electrically connected to the controller 70.

For example, the second end portion Tm2 is set to the Vdd voltage; and the sixth end portion Tm6 is set to the Vss voltage. Or, the second end portion Tm2 is set to the Vss voltage; and the sixth end portion Tm6 is set to the Vdd voltage. At this time, for example, the first region 21a is set to the "Vdd/2" voltage.

In one example, the direction from the fifth end portion Tm5 toward the sixth end portion Tm6 is aligned with the first direction (the Z-axis direction). As described below, the second conductive layer transistor TL2 may be, for example, a "vertical transistor." For example, the occupied surface area of the transistor can be small. The storage density can be increased further.

Figure 11C:
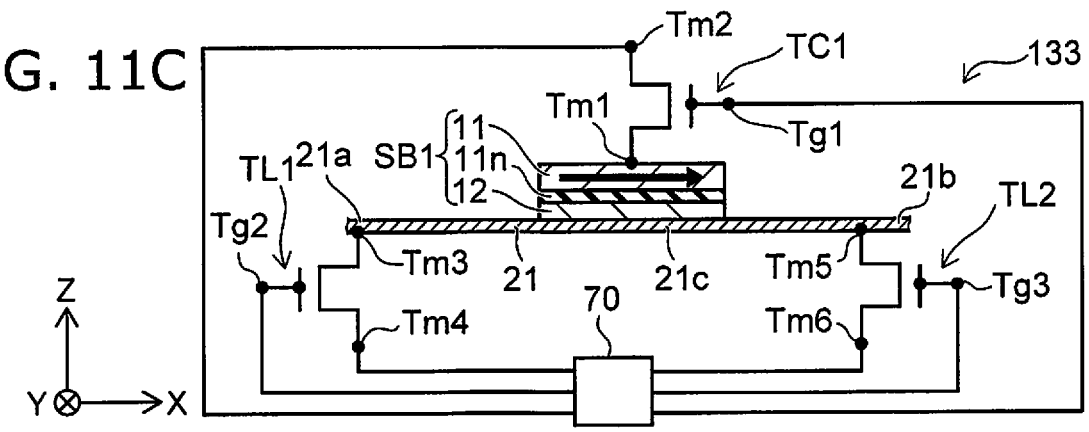

As in a magnetic memory device 133 according to the embodiment as shown in FIG. 11C, the first cell transistor TC1, the first conductive layer transistor TL1, and the second conductive layer transistor TL2 may be provided in addition to the first conductive layer 21, the first stacked body SB1, and the controller 70.

Figure 11D:
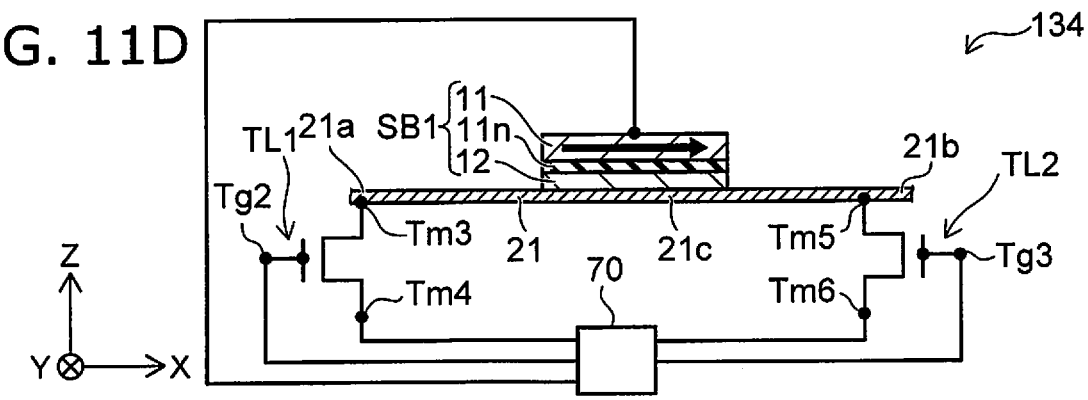

As in a magnetic memory device 134 according to the embodiment as shown in FIG. 11D, the first conductive layer transistor TL1 and the second conductive layer transistor TL2 may be provided in addition to the first conductive layer 21, the first stacked body SB1, and the controller 70.

"F" is taken as a "minimum working size." In the magnetic memory devices 131 to 134, the size of one memory cell is, for example, $8F^2$. In the case where two bits of information can be stored in one memory cell, the size per bit is $4F^2$.

FIG. 12A to FIG. 12E are schematic views illustrating a magnetic memory device according to the first embodiment.

As shown in FIG. 12A, the magnetic memory device 140 according to the embodiment includes a second stacked body SB2 in addition to the first conductive layer 21, the first stacked body SB1, and the controller 70.

The first conductive layer 21 further includes a fourth region 21d and a fifth region 21e in addition to the first to third regions 21a to 21c. The second region 21b is provided between the first region 21a and the fourth region 21d. The fifth region 21e is provided between the second region 21b and the fourth region 21d.

The second stacked body SB2 includes a third magnetic layer 13, a fourth magnetic layer 14, and a second nonmagnetic layer 12n. The fourth magnetic layer 14 is provided between the fifth region 21*e* and the third magnetic layer 13 in the first direction (the Z-axis direction). The second nonmagnetic layer 12*n* is provided between the third magnetic layer 13 and the fourth magnetic layer 14.

The controller 70 also is electrically connected to the third magnetic layer 13. In the example, the third magnetic layer 13 is electrically connected to the controller 70 via a second cell transistor TC2 described below.

The controller 70 may further perform at least fifth to eighth operations. FIG. 12B to FIG. 12E illustrate the fifth to eighth operations.

In the fifth operation OP5 as shown in FIG. 12B, the controller 70 sets the second stacked body SB2 to a fifth resistance state by supplying a third current I3 to the first conductive layer 21 from the second region 21*b* toward the fourth region 21*d* while setting the third magnetic layer 13 to a fifth potential V5.

In the sixth operation OP6 as shown in FIG. 12C, the controller 70 sets the second stacked body SB2 to a sixth resistance state by supplying the third current I3 to the first conductive layer 21 while setting the third magnetic layer 13 to a sixth potential V6 that is different from the fifth potential V5. The sixth resistance state is different from the fifth resistance state.

In the seventh operation OP7 as shown in FIG. 12D, the controller 70 sets the second stacked body SB2 to a seventh resistance state by supplying a fourth current I4 to the first conductive layer 21 from the fourth region 21*d* toward the second region 21*b* while setting the third magnetic layer 13 to a seventh potential V7 that is different from the sixth potential V6. The seventh resistance state is different from the fifth resistance state and different from the sixth resistance state.

In the eighth operation OP8 as shown in FIG. 12E, the controller 70 sets the second stacked body SB2 to an eighth resistance state by supplying the fourth current I4 to the first conductive layer 21 while setting the third magnetic layer 13 to an eighth potential V8 that is different from the seventh potential V7. The eighth resistance state is different from the fifth resistance state, different from the sixth resistance state, and different from the seventh resistance state.

The seventh potential V7 may be substantially the same as the fifth potential V5. The fifth potential V5 may be substantially the same as the first potential V1. The eighth potential V8 may be substantially the same as the sixth potential V6. The sixth potential V6 may be substantially the same as the second potential V2.

The second stacked body SB2 corresponds to another one memory cell. The first stacked body SB1 and the second stacked body SB2 may be used as one memory cell.

For example, a current J3 flows in the second stacked body SB2 in the fifth operation OP5 and the seventh operation OP7 (the program operations). A current J4 flows in the second stacked body SB2 in the sixth operation OP6 and the eighth operation OP8 (the program operations). The current J3 is a current in one of the direction from the third magnetic layer 13 toward the fourth magnetic layer 14 or the direction from the fourth magnetic layer 14 toward the third magnetic layer 13. The current J4 is a current in the other of the direction from the third magnetic layer 13 toward the fourth magnetic layer 14 or the direction from the fourth magnetic layer 14 toward the third magnetic layer 13.

For example, the fifth potential V5 is higher than a potential Vd of the fourth region 21*d* in the fifth operation OP5. The sixth potential V6 is lower than the potential Vb of the second region 21*b* in the sixth operation OP6. The seventh potential V7 is higher than the potential Vb of the second region 21*b* in the seventh operation OP7. The eighth potential V8 is lower than the potential Vd of the fourth region 21*d* in the eighth operation OP8.

For example, the fifth potential V5 is higher than the potential Vb of the second region 21*b* in the fifth operation OP5. The sixth potential V6 is lower than the potential Vd of the fourth region 21*d* in the sixth operation OP6. The seventh potential V7 is higher than the potential Vd of the fourth region 21*d* in the seventh operation OP7. The eighth potential V8 is lower than the potential Vb of the second region 21*b* in the eighth operation OP8.

As shown in FIG. 12A, for example, the first cell transistor TC1 and the second cell transistor TC2 are further provided. The first cell transistor TC1 includes the first end portion Tm1, the second end portion Tm2, and the first gate Tg1. The second cell transistor TC2 includes a seventh end portion Tm7, an eighth end portion Tm8, and a fourth gate Tg4. The first end portion Tm1 is electrically connected to the first magnetic layer 11. The second end portion Tm2 and the first gate Tg1 are electrically connected to the controller 70. The seventh end portion Tm7 is electrically connected to the third magnetic layer 13. The eighth end portion Tm8 and the fourth gate Tg4 are electrically connected to the controller 70.

The first conductive layer transistor TL1, the second conductive layer transistor TL2, and a first middle interconnect 25*a* are further provided in the example.

The first conductive layer transistor TL1 includes the third end portion Tm3, the fourth end portion Tm4, and the second gate Tg2. The second conductive layer transistor TL2 includes the fifth end portion Tm5, the sixth end portion Tm6, and the third gate Tg3. The third end portion Tm3 is electrically connected to the first region 21*a*. The fourth end portion Tm4 and the second gate Tg2 are electrically connected to the controller 70. The fifth end portion Tm5 is electrically connected to the fourth region 21*d*. The sixth end portion Tm6 and the third gate Tg3 are electrically connected to the controller 70. For example, the first middle interconnect 25*a* is electrically connected to the second region 21*b* and the controller 70.

In the magnetic memory device 140, the size of two memory cells is, for example, $10F^2$. In the case where two bits of information can be stored in each of the two memory cells, the size per bit is $2.5F^2$.

For example, the direction from the first end portion Tm1 toward the second end portion Tm2 and the direction from the seventh end portion Tm7 toward the eighth end portion Tm8 are aligned with the first direction (the Z-axis direction). The direction from the third end portion Tm3 toward the fourth end portion Tm4 and the direction from the fifth end portion Tm5 toward the sixth end portion Tm6 are aligned with the first direction. The occupied surface area of the transistor can be small.

As in the magnetic memory device 140, multiple stacked bodies (e.g., the first stacked body SB1, the second stacked body SB2, etc.) may be provided in one conductive layer (the first conductive layer 21). The number of multiple stacked bodies is arbitrary.

Multiple conductive layers may be provided in the embodiment. Such examples will now be described.

Figure 13:
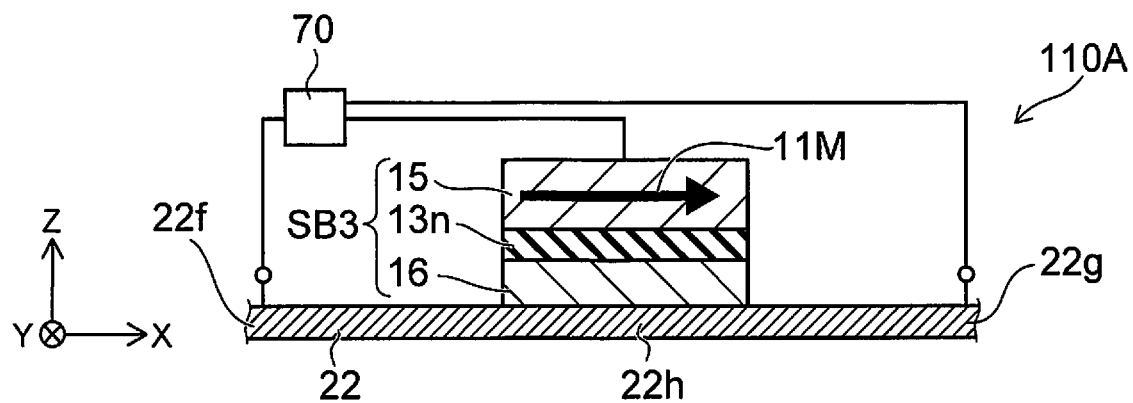
FIG. 13 is a schematic cross-sectional view illustrating a magnetic memory device according to the first embodiment.

FIG. 13 is a schematic cross-sectional view illustrating a magnetic memory device according to the first embodiment.

As shown in FIG. 13, the magnetic memory device 110A according to the embodiment includes a second conductive layer 22 and a third stacked body SB3. The first conductive layer 21 and the first stacked body SB1 may be provided in the magnetic memory device 110A. The first conductive layer 21 and the first stacked body SB1 are not illustrated in FIG. 13. Examples of the second conductive layer 22 and the third stacked body SB3 will now be described.

The second conductive layer 22 includes a sixth region 22f, a seventh region 22g, and an eighth region 22h. The eighth region 22h is provided between the sixth region 22f and the seventh region 22g. These regions are continuous with each other. For example, the direction from the sixth region 22f toward the seventh region 22g is aligned with the second direction (the X-axis direction).

The third stacked body SB3 includes a fifth magnetic layer 15, a sixth magnetic layer 16, and a third nonmagnetic layer 13n. The sixth magnetic layer 16 is provided between the eighth region 22h and the fifth magnetic layer 15 in the first direction (the Z-axis direction). The third nonmagnetic layer 13n is provided between the fifth magnetic layer 15 and the sixth magnetic layer 16.

The controller 70 also is electrically connected to the sixth region 22f, the seventh region 22g, and the fifth magnetic layer 15. Operations similar to those of the first stacked body SB1 may be performed for the third stacked body SB3.

For example, the controller 70 may further perform at least the following ninth to twelfth operations. In the ninth operation, the controller 70 sets the third stacked body SB3 to a ninth resistance state by supplying a fifth current to the second conductive layer 22 in the orientation from the sixth region 22f toward the seventh region 22g while setting the fifth magnetic layer 15 to a ninth potential.

In the tenth operation, the controller 70 sets the third stacked body SB3 to a tenth resistance state by supplying the fifth current recited above to the second conductive layer 22 while setting the fifth magnetic layer 15 to a tenth potential that is different from the ninth potential. The tenth resistance state is different from the ninth resistance state.

In the eleventh operation, the controller 70 sets the third stacked body SB3 to an eleventh resistance state by supplying a sixth current to the second conductive layer 22 in the orientation from the seventh region 22g toward the sixth region 22f while setting the fifth magnetic layer 15 to an eleventh potential that is different from the tenth potential. The eleventh resistance state is different from the ninth resistance state and different from the tenth resistance state.

In the twelfth operation, the controller 70 sets the third stacked body SB3 to a twelfth resistance state by supplying the sixth current recited above to the second conductive layer 22 while setting the fifth magnetic layer 15 to a twelfth potential that is different from the eleventh potential. The twelfth resistance state is different from the ninth resistance state, different from the tenth resistance state, and different from the eleventh resistance state.

Figure 14:
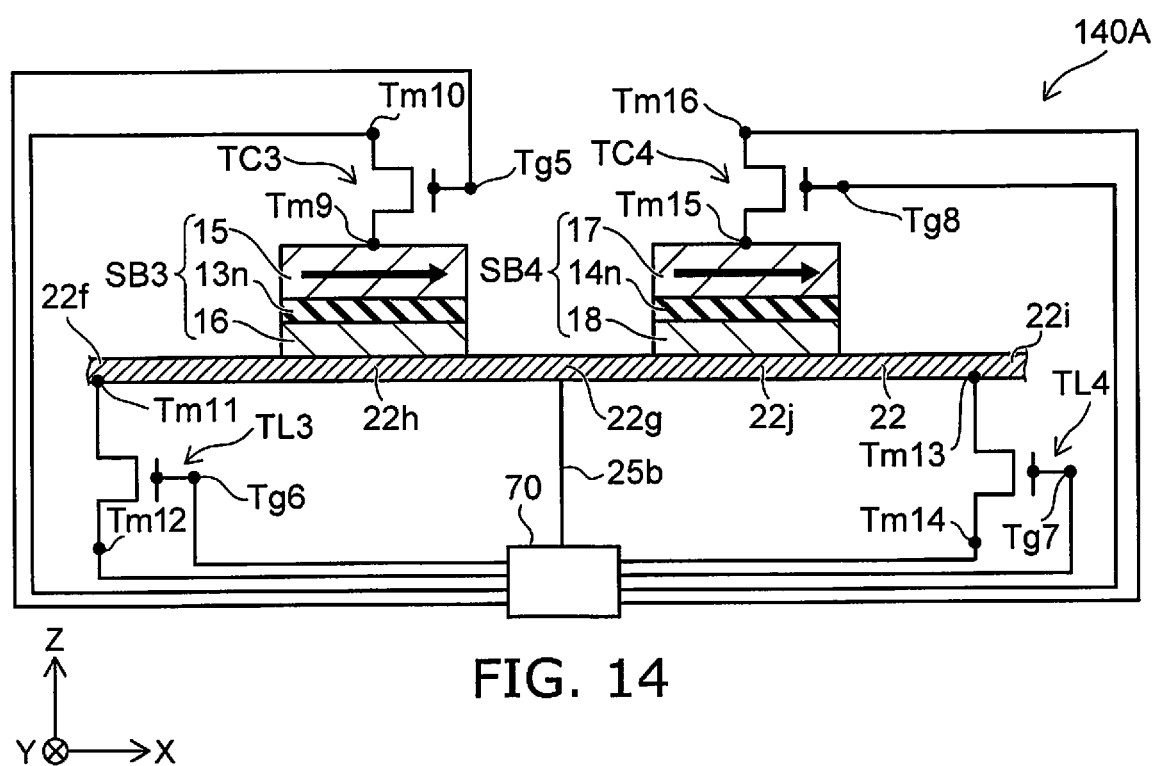
FIG. 14 is a schematic cross-sectional view illustrating a magnetic memory device according to the first embodiment.

FIG. 14 is a schematic cross-sectional view illustrating a magnetic memory device according to the first embodiment.

As shown in FIG. 14, the magnetic memory device 140A according to the embodiment further includes a fourth stacked body SB4 in addition to the second conductive layer 22 and the third stacked body SB3. The first conductive layer 21, the first stacked body SB1, and the second stacked body SB2 may be provided in the magnetic memory device 140A. The first conductive layer 21, the first stacked body SB1, and the second stacked body SB2 are not illustrated in FIG. 14. An example of the fourth stacked body SB4 will now be described.

The second conductive layer 22 further includes a ninth region 22i and a tenth region 22j in addition to the sixth region to eighth regions 22f to 22h. The seventh region 22g is provided between the sixth region 22f and the ninth region 22i in the second direction (the X-axis direction). The tenth region 22j is provided between the seventh region 22g and the ninth region 22i in the second direction.

The fourth stacked body SB4 includes a seventh magnetic layer 17, an eighth magnetic layer 18, and a fourth nonmagnetic layer 14n. The eighth magnetic layer 18 is provided between the tenth region 22j and the seventh magnetic layer 17 in the first direction (the Z-axis direction). The fourth nonmagnetic layer 14n is provided between the seventh magnetic layer 17 and the eighth magnetic layer 18.

The controller 70 also is electrically connected to the ninth region 22i and the seventh magnetic layer 17. A third cell transistor TC3, a fourth cell transistor TC4, a third conductive layer transistor TL3, a fourth conductive layer transistor TL4, and a second middle interconnect 25b are further provided in the example.

The third cell transistor TC3 includes a ninth end portion Tm9, a tenth end portion Tm10, and a fifth gate Tg5. The third conductive layer transistor TL3 includes an eleventh end portion Tm11, a twelfth end portion Tm12, and a sixth gate Tg6. The fourth conductive layer transistor TL4 includes a thirteenth end portion Tm13, a fourteenth end portion Tm14, and a seventh gate Tg7. The fourth cell transistor TC4 includes a fifteenth end portion Tm15, a sixteenth end portion Tm16, and an eighth gate Tg8.

The ninth end portion Tm9 is electrically connected to the fifth magnetic layer 15. The tenth end portion Tm10 and the fifth gate Tg5 are electrically connected to the controller 70. The eleventh end portion Tm11 is electrically connected to the sixth region 22f. The twelfth end portion Tm12 and the sixth gate Tg6 are electrically connected to the controller 70. The thirteenth end portion Tm13 is electrically connected to the ninth region 22i. The fourteenth end portion Tm14 and the seventh gate Tg7 are electrically connected to the controller 70. The fifteenth end portion Tm15 is electrically connected to the seventh magnetic layer 17. The sixteenth end portion Tm16 and the eighth gate Tg8 are electrically connected to the controller 70.

The second middle interconnect 25b is electrically connected to the seventh region 22g.

For example, the tenth end portion Tm10 is set to the Vdd voltage; and the twelfth end portion Tm12 is set to the Vss voltage. Or, the tenth end portion Tm10 is set to the Vss voltage; and the twelfth end portion Tm12 is set to the Vdd voltage. At this time, for example, the seventh region 22g is set to the "Vdd/2" voltage.

For example, the sixteenth end portion Tm16 is set to the Vdd voltage; and the fourteenth end portion Tm14 is set to the Vss voltage. Or, the sixteenth end portion Tm16 is set to the Vss voltage; and the fourteenth end portion Tm14 is set to the Vdd voltage. At this time, for example, the seventh region 22g is set to the "Vdd/2" voltage.

At least one of the third magnetic layer 13, the fifth magnetic layer 15, or the seventh magnetic layer 17 may include configurations and materials similar to those of the first magnetic layer 11. At least one of the fourth magnetic layer 14, the sixth magnetic layer 16, or the eighth magnetic layer 18 may include configurations and materials similar to those of the second magnetic layer 12. At least one of the second nonmagnetic layer 12n, the third nonmagnetic layer 13n, or the fourth nonmagnetic layer 14n may include configurations and materials similar to those of the first nonmagnetic layer 11n. The second conductive layer 22 may include configurations and materials similar to those of the first conductive layer 21.

Second Embodiment

A second embodiment relates to an example of a pattern layout of a magnetic memory device. In the following drawings, the insulating region between the multiple interconnects is not illustrated as appropriate.

Figure 15:
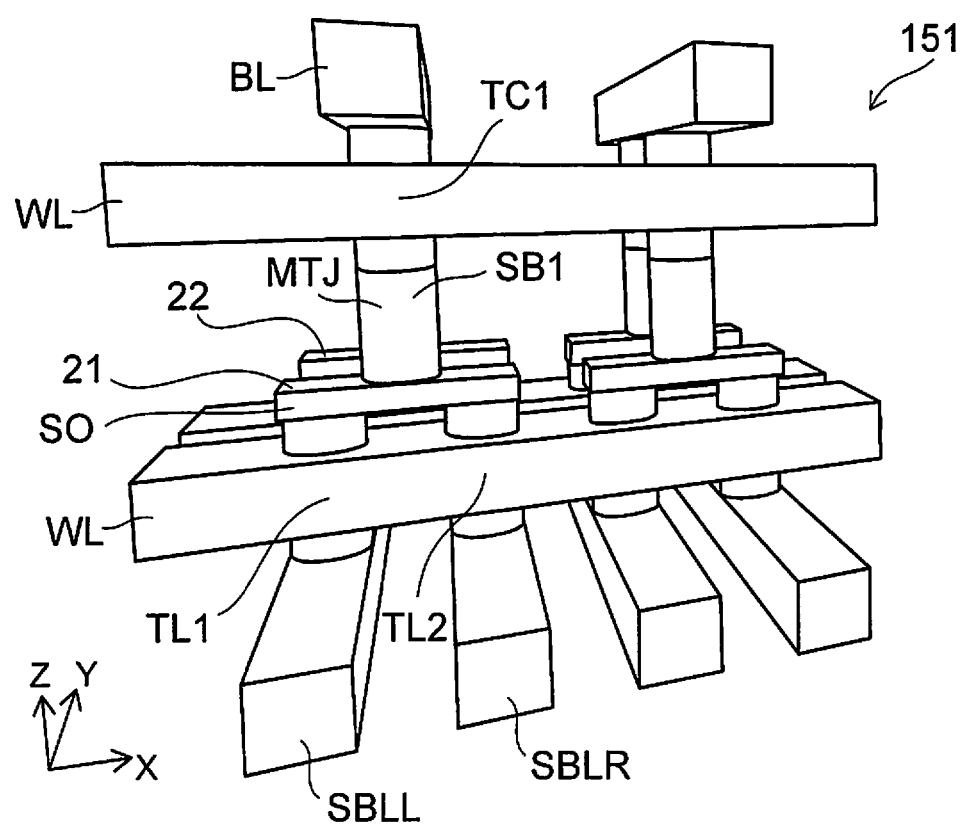
FIG. 15 is a schematic perspective view illustrating a magnetic memory device according to a second embodiment.

FIG. 15 is a schematic perspective view illustrating the magnetic memory device according to the second embodiment.

FIG. 16A to FIG. 16F are schematic cross-sectional views illustrating the magnetic memory device according to the second embodiment.

In the magnetic memory device 151 illustrated in FIG. 15, the gates of the first conductive layer transistor TL1 and the second conductive layer transistor TL2 correspond to an interconnect WL. An end portion (the fourth end portion Tm4: referring to FIG. 11C) of the first conductive layer transistor TL1 is connected to an interconnect SBLL. An end portion (the sixth end portion Tm6: referring to FIG. 11C) of the second conductive layer transistor TL2 is connected to an interconnect SBLR.

An end portion (the second end portion Tm2: referring to FIG. 11C) of the first cell transistor TC1 is electrically connected to an interconnect BL. The gate (the first gate Tg1: referring to FIG. 11C) of the first cell transistor TC1 corresponds to another interconnect WL.

FIG. 16A to FIG. 16F show examples of cross sections of each layer of the magnetic memory device 151. In these drawings, "SO" corresponds to the first conductive layer 21 or the second conductive layer 22. "MTJ" corresponds to the stacked body (e.g., the first to fourth stacked bodies SB1 to SB4).

Figure 16A:
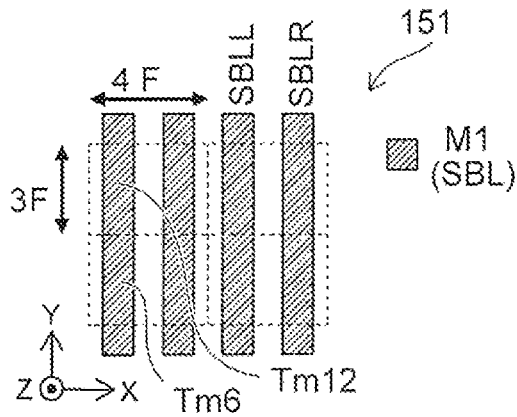
FIG. 16A to FIG. 16F are schematic cross-sectional views illustrating the magnetic memory device according to the second embodiment.
Figure 16D:
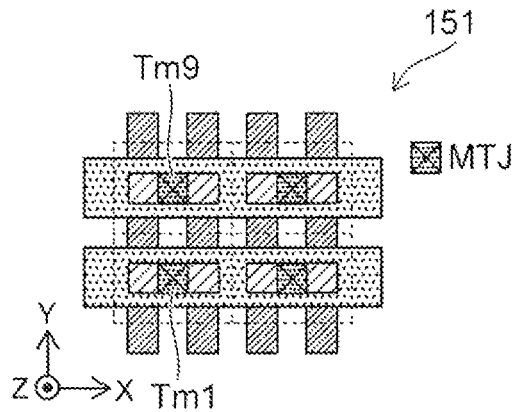
Figure 16B:
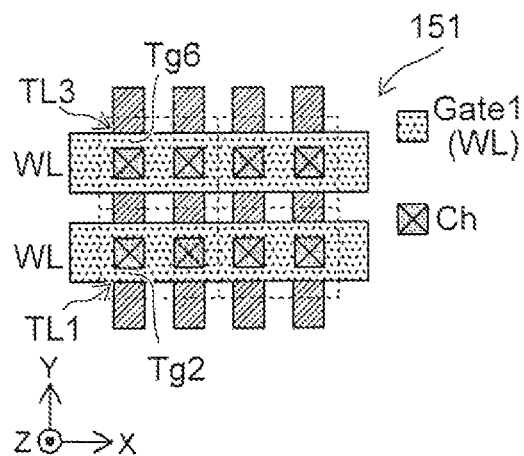

The first conductive layer transistor TL1 and the third conductive layer transistor TL3 are formed at crossing portions between channels Ch and the interconnects WL (Gates 1) illustrated in FIG. 16B. These interconnects WL correspond to the second gate Tg2 and the sixth gate Tg6.

Positions where an interconnect SBL (a layer M1) illustrated in FIG. 16A overlaps the channels Ch in the Z-axis direction correspond to the fourth end portion Tm4 of the first conductive layer transistor TL1 and the twelfth end portion Tm12 of the third conductive layer transistor TL3. The positions where "SO" (the first conductive layer 21 and the second conductive layer 22) illustrated in FIG. 16C overlap the channels Ch in the Z-axis direction correspond to the third end portion Tm3 of the first conductive layer transistor TL1 and the eleventh end portion Tm11 of the third conductive layer transistor TL3.

Thus, the direction from the third end portion Tm3 toward the fourth end portion Tm4 is aligned with the first direction (the Z-axis direction). The direction from the eleventh end portion Tm11 toward the twelfth end portion Tm12 is aligned with the first direction (the Z-axis direction). For example, the first conductive layer transistor TL1, the third conductive layer transistor TL3, etc., are vertical transistors (referring to FIG. 15).

Figure 16E:
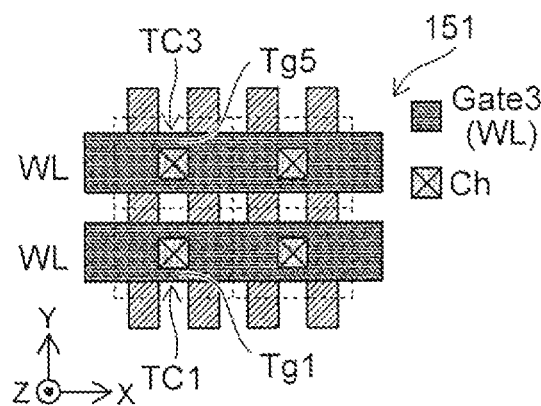
Figure 16C:
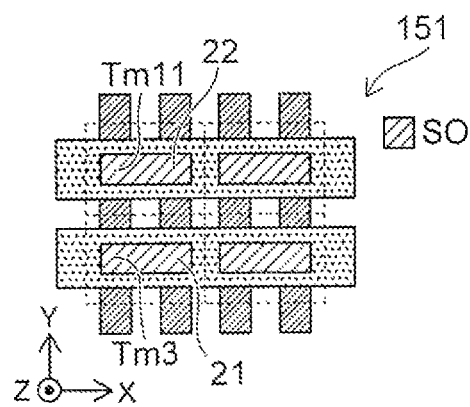

The first cell transistor TC1 and the third cell transistor TC3 are formed at the crossing portions between the channels Ch and the interconnects WL (Gates 3) illustrated in FIG. 16E. These interconnects WL correspond to the first gate Tg1 and the fifth gate Tg5.

The positions where "MTJ" illustrated in FIG. 16D overlap the channels Ch in the Z-axis direction correspond to the first end portion Tm1 of the first cell transistor TC1 and the ninth end portion Tm9 of the third cell transistor TC3. The positions where the interconnect BL (a layer M6) illustrated in FIG. 16F overlaps the channels Ch in the Z-axis direction correspond to the second end portion Tm2 of the first cell transistor TC1 and the tenth end portion Tm10 of the third cell transistor TC3.

Thus, the direction from the first end portion Tm1 toward the second end portion Tm2 is aligned with the first direction (the Z-axis direction). The direction from the ninth end portion Tm9 toward the tenth end portion Tm10 is aligned with the first direction (the Z-axis direction). For example, the first cell transistor TC1, the third cell transistor TC3, etc., are vertical transistors (referring to FIG. 15).

Figure 16F:
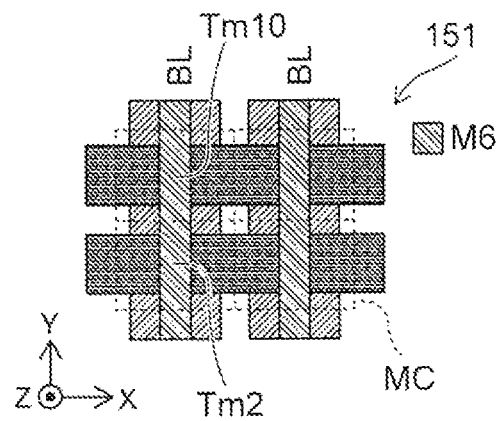

As shown in FIG. 16A and FIG. 16F, the occupied surface area of one memory cell MC is $12F^2$. In the case where two bits of information can be stored in one memory cell MC, the size per bit is $6F^2$.

Figure 17:
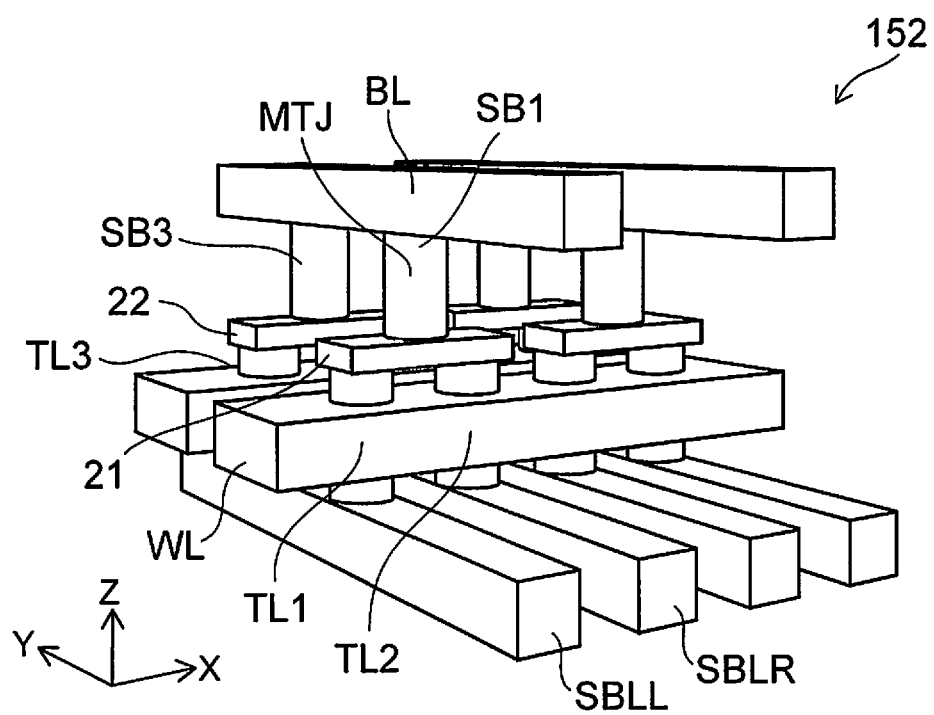
FIG. 17 is a schematic perspective view illustrating a magnetic memory device according to the second embodiment.
Figure 18A:
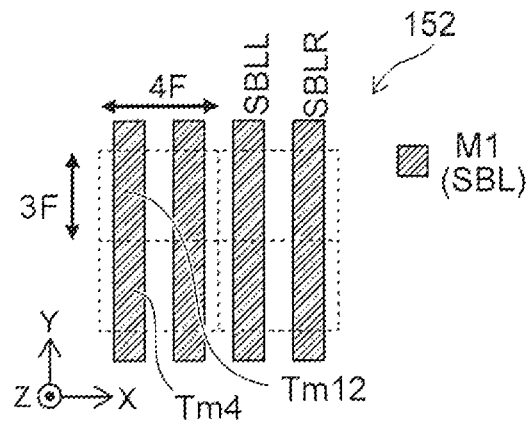
FIG. 18A to FIG. 18E are schematic cross-sectional views illustrating the magnetic memory device according to the second embodiment.
Figure 18D:
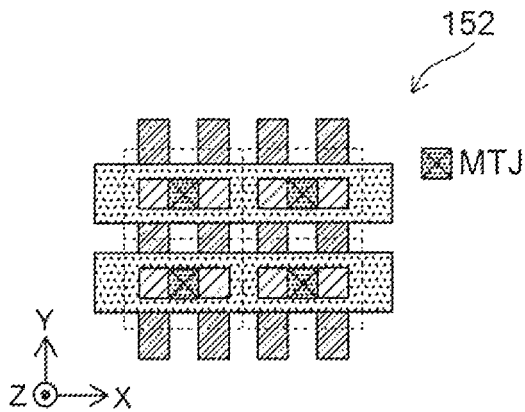
Figure 18B:
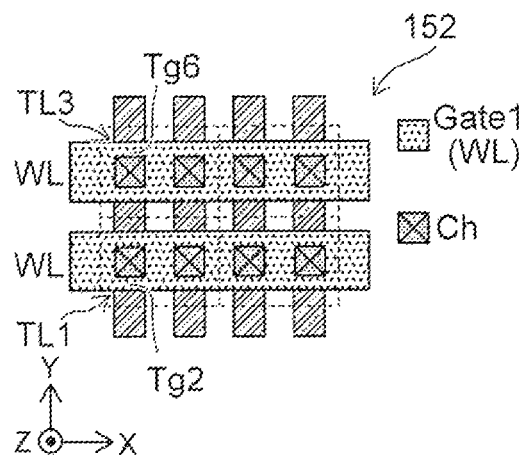
Figure 18E:
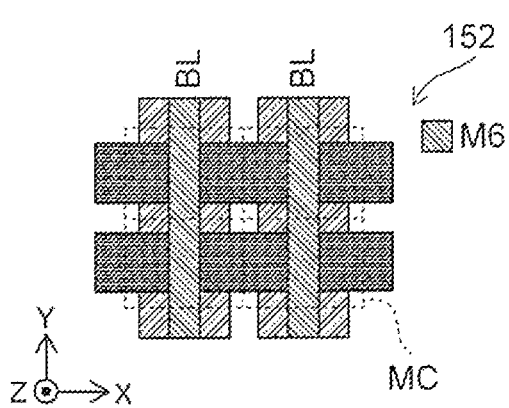
Figure 18C:
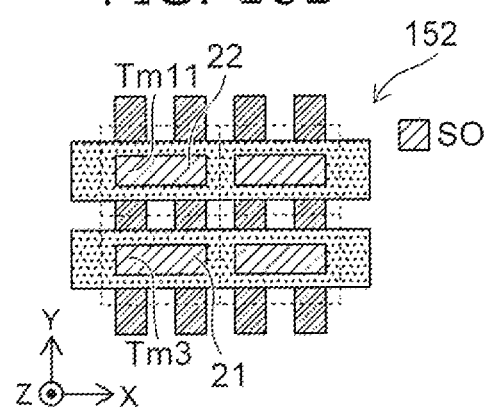

FIG. 17 is a schematic perspective view illustrating a magnetic memory device according to the second embodiment.

FIG. 18A to FIG. 18E are schematic cross-sectional views illustrating the magnetic memory device according to the second embodiment.

In the magnetic memory device 152 illustrated in FIG. 17, the gates of the first conductive layer transistor TL1 and the second conductive layer transistor TL2 correspond to the interconnect WL. An end portion (the fourth end portion Tm4: referring to FIG. 11C) of the first conductive layer transistor TL1 is connected to the interconnect SBLL. An end portion (the sixth end portion Tm6: referring to FIG. 11C) of the second conductive layer transistor TL2 is connected to the interconnect SBLR.

The first cell transistor TC1 is omitted from the magnetic memory device 152. An end portion (the first magnetic layer 11: referring to FIG. 11D) of the first stacked body SB1 and an end portion (the fifth magnetic layer 15: referring to FIG. 13) of the third stacked body SB3 are electrically connected to the interconnect BL. FIG. 18A to FIG. 18E show examples of cross sections of each layer of the magnetic memory device 152.

Figure 19:
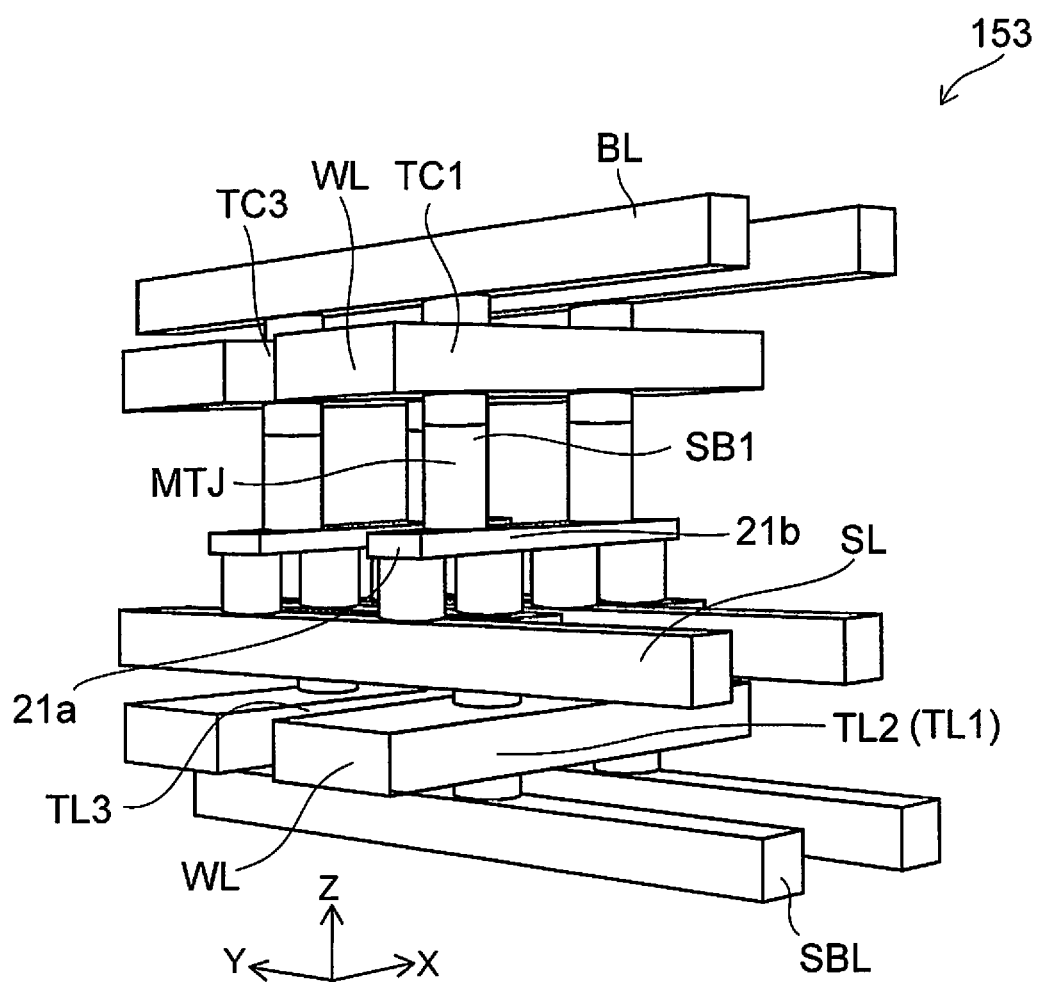
FIG. 19 is a schematic perspective view illustrating a magnetic memory device according to the second embodiment.

FIG. 19 is a schematic perspective view illustrating a magnetic memory device according to the second embodiment.

FIG. 20A to FIG. 20H are schematic cross-sectional views illustrating the magnetic memory device according to the second embodiment.

The second conductive layer transistor TL2 and the first cell transistor TC1 are provided in the magnetic memory device 153 illustrated in FIG. 19. The gate (the third gate Tg3: referring to FIG. 11B) of the second conductive layer transistor TL2 corresponds to the interconnect WL. An end portion (the sixth end portion Tm6: referring to FIG. 11B) of the second conductive layer transistor TL2 is connected to the interconnect SBL. The other end portion (the fifth end portion Tm5: referring to FIG. 11B) of the second conductive layer transistor TL2 is connected to the second region 21b of the first conductive layer 21. The first region 21a of the first conductive layer 21 is electrically connected to an interconnect SL. The second conductive layer transistor TL2 may be considered to be the first conductive layer transistor TL1.

Figure 20A:
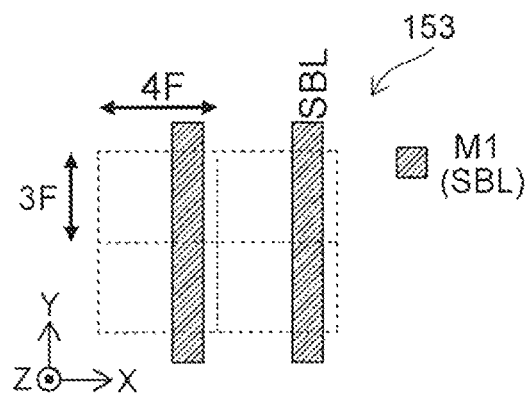
FIG. 20A to FIG. 20H are schematic cross-sectional views illustrating the magnetic memory device according to the second embodiment.
Figure 20E:
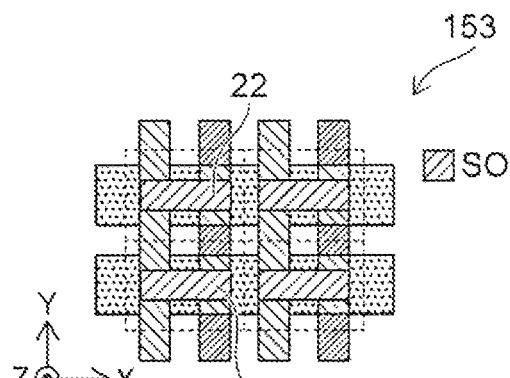
Figure 20B:
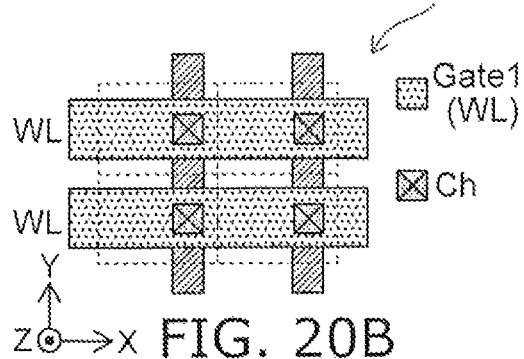
Figure 20F:
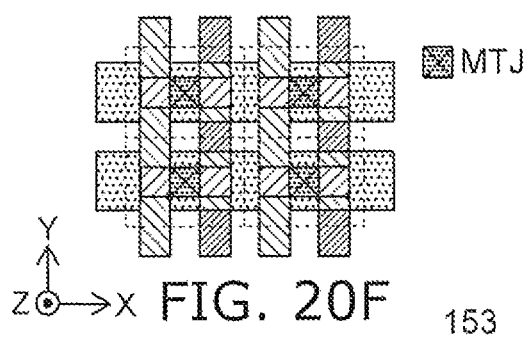
Figure 20C:
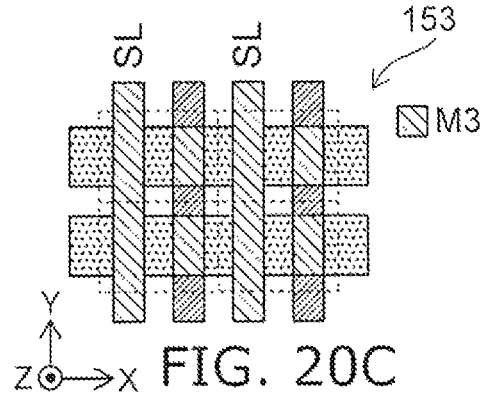
Figure 20G:
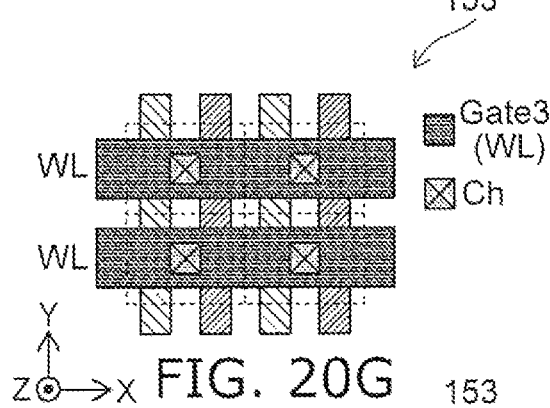
Figure 20D:
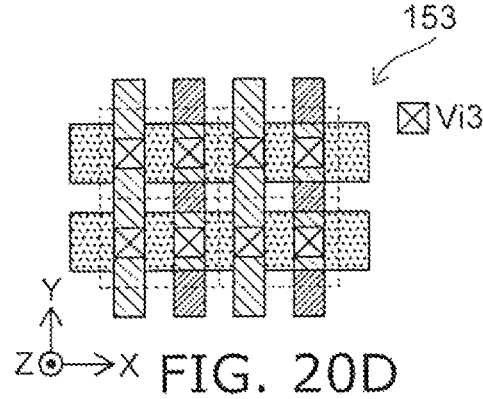
Figure 20H:
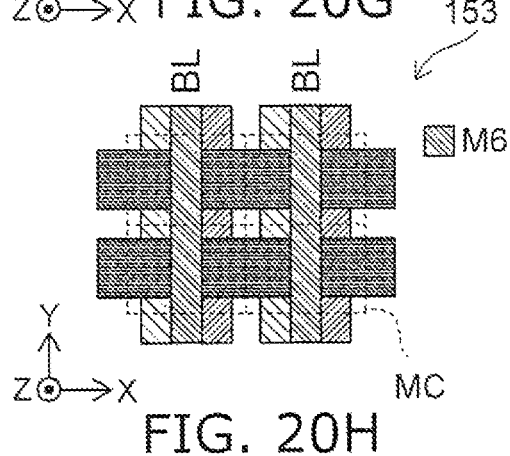

An end portion (the second end portion Tm2: referring to FIG. 11B) of the first cell transistor TC1 is electrically connected to the interconnect BL. The gate (the first gate Tg1: referring to FIG. 11B) of the first cell transistor TC1 corresponds to another interconnect WL. FIG. 20A to FIG. 20H show examples of cross sections of each layer of the magnetic memory device 153. As shown in FIG. 20D, the conductive members above and below are electrically connected by connection members Vi3.

The first conductive layer transistor TL1 (or the second conductive layer transistor TL2) and the third conductive layer transistor TL3 are provided in the magnetic memory devices 151 to 153 recited above. As described above, the gates of these conductive layer transistors correspond to the interconnects WL. In the magnetic memory devices 151 to 153, the position in the Z-axis direction of the interconnect WL corresponding to the first conductive layer 21 is the same as the position in the Z-axis direction of the interconnect WL corresponding to the second conductive layer 22 (referring to FIG. 16B, FIG. 18B, and FIG. 20B).

In the embodiment as described below, the position in the Z-axis direction of the interconnect WL corresponding to the first conductive layer 21 may be different from the position in the Z-axis direction of the interconnect WL corresponding to the second conductive layer 22.

FIG. 21A to FIG. 21H, FIG. 22A to FIG. 22F, and FIG. 23A to FIG. 23J are schematic cross-sectional views illustrating magnetic memory devices according to the second embodiment.

Figure 21A:
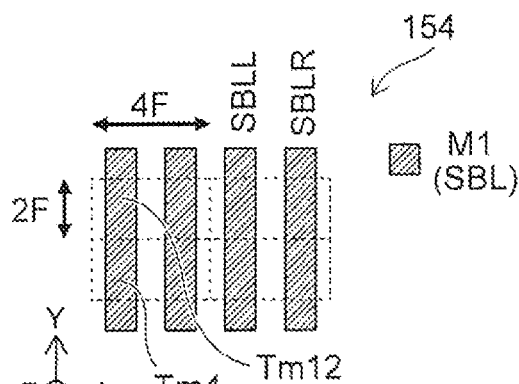
FIG. 21A to FIG. 21H are schematic cross-sectional views illustrating a magnetic memory device according to the second embodiment.
Figure 21E:
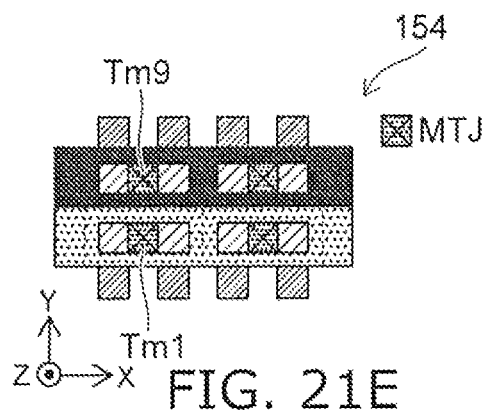
Figure 21B:
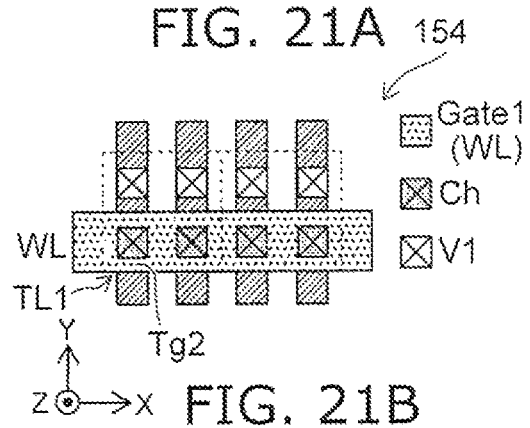
Figure 21F:
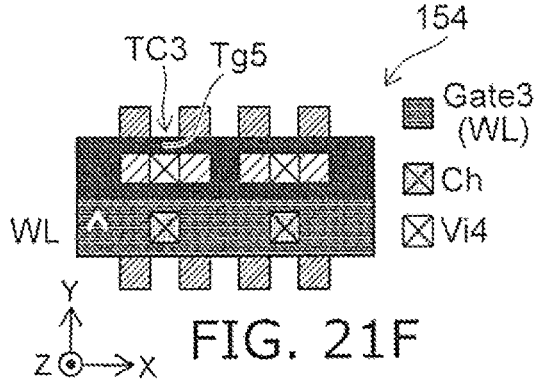
Figure 21C:
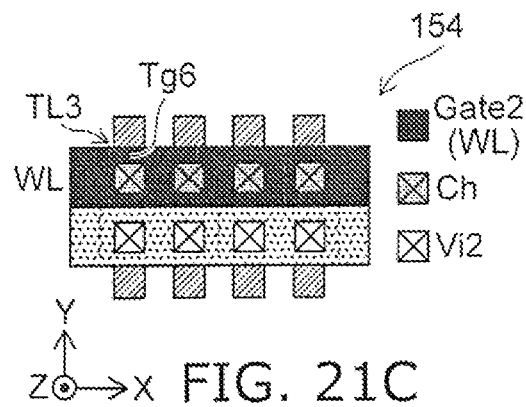
Figure 21G:
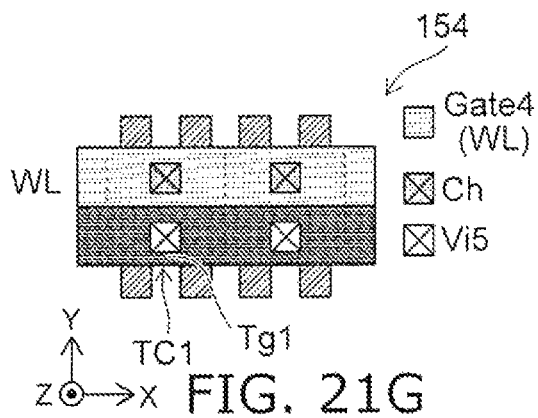
Figure 21D:
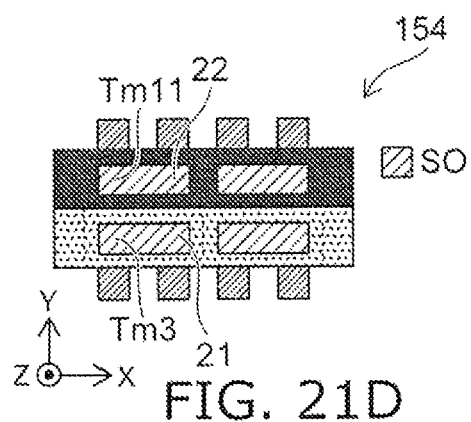

FIG. 21A to FIG. 21H show an example of the layer structure of a magnetic memory device 154. The interconnect WL that corresponds to the first conductive layer 21 illustrated in FIG. 21D is positioned at the layer illustrated in FIG. 21B. The interconnect WL that corresponds to the second conductive layer 22 illustrated in FIG. 21D is positioned at the layer illustrated in FIG. 21C.

The first conductive layer transistor TL1 is formed at the crossing portion between the channel Ch and the interconnect WL (the Gate 1) illustrated in FIG. 21B. The interconnect WL of FIG. 21B corresponds to the second gate Tg2.

The third conductive layer transistor TL3 is formed at the crossing portion between the channel Ch and the interconnect WL (a Gate 2) illustrated in FIG. 21C. The interconnect WL of FIG. 21C corresponds to the sixth gate Tg6.

The positions where the interconnect SBL (the layer M1) illustrated in FIG. 21A overlaps the channels Ch in the Z-axis direction correspond to the fourth end portion Tm4 of the first conductive layer transistor TL1 and the twelfth end portion Tm12 of the third conductive layer transistor TL3.

The positions where "SO" (the first conductive layer 21 and the second conductive layer 22) illustrated in FIG. 21D overlap the channels Ch in the Z-axis direction correspond to the third end portion Tm3 of the first conductive layer transistor TL1 and the eleventh end portion Tm11 of the third conductive layer transistor TL3.

Thus, the direction from the third end portion Tm3 toward the fourth end portion Tm4 is aligned with the first direction (the Z-axis direction). The direction from the eleventh end portion Tm11 toward the twelfth end portion Tm12 is aligned with the first direction (the Z-axis direction).

As shown in FIG. 21B and FIG. 21C, the position in the first direction (the Z-axis direction) of the second gate Tg2 is different from the position in the first direction of the sixth gate Tg6.

Thus, the position in the Z-axis direction of the interconnect WL corresponding to the first conductive layer 21 and the position in the Z-axis direction of the interconnect WL corresponding to the second conductive layer 22 are different from each other. Thereby, the distance in the X-Y plane between these interconnects can be short. The storage density can be increased further.

The third cell transistor TC3 is formed at the crossing portion between the channel Ch and the interconnect WL (the Gate 3) illustrated in FIG. 21F. The interconnect WL of FIG. 21F corresponds to the fifth gate Tg5.

The first cell transistor TC1 is formed at the crossing portion between the channel Ch and the interconnect WL (a Gate 4) illustrated in FIG. 21G. The interconnect WL of FIG. 21G corresponds to the first gate Tg1.

The positions where "MTJ" illustrated in FIG. 21E overlap the channels Ch in the Z-axis direction correspond to the first end portion Tm1 of the first cell transistor TC1 and the ninth end portion Tm9 of the third cell transistor TC3. The positions where the interconnect BL (the layer M6) illustrated in FIG. 21H overlaps the channels Ch in the Z-axis direction correspond to the second end portion Tm2 of the first cell transistor TC1 and the tenth end portion Tm10 of the third cell transistor TC3.

The direction from the first end portion Tm1 toward the second end portion Tm2 is aligned with the first direction (the Z-axis direction). The direction from the ninth end portion Tm9 toward the tenth end portion Tm10 is aligned with the first direction (the Z-axis direction).

As shown in FIG. 21F and FIG. 21G, the position in the first direction (the Z-axis direction) of the first gate Tg1 is different from the position in the first direction of the fifth gate Tg5.

Thus, the position in the Z-axis direction of the interconnect WL corresponding to the first cell transistor TC1 and the position in the Z-axis direction of the interconnect WL corresponding to the third cell transistor TC3 are different from each other. Thereby, the distance in the X-Y plane between these interconnects can be short. The storage density can be increased further.

Figure 21H:
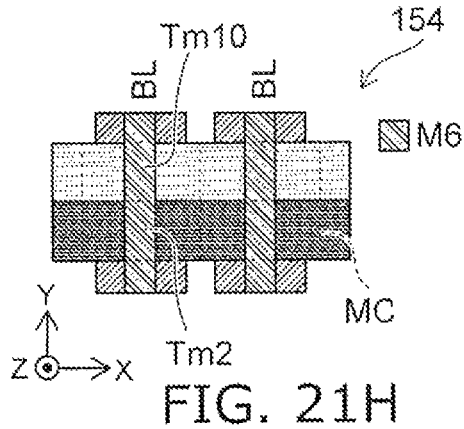
Figure 22A:
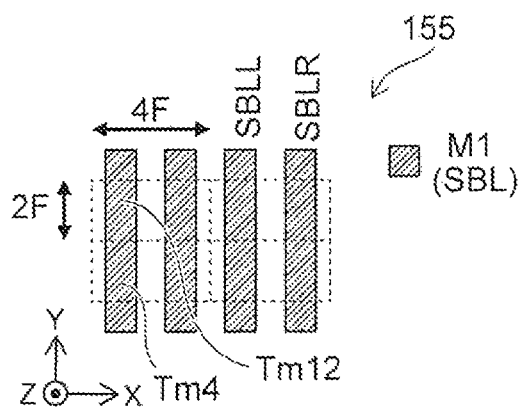
FIG. 22A to FIG. 22F are schematic cross-sectional views illustrating a magnetic memory device according to the second embodiment.
Figure 22E:
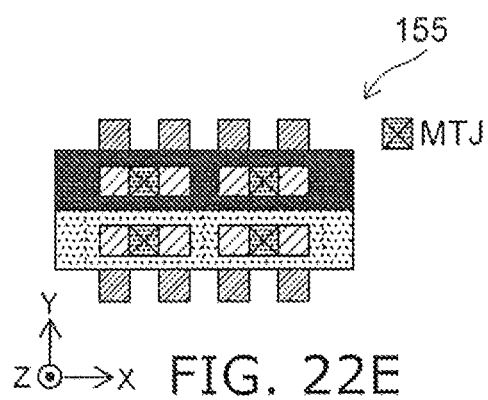
Figure 22B:
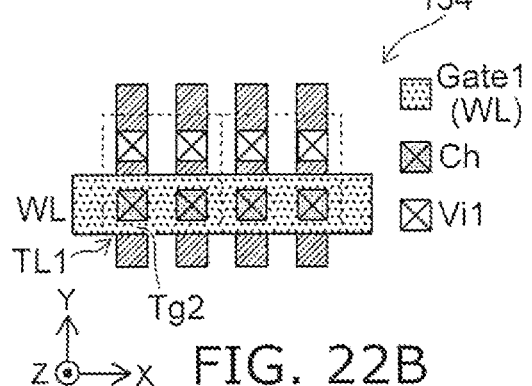
Figure 22F:
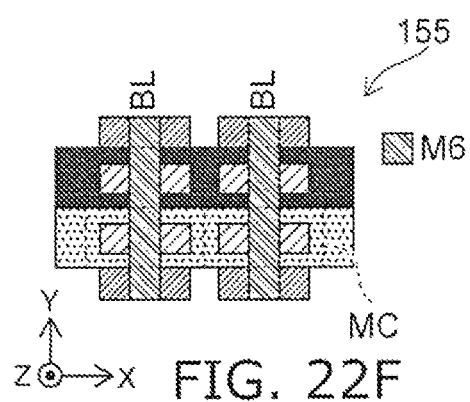
Figure 22C:
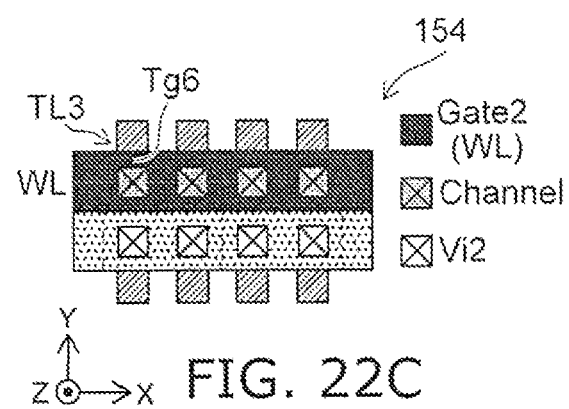
Figure 22D:
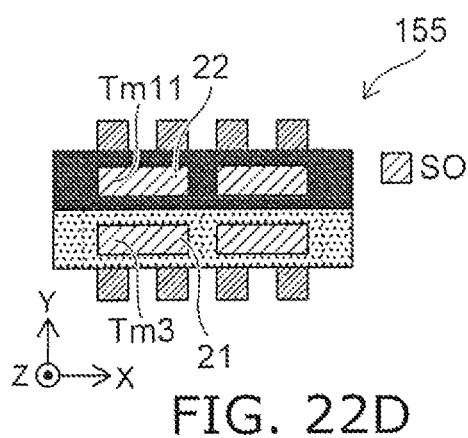

As shown in FIG. 21A and FIG. 21H, the occupied surface area of one memory cell MC is $8F^2$. In the case where two bits of information can be stored in one memory cell MC, the size per bit is $4F^2$.

In the magnetic memory device 154, the conductive members above and below are electrically connected by connection members Vi1, Vi2, Vi4, and Vi5.

FIG. 22A to FIG. 22F show an example of the layer structure of a magnetic memory device 155. The interconnect WL that corresponds to the first conductive layer 21 (referring to FIG. 22D) is positioned at the layer illustrated in FIG. 22B. The interconnect WL that corresponds to the second conductive layer 22 (referring to FIG. 22D) is positioned at the layer illustrated in FIG. 22C.

Figure 23A:
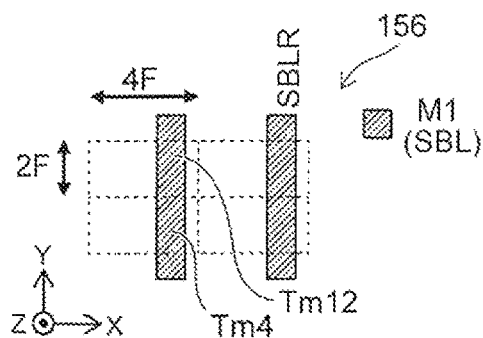
FIG. 23A to FIG. 23J are schematic cross-sectional views illustrating a magnetic memory device according to the second embodiment.
Figure 23B:
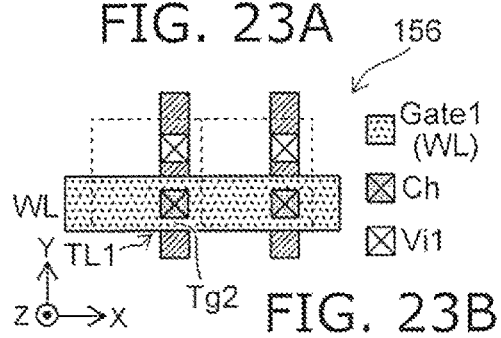
Figure 23C:
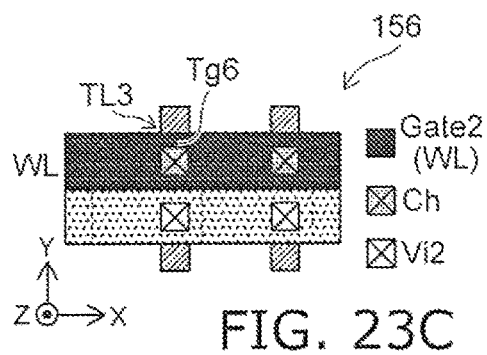
Figure 23D:
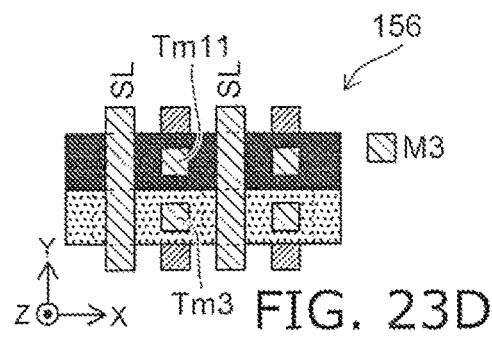
Figure 23E:
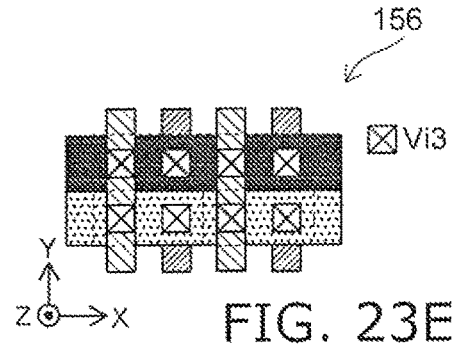
Figure 23F:
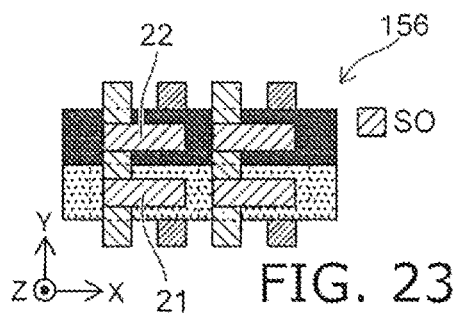
Figure 23G:
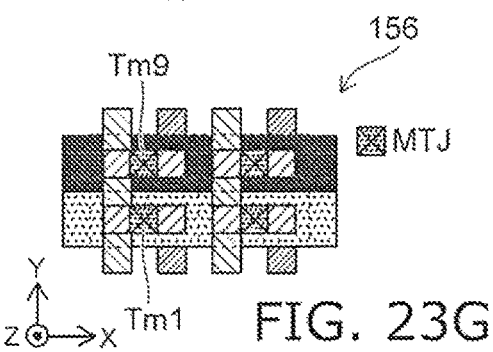
Figure 23H:
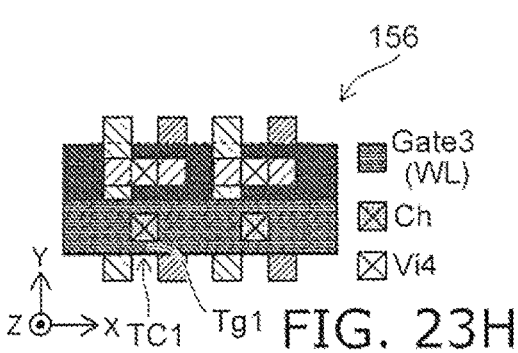
Figure 23I:
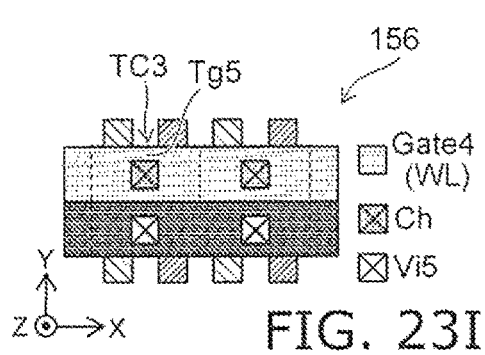
Figure 23J:
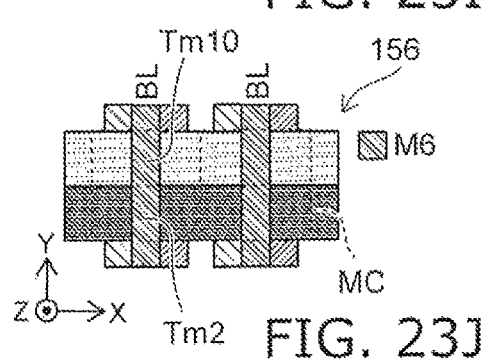

FIG. 23A to FIG. 23J show an example of the layer structure of a magnetic memory device 156. The interconnect WL that corresponds to the first conductive layer 21 illustrated in FIG. 23F is positioned at the layer illustrated in FIG. 23B. The interconnect WL that corresponds to the second conductive layer 22 illustrated in FIG. 23F is positioned at the layer illustrated in FIG. 23C.

Thus, the first conductive layer transistor TL1 (referring to FIG. 21B, FIG. 22B, and FIG. 23B) and the third conductive layer transistor TL3 (referring to FIG. 21C, FIG. 22C, and FIG. 23C) are provided in the magnetic memory devices 154 to 156. The first conductive layer transistor TL1 includes the third end portion Tm3, the fourth end portion Tm4, and the second gate Tg2 (e.g., referring to FIG. 13B, etc.). The third end portion Tm3 is electrically connected to one of the first region 21a or the second region 21b. The fourth end portion Tm4 and the second gate Tg2 are electrically connected to the controller 70. The third conductive layer transistor TL3 includes the eleventh end portion Tm11, the twelfth end portion Tm12, and the sixth gate Tg6 (referring to FIG. 14). The eleventh end portion Tm11 is electrically connected to one of the sixth region 22f or the seventh region 22g. The twelfth end portion Tm12 and the sixth gate Tg6 are electrically connected to the controller 70.

By providing a difference between the positions in the Z-axis direction of the interconnects WL corresponding to the gates of these transistors, the storage density can be increased further.

Figure 24:
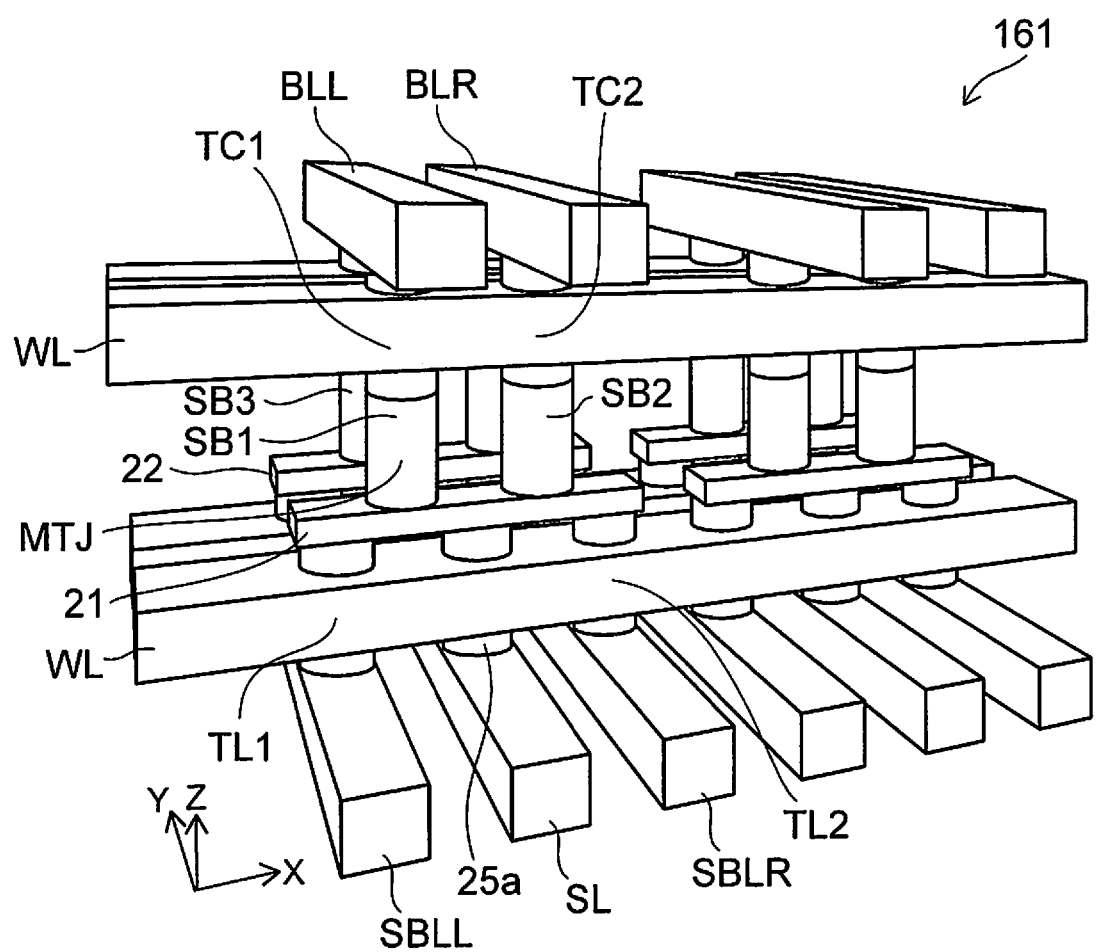
FIG. 24 is a schematic perspective view illustrating a magnetic memory device according to the second embodiment.

FIG. 24 is a schematic perspective view illustrating a magnetic memory device according to the second embodiment.

FIG. 25A to FIG. 25F are schematic cross-sectional views illustrating the magnetic memory device according to the second embodiment.

In the magnetic memory device 161 illustrated in FIG. 24, two stacked bodies (the first stacked body SB1 and the second stacked body SB2) are provided at the first conductive layer 21. The first cell transistor TC1 is provided at the first stacked body SB1. An end portion of the first cell transistor TC1 is connected to an interconnect BLL. The second cell transistor TC2 is provided at the second stacked body SB2. An end portion of the second cell transistor TC2 is connected to an interconnect BLR.

The first conductive layer transistor TL1 and the second conductive layer transistor TL2 are provided at end portions of the first conductive layer 21. An end portion of the first conductive layer transistor TL1 is connected to the interconnect SBLL. An end portion of the second conductive layer transistor TL2 is connected to the interconnect SBLR.

The first middle interconnect 25a is provided at the middle portion (corresponding to the second region 21b) of the first conductive layer 21. The first middle interconnect 25a is connected to the interconnect SL.

The position of the first cell transistor TC1 is between the position in the X-axis direction of the first conductive layer transistor TL1 and the position in the X-axis direction of the first middle interconnect 25a. The position of the second cell transistor TC2 is between the position in the X-axis direction of the second conductive layer transistor TL2 and the position in the X-axis direction of the first middle interconnect 25a.

The position in the X-axis direction of the first stacked body SB1 and the position in the X-axis direction of the interconnect BLL are between the position in the X-axis direction of the interconnect SBLL and the position in the X-axis direction of the interconnect SL. The position in the X-axis direction of the second stacked body SB2 and the position in the X-axis direction of the interconnect BLR are between the position in the X-axis direction of the interconnect SBLR and the position in the X-axis direction of the interconnect SL.

FIG. 25A to FIG. 25F show examples of cross sections of each layer of the magnetic memory device 161.

Figure 25A:
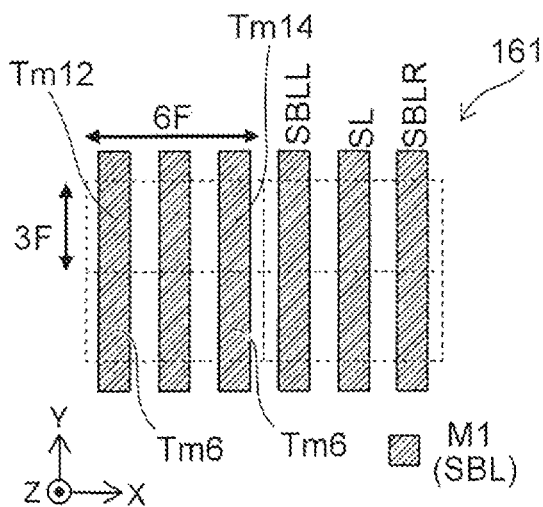
FIG. 25A to FIG. 25F are schematic cross-sectional views illustrating the magnetic memory device according to the second embodiment.
Figure 25D:
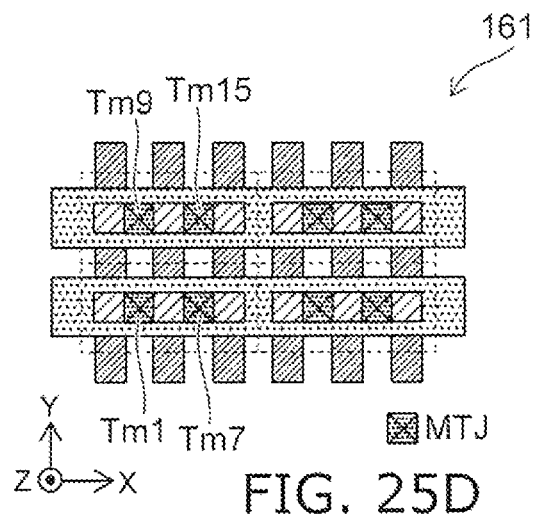
Figure 25B:
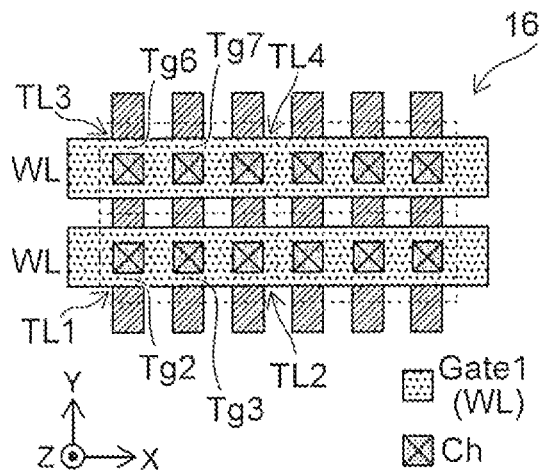
Figure 25E:
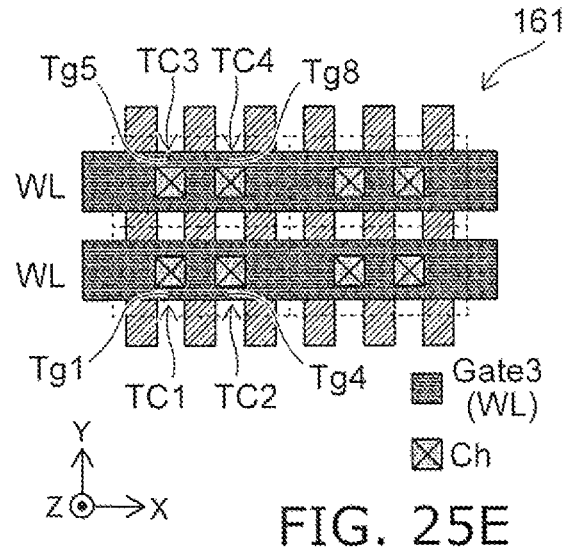
Figure 25C:
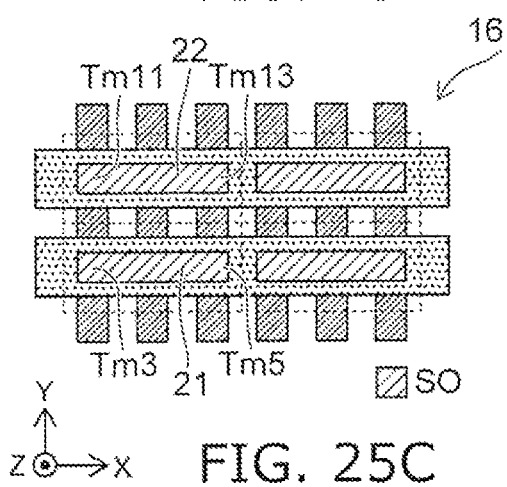
Figure 25F:
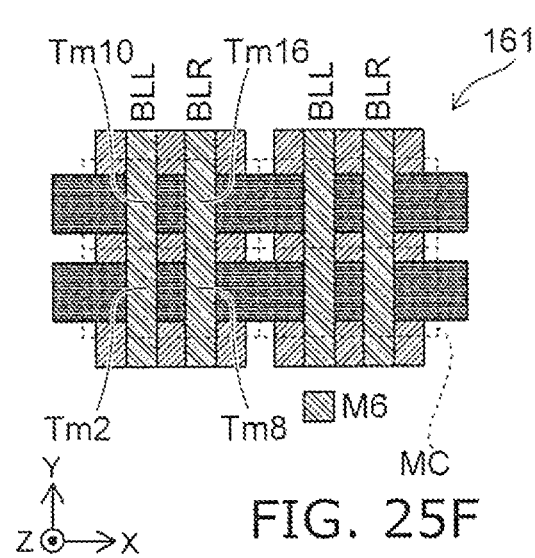

As shown in FIG. 25A and FIG. 25F, the occupied surface area of one memory cell MC is $18F^2$. In the case where four bits of information can be stored in one memory cell MC, the size per bit is $4.5F^2$.

Figure 26:
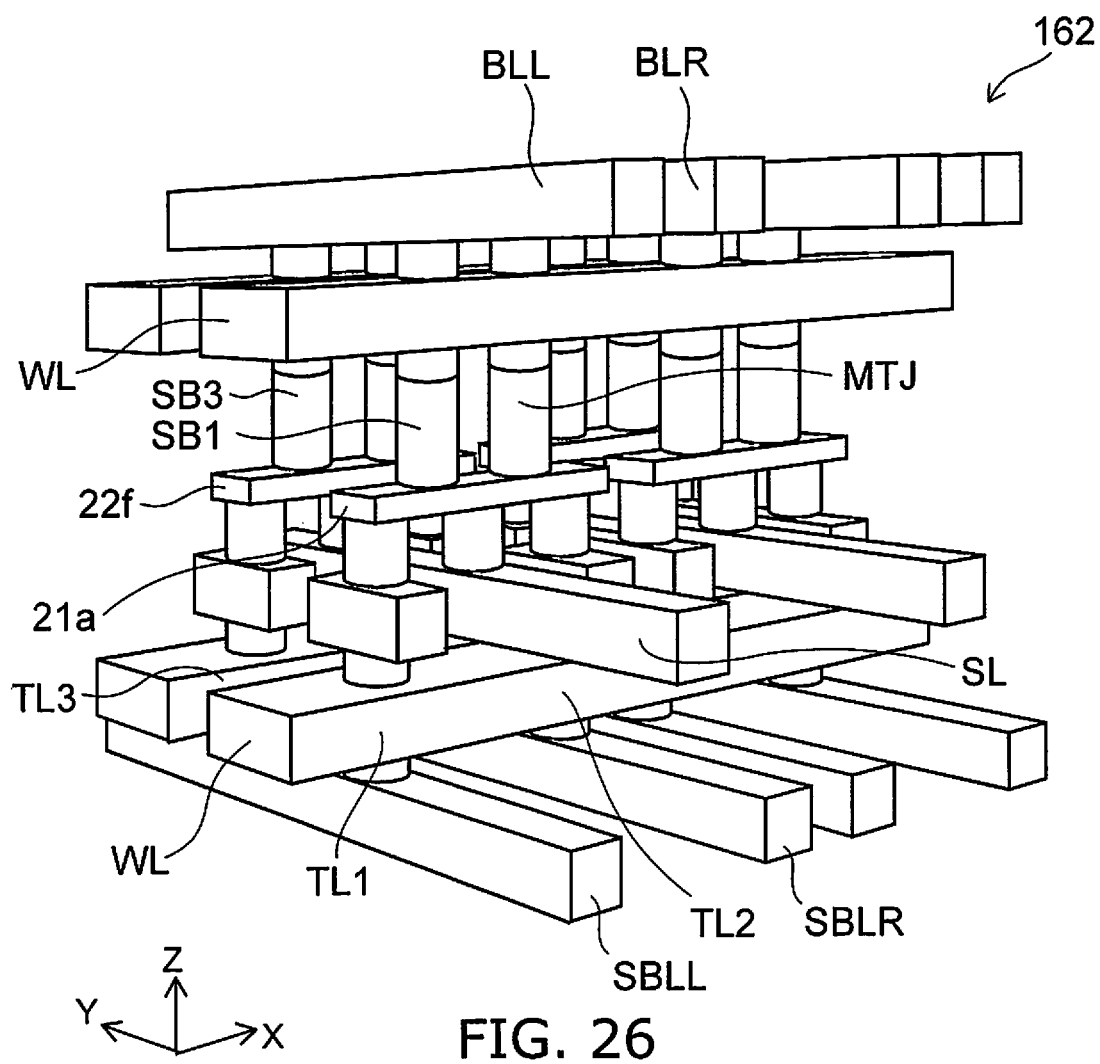
FIG. 26 is a schematic perspective view illustrating a magnetic memory device according to the second embodiment.
Figure 27A:
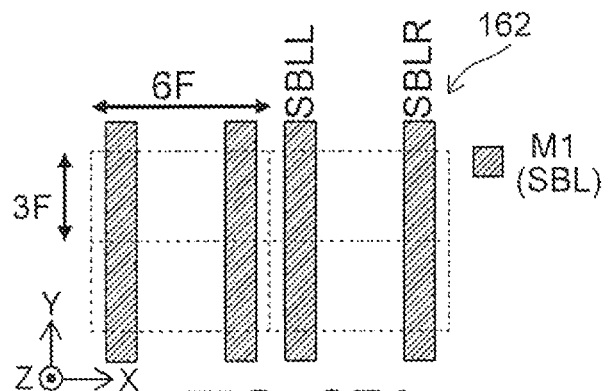
FIG. 27A to FIG. 27H are schematic cross-sectional views illustrating the magnetic memory device according to the second embodiment.
Figure 27E:
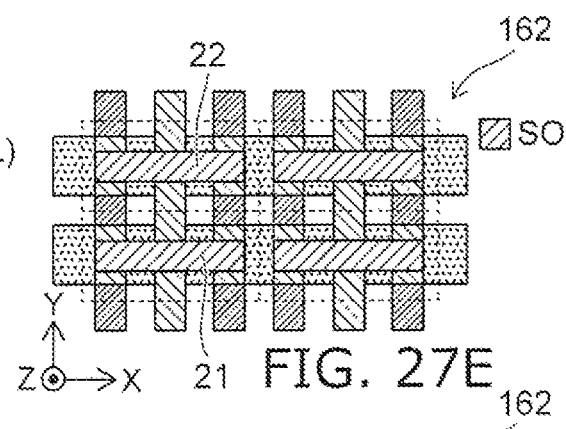
Figure 27B:
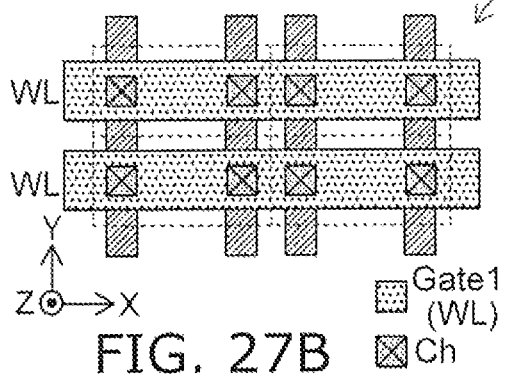
Figure 27F:
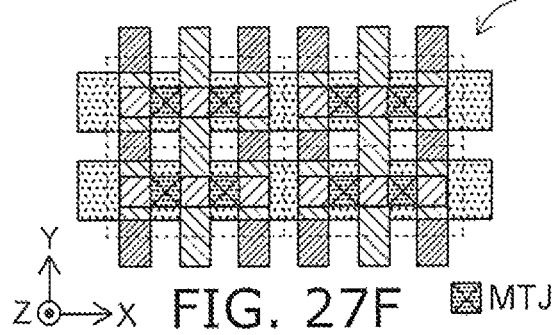
Figure 27C:
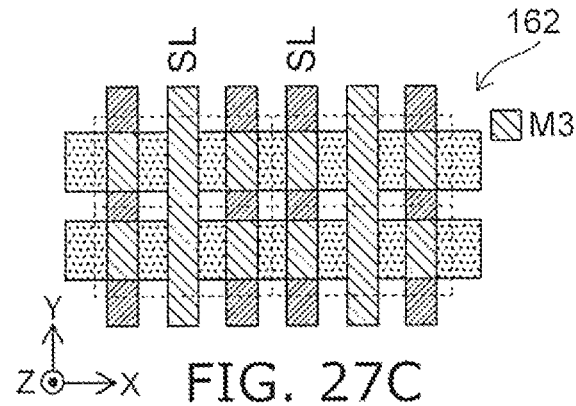
Figure 27G:
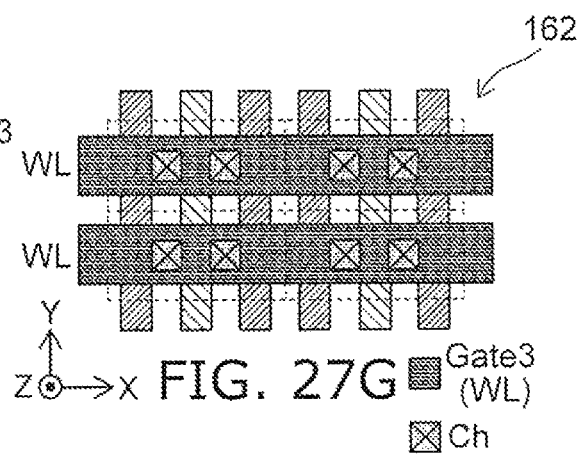
Figure 27D:
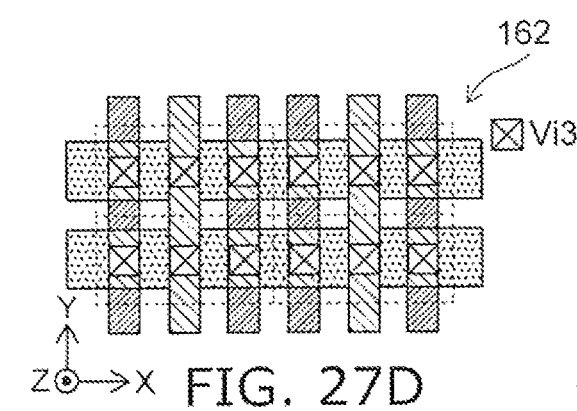
Figure 27H:
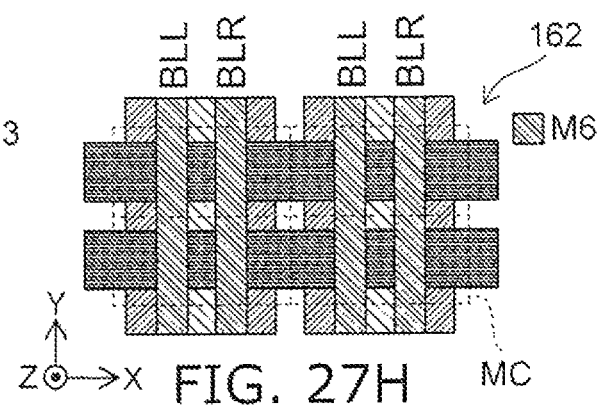

FIG. 26 is a schematic perspective view illustrating a magnetic memory device according to the second embodiment.

FIG. 27A to FIG. 27H are schematic cross-sectional views illustrating the magnetic memory device according to the second embodiment.

In the magnetic memory device 162 illustrated in FIG. 26 and FIG. 27A to FIG. 27H, the position in the Z-axis direction of the interconnect WL is between the position in the Z-axis direction of the interconnect SBLL and the position in the Z-axis direction of the interconnect SL.

Figure 28:
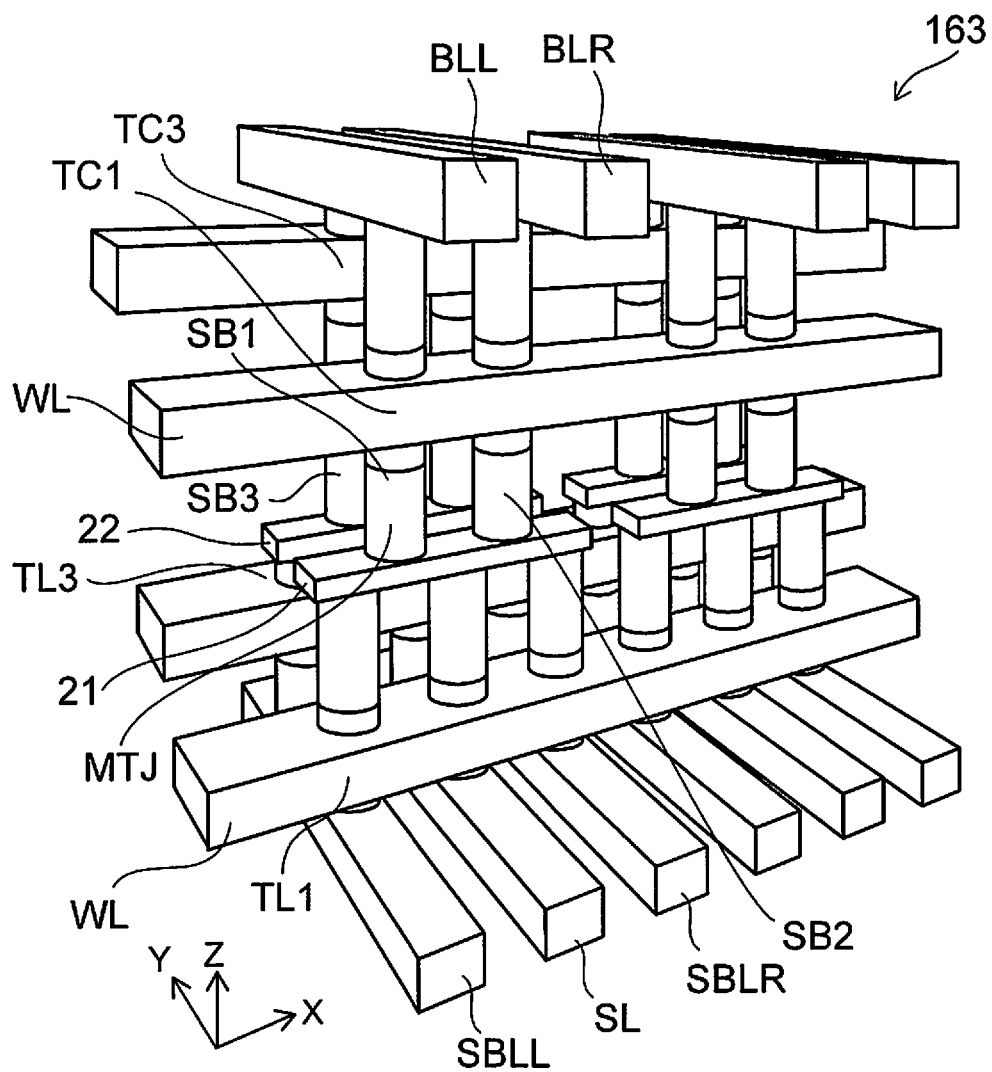
FIG. 28 is a schematic perspective view illustrating a magnetic memory device according to the second embodiment.

FIG. 28 is a schematic perspective view illustrating a Magnetic memory device according to the second embodiment.

FIG. 29A to FIG. 29H are schematic cross-sectional views illustrating the magnetic memory device according to the second embodiment.

In the magnetic memory device 163 illustrated in FIG. 28 and FIG. 29A to FIG. 29H, the position in the Z-axis direction of the interconnect WL corresponding to the first conductive layer transistor TL1 is different from the position in the Z-axis direction of the interconnect WL corresponding to the third conductive layer transistor TL3. The position in the Z-axis direction of the interconnect WL corresponding to the first cell transistor TC1 is different from the position in the Z-axis direction of the interconnect WL corresponding to the third cell transistor TC3.

Figure 29A:
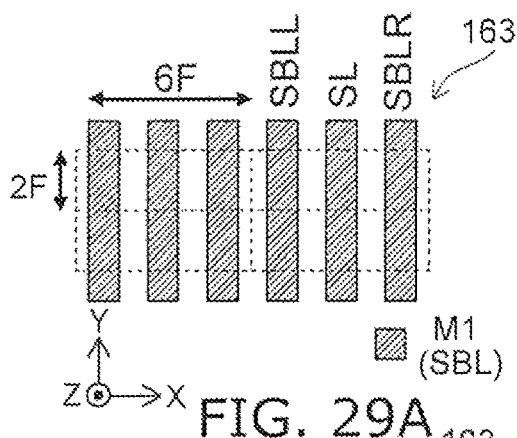
FIG. 29A to FIG. 29H are schematic cross-sectional views illustrating the magnetic memory device according to the second embodiment.
Figure 29B:
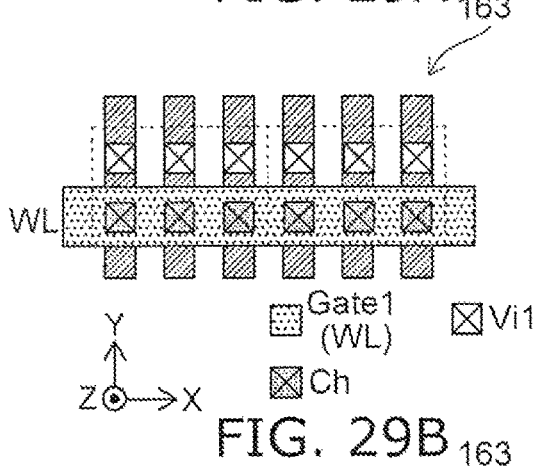
Figure 29C:
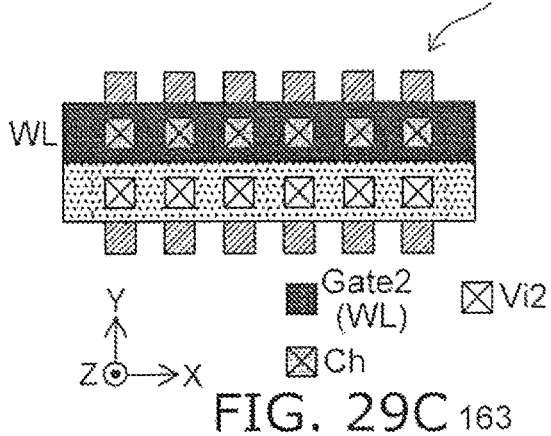
Figure 29D:
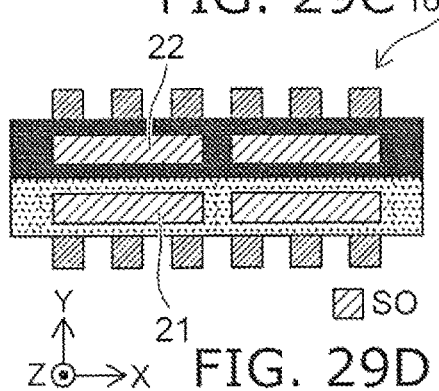
Figure 29E:
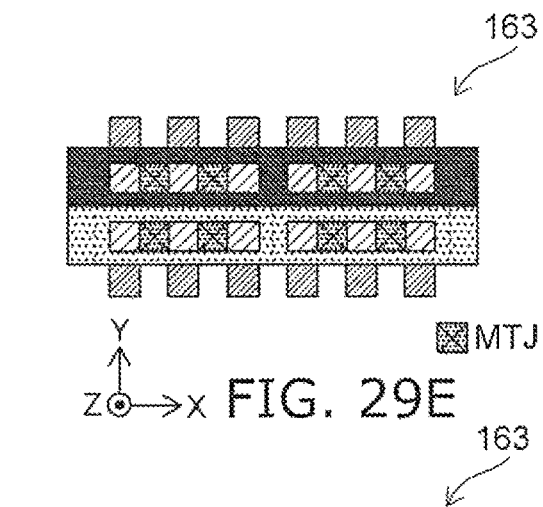
Figure 29F:
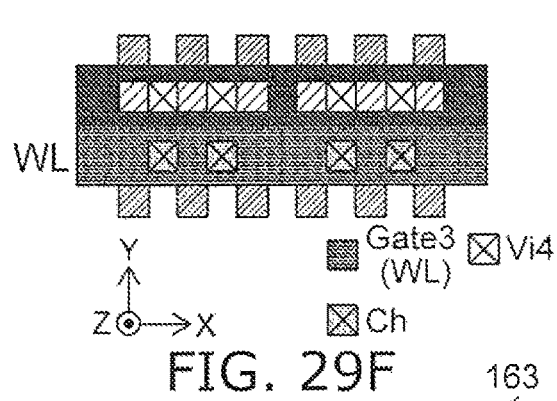
Figure 29G:
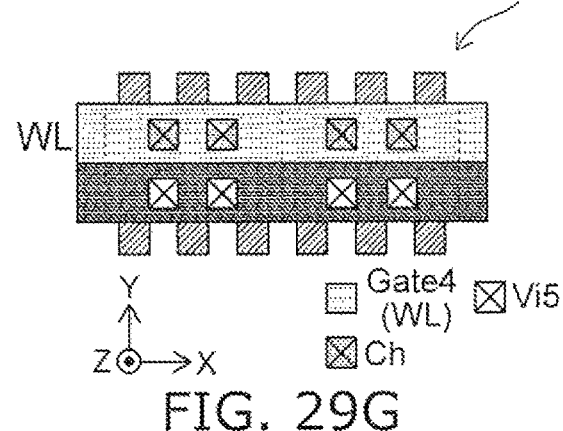
Figure 29H:
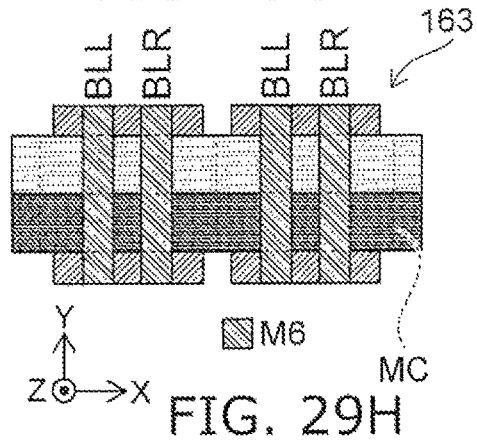

As shown in FIG. 29A and FIG. 29H, the occupied surface area of one memory cell MC is $12F^2$. In the case where four bits of information can be stored in one memory cell MC, the size per bit is $3F^2$.

Figure 30:
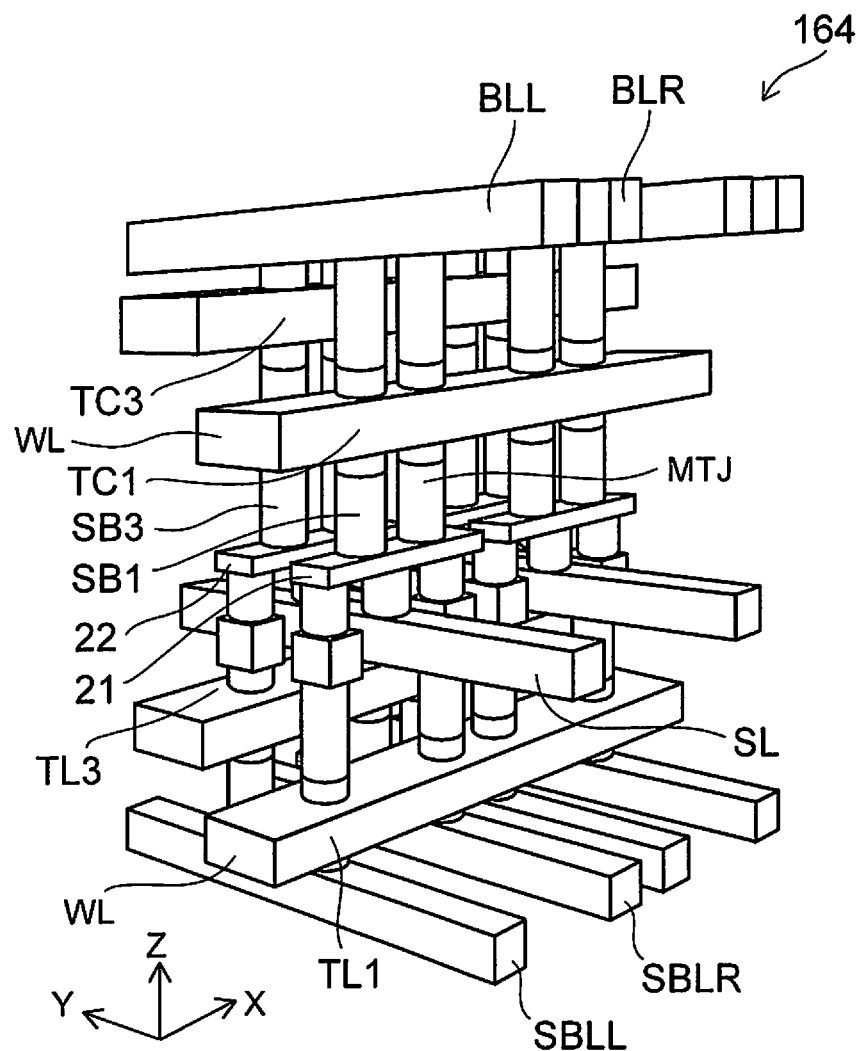
FIG. 30 is a schematic perspective view illustrating a magnetic memory device according to the second embodiment.

FIG. 30 is a schematic perspective view illustrating a magnetic memory device according to the second embodiment.

FIG. 31A to FIG. 31J are schematic cross-sectional views illustrating the magnetic memory device according to the second embodiment.

In the magnetic memory device 164 illustrated in FIG. 28 and FIG. 29A to FIG. 29H as well, the position in the Z-axis direction of the interconnect WL corresponding to the first conductive layer transistor TL1 is different from the position in the Z-axis direction of the interconnect WL corresponding to the third conductive layer transistor TL3. The position in the Z-axis direction of the interconnect WL corresponding to the first cell transistor TC1 is different from the position in the Z-axis direction of the interconnect WL corresponding to the third cell transistor TC3.

Figure 31A:
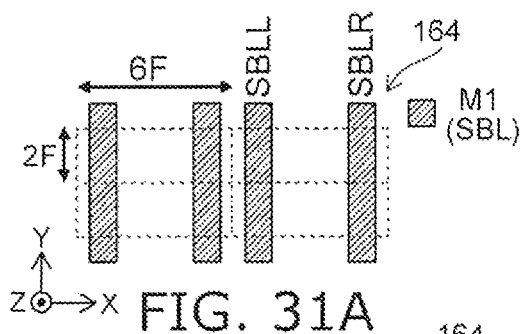
FIG. 31A to FIG. 31J are schematic cross-sectional views illustrating the magnetic memory device according to the second embodiment.
Figure 31B:
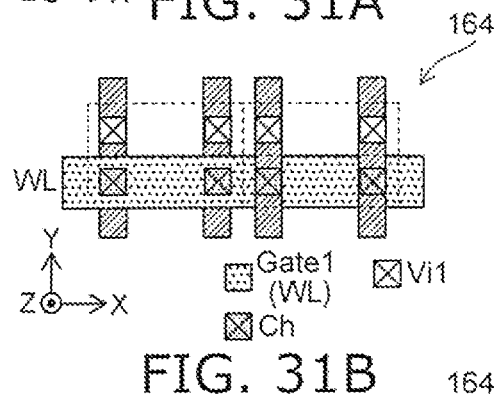
Figure 31C:
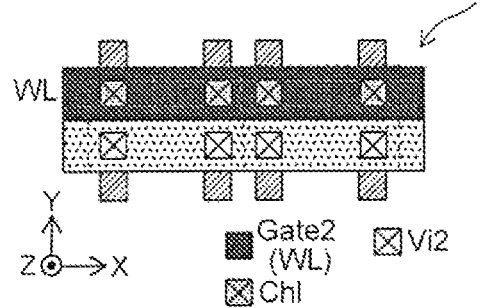
Figure 31D:
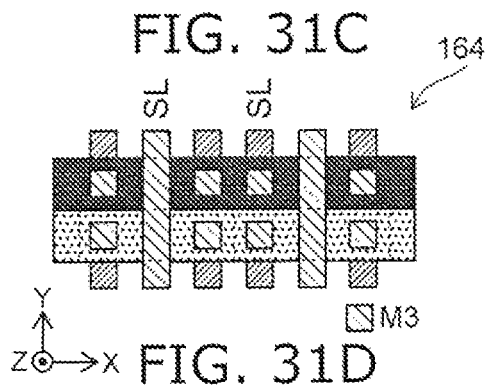
Figure 31E:
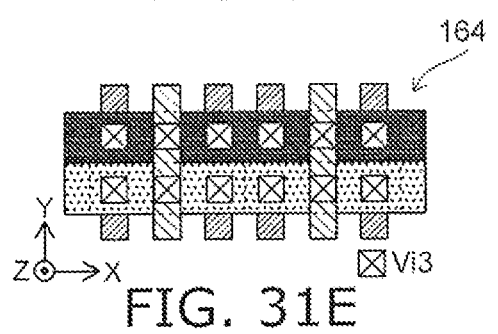
Figure 31F:
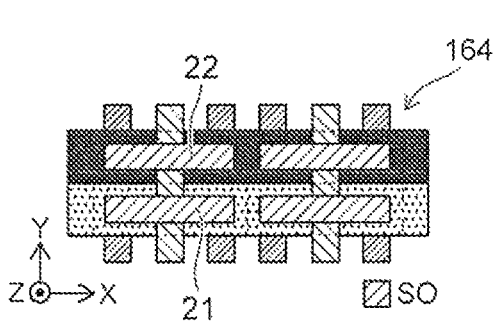
Figure 31G:
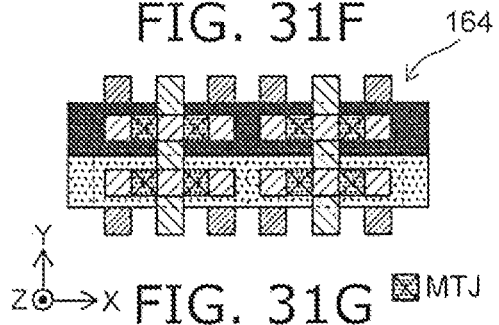
Figure 31H:
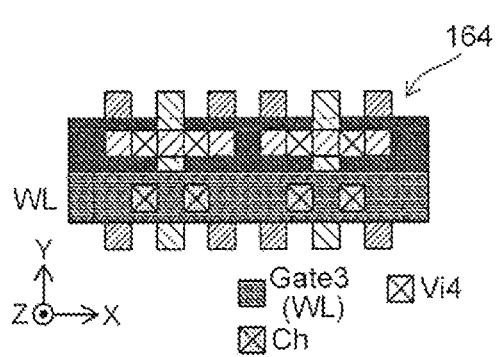
Figure 31I:
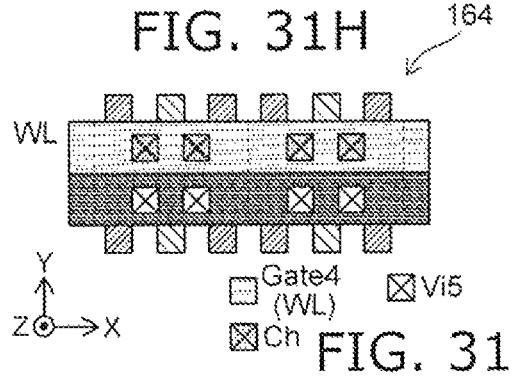
Figure 31J:
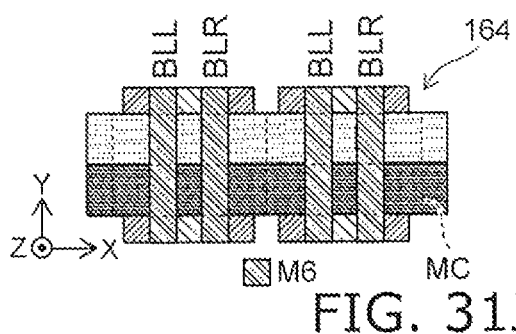

As shown in FIG. 31A and FIG. 31H, the occupied surface area of one memory cell MC is $12F^2$. In the case where four bits of information can be stored in one memory cell MC, the size per bit is $3F^2$.

Figure 32:
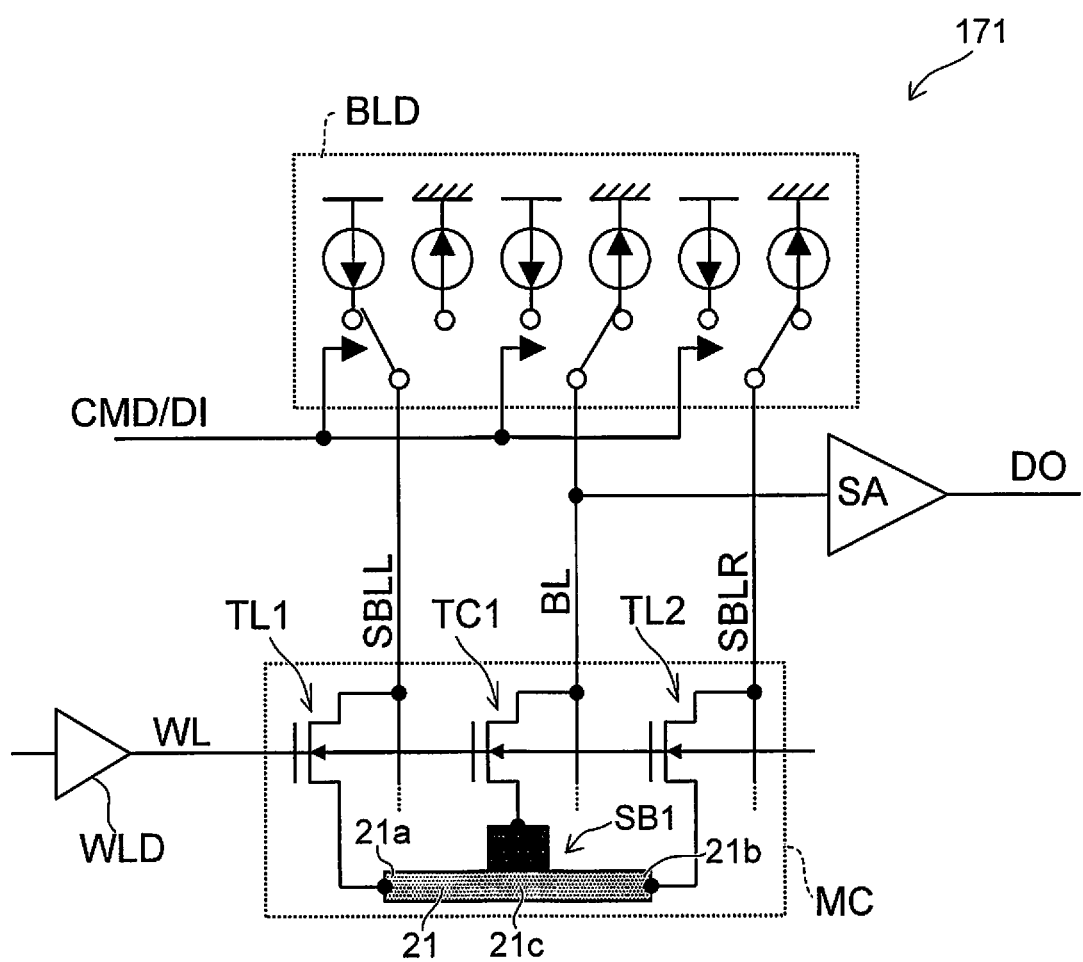
FIG. 32 is a schematic view illustrating a magnetic memory device according to the embodiment.

FIG. 32 is a schematic view illustrating a magnetic memory device according to the embodiment.

FIG. 32 illustrates a drive circuit. In the magnetic memory device 171 as shown in FIG. 32, a signal from a word line driver WLD is supplied to the interconnect WL used as the gates of the transistors provided in the memory cell MC. The interconnects SBLL, SBLR, and BL are connected to end portions of the transistors. Signals that correspond to a control signal CMD and data DI are supplied from a bit line driver BLD to the interconnects SBLL, SBLR, and BL. In the example, a sense amplifier SA is connected to the interconnect BL. Data DO is output from the sense amplifier SA.

Figure 33:
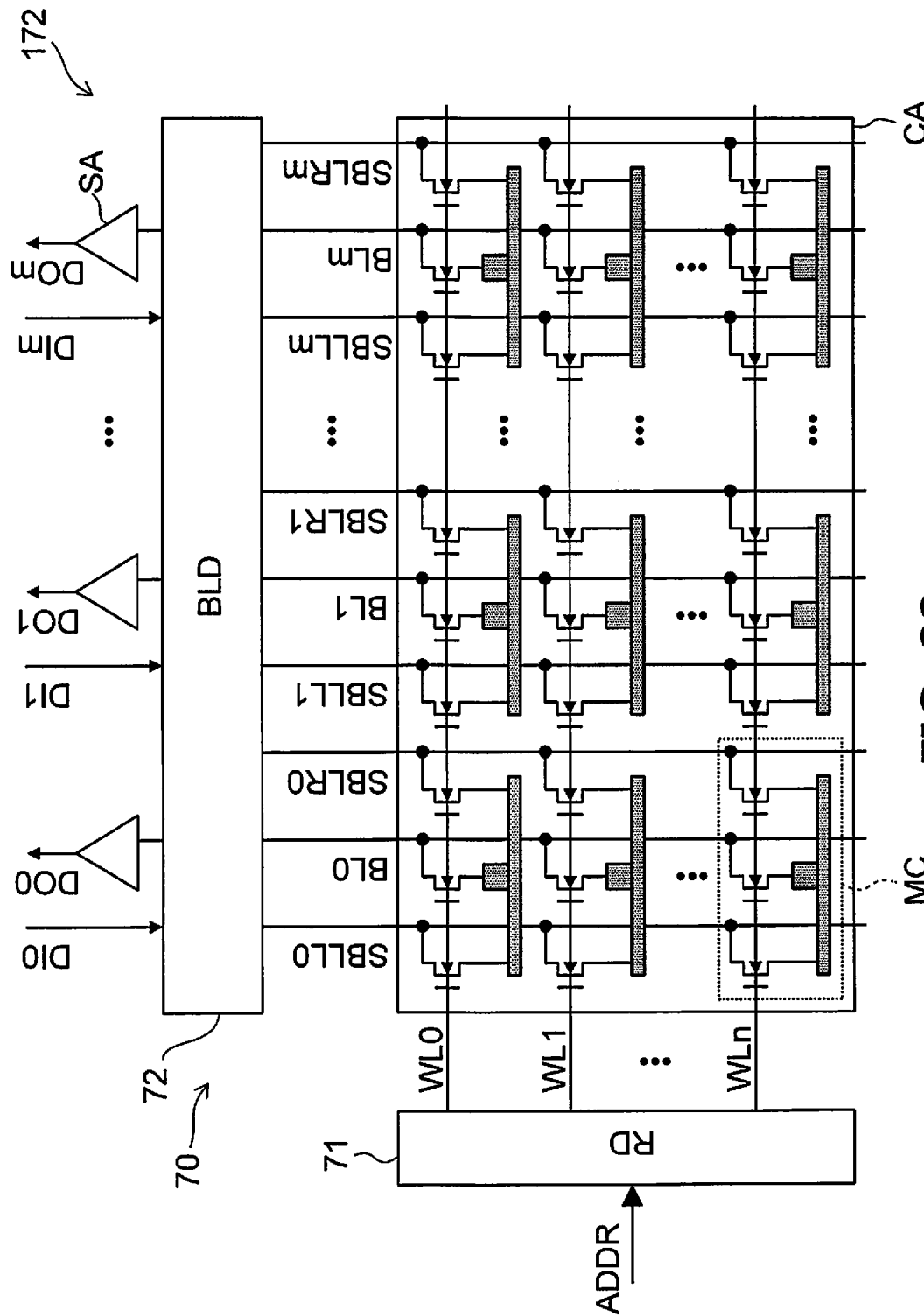
FIG. 33 is a schematic view illustrating a magnetic memory device according to the embodiment.

FIG. 33 is a schematic view illustrating a magnetic memory device according to the embodiment.

FIG. 33 illustrates a drive circuit. In the magnetic memory device 172 as shown in FIG. 33, a cell array CA includes multiple memory cells MC. The controller 70 includes, for example, a first circuit 71 (a row decoder RD) and a second circuit 72 (the bit line driver BLD).

Multiple word lines (interconnects WL0 to WLn, etc.) are connected to the first circuit 71. These word lines are connected to the gates of the transistors provided in the multiple memory cells MC. An address control signal ADDR is supplied to the first circuit 71.

Multiple bit lines (interconnects SBLL0 to SBLLm, interconnects BL0 to BLm, interconnects SBLR0 to SBLRm, etc.) are connected to the second circuit 72. These bit lines are connected to the end portions of the transistors provided in the memory cells MC. The sense amplifiers SA are provided at the second circuit 72. Data DI0 to DIm is supplied to the second circuit 72. Data DO0 to DOm is output from the sense amplifiers SA.

Figure 34A:
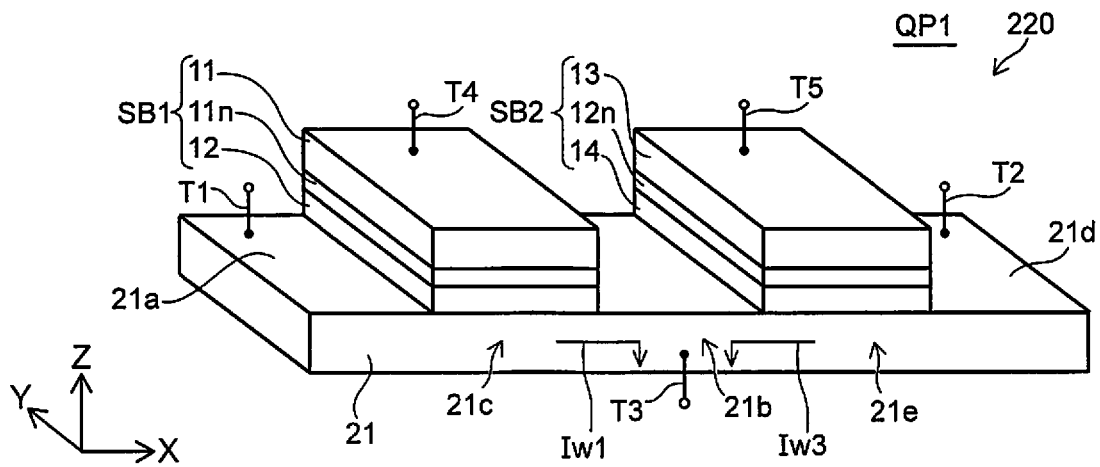
FIG. 34A to FIG. 34C are schematic perspective views illustrating a magnetic memory device according to the embodiment.
Figure 34B:
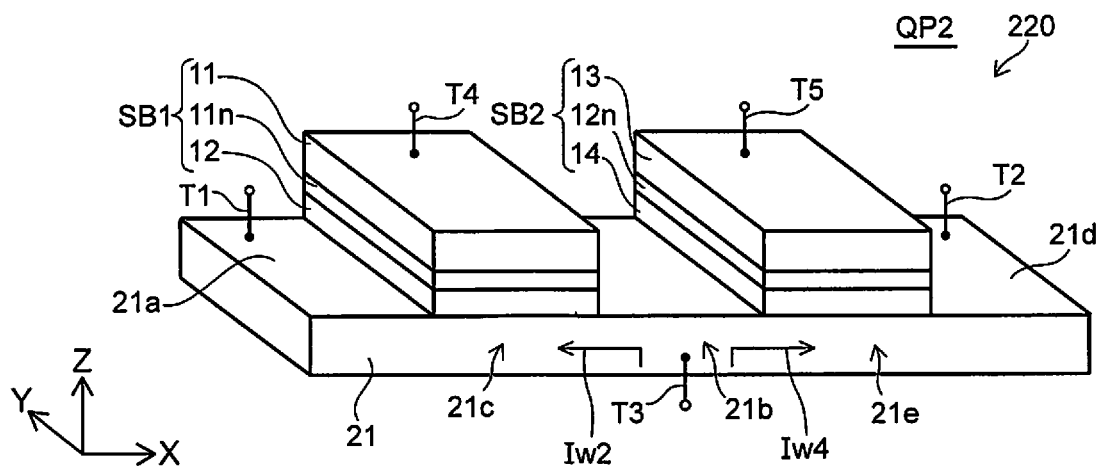
Figure 34C:
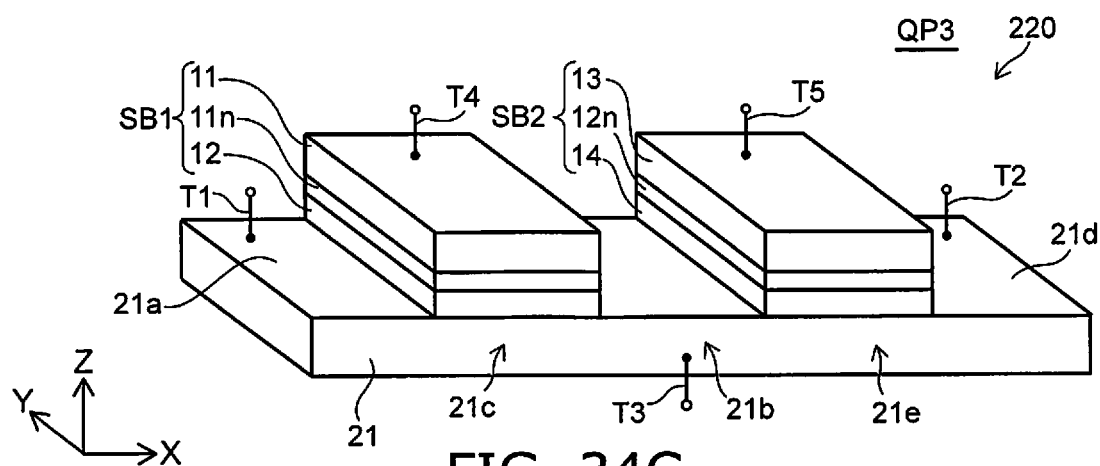

FIG. 34A to FIG. 34C are schematic perspective views illustrating a magnetic memory device according to the embodiment.

As shown in FIG. 34A, multiple stacked bodies (the first stacked body SB1 and the second stacked body SB2) are provided in the magnetic memory device 220 according to the embodiment. In the magnetic memory device 220, the current that flows in the first stacked body SB1 and the current that flows in the second stacked body SB2 are separate.

The first stacked body SB1 overlaps the third region 21c in the first direction (the Z-axis direction). The second stacked body SB2 overlaps the fifth region 21e in the first direction.

For example, a first terminal T1 is electrically connected to the first region 21a of the first conductive layer 21. A second terminal T2 is electrically connected to the fourth region 21d. A third terminal T3 is electrically connected to the second region 21b. A fourth terminal T4 is electrically connected to the first magnetic layer 11. A fifth terminal T5 is electrically connected to the third magnetic layer 13.

In one operation QP1 as shown in FIG. 34A, a first current Iw1 flows from the first terminal T1 toward the third terminal T3; and a third current Iw3 flows from the second terminal T2 toward the third terminal T3. The orientation of the current (the first current Iw1) at the position of the first stacked body SB1 is the reverse of the orientation of the current (the third current Iw3) at the position of the second stacked body SB2. In such an operation QP1, the orientation of the spin Hall torque acting on the second magnetic layer 12 of the first stacked body SB1 is the reverse of the orientation of the spin Hall torque acting on the fourth magnetic layer 14 of the second stacked body SB2.

In another operation QP2 shown in FIG. 34B, a second current Iw2 flows from the third terminal T3 toward the first terminal T1; and a fourth current Iw4 flows from the third terminal T3 toward the second terminal T2. The orientation of the current (the second current Iw2) at the position of the first stacked body SB1 is the reverse of the orientation of the current (the fourth current Iw4) at the position of the second stacked body SB2. In such an operation QP2, the orientation of the spin Hall torque acting on the second magnetic layer 12 of the first stacked body SB1 is the reverse of the orientation of the spin Hall torque acting on the fourth magnetic layer 14 of the second stacked body SB2.

As shown in FIG. 34A and FIG. 34B, the orientation of a fourth magnetization 14M of the fourth magnetic layer 14 is the reverse of the orientation of the second magnetization 12M of the second magnetic layer 12. On the other hand, the orientation of a third magnetization 13M of the third magnetic layer 13 is the same as the orientation of the first magnetization 11M of the first magnetic layer 11. Thus, magnetization information that has reverse orientations is stored between the first stacked body SB1 and the second stacked body SB2. For example, in the case of the operation QP1, the information (the data) corresponds to "1." For example, in the case of the operation QP2, the information (the data) corresponds to "0." By such operations, for example, the reading can be faster as described below.

In the operation QP1 and the operation QP2, the second magnetization 12M of the second magnetic layer 12 and the spin current of the electrons (the polarized electrons) flowing through the first conductive layer 21 have an interaction. The orientation of the second magnetization 12M and the orientation of the spin of the polarized electrons have a parallel or antiparallel relationship. The second magnetization 12M of the second magnetic layer 12 precesses and reverses. In the operation QP1 and the operation QP2, the orientation of the fourth magnetization 14M of the fourth magnetic layer 14 and the orientation of the spin of the polarized electrons have a parallel or antiparallel relationship. The fourth magnetization 14M of the fourth magnetic layer 14 precesses and reverses.

FIG. 34C illustrates a read operation of the magnetic memory device 220.

The potential of the fourth terminal T4 is set to the fourth potential V4 in the read operation QP3. Also, the potential of the fifth terminal T5 is set to the fifth potential V5. The fourth potential V4 is, for example, a ground potential. The potential difference between the fourth potential V4 and the fifth potential V5 is taken as ΔV. Two electrical resistances are taken as a high resistance Rh and a low resistance Rl for each of the multiple stacked bodies. The high resistance Rh is higher than the low resistance Rl. For example, the resistance when the first magnetization 11M and the second magnetization 12M are antiparallel corresponds to the high resistance Rh. For example, the resistance when the first magnetization 11M and the second magnetization 12M are parallel corresponds to the low resistance Rl. For example, the resistance when the third magnetization 13M and the fourth magnetization 14M are antiparallel corresponds to the high resistance Rh. For example, the resistance when the third magnetization 13M and the fourth magnetization 14M are parallel corresponds to the low resistance Rl.

For example, in the operation QP1 (the "1" state) illustrated in FIG. 34A, a potential Vr1 of the third terminal T3 is represented by Formula (1).

$$Vr1 = \{Rl/(Rl+Rh)\} \times \Delta V \tag{1}$$

On the other hand, a potential Vr2 of the third terminal T3 in the state of the operation QP2 (the "0" state) illustrated in FIG. 34B is represented by Formula (2).

$$Vr2 = \{Rh/(Rl+Rh)\} \times dV \tag{2}$$

Accordingly, the potential change ΔVr between the "1" state and the "0" state is represented by Formula (3).

$$\Delta Vr = Vr2 - Vr1 = \{(Rh-Rl)/(Rl+Rh)\} \times dV \tag{3}$$

The potential change ΔVr is obtained by measuring the potential of the third terminal T3.

Compared to the case where a constant current is supplied to the stacked body (the magnetoresistive element) and the voltage (the potential difference) between the two magnetic layers of the magnetoresistive element is measured, for example, the consumed energy when reading can be reduced in the read operation QP3 recited above. In the read operation QP3 recited above, for example, high-speed reading can be performed.

In the operation QP1 and the operation QP2 recited above, the perpendicular magnetic anisotropies of the second magnetic layer 12 and the fourth magnetic layer 14 can be controlled using the fourth terminal T4 and the fifth terminal T5. Thereby, the program current can be reduced. For example, the program current can be about ½ of the program current in the case where the programming is performed without using the fourth terminal T4 and the fifth terminal T5. For example, the program charge can be reduced. The relationship between the polarities of the voltages applied to the fourth terminal T4 and the fifth terminal T5 and the increase or decrease of the perpendicular magnetic anisotropy is dependent on the materials of the magnetic layers and the first conductive layer 21.

Examples of the materials of the layers included in the magnetic memory device will now be described.

The first conductive layer 21 includes, for example, at least one selected from the group consisting of tantalum and tungsten. The first conductive layer 21 includes, for example, at least one selected from the group consisting of β-tantalum and β-tungsten. The spin Hall angle is negative for these materials. The absolute value of the spin Hall angle is large for these materials. Thereby, the second magnetization 12M can be controlled efficiently by the program current.

The first conductive layer 21 may include at least one selected from the group consisting of platinum and gold. The spin Hall angle is positive for these materials. The absolute value of the spin Hall angle is large for these materials. Thereby, the second magnetization 12M can be controlled efficiently by the program current.

The second magnetic layer 12 includes, for example, at least one of a ferromagnetic material or a soft magnetic material. The second magnetic layer 12 may include, for example, an artificial lattice.

The second magnetic layer 12 includes, for example, at least one selected from the group consisting of FePd, FePt, CoPd, and CoPt. The soft magnetic material recited above includes, for example, CoFeB. The artificial lattice recited above includes, for example, a stacked film including a first film and a second film. The first film includes, for example, at least one of NiFe, Fe, or Co. The second film includes, for example, at least one of Cu, Pd, or Pt. For example, the first film is a magnetic material; and the second film is a nonmagnetic material.

In the embodiment, for example, the second magnetic layer 12 may have in-plane magnetic anisotropy. For example, the second magnetic layer 12 may have at least one of in-plane shape magnetic anisotropy, in-plane magneto-crystalline anisotropy, or in-plane induced magnetic anisotropy due to stress, etc.

The first nonmagnetic layer 11n includes, for example, at least one selected from the group consisting of MgO, CaO, SrO, TiO, VO, NbO, and $Al_2O_3$. The first nonmagnetic layer 11n is, for example, a tunneling barrier layer. In the case where the first nonmagnetic layer 11n includes MgO, the thickness of the first nonmagnetic layer 11n is, for example, about 1 nm.

The first magnetic layer 11 includes, for example, at least one selected from Co and CoFeB. The first magnetization 11M of the first magnetic layer 11 may be substantially fixed in one direction (a direction crossing the Z-axis direction) in the plane. The first magnetic layer 11 may be, for example, an in-plane magnetization film.

For example, the thickness of the first magnetic layer 11 is thicker than the thickness of the second magnetic layer 12. Thereby, the first magnetization 11M of the first magnetic layer 11 is fixed stably in a prescribed direction.

In the embodiment, the magnetic anisotropy due to the shape and the strain-induced magnetic anisotropy may be superimposed in the same orientation. For example, in FIG. 1B, the easy magnetization axis of the second magnetic layer 12 is aligned with the diagonal line direction of the planar configuration of the second magnetic layer 12 by the strain-induced magnetic anisotropy. By forming such an easy magnetization axis, the magnetostriction constant of the second magnetic layer 12 is selected; and an appropriate strain is formed.

For example, an appropriate retention energy is obtained because the magnetic anisotropy due to the shape and the strain-induced magnetic anisotropy have the same orientation. For example, the program current substantially does not increase even in the case where the strain-induced magnetic anisotropy is increased. Therefore, the program current per unit retention energy can be reduced.

In the embodiments, for example, a high storage density of $2.5F^2$/bit or $3F^2$/bit can be obtained.

The embodiments may include the following configurations (e.g., technological proposals).

Configuration 1

A magnetic memory device, comprising:
a first conductive layer including a first region, a second region, and a third region between the first region and the second region;
a first stacked body including
a first magnetic layer,
a second magnetic layer provided between the third region and the first magnetic layer in a first direction crossing a second direction, the second direction being from the first region toward the second region, and
a first nonmagnetic layer provided between the first magnetic layer and the second magnetic layer; and
a controller electrically connected to the first region, the second region, and the first magnetic layer,
the controller performing at least first to third operations,
in the first operation, the controller setting the first stacked body to a first resistance state by supplying a first current to the first conductive layer in an orientation from the first region toward the second region while setting the first magnetic layer to a first potential,
in the second operation, the controller setting the first stacked body to a second resistance state different from the first resistance state by supplying the first current to the first conductive layer while setting the first magnetic layer to a second potential different from the first potential,
in the third operation, the controller setting the first stacked body to a third resistance state different from the first resistance state and different from the second resistance state by supplying a second current to the first conductive layer in an orientation from the second region toward the first region while setting the first magnetic layer to a third potential different from the second potential.

Configuration 2

The magnetic memory device according to Configuration 1, wherein the third potential is the same as the first potential.

Configuration 3

The magnetic memory device according to Configuration 1 or 2, wherein
the controller further performs a fourth operation, and
in the fourth operation, the controller sets the first stacked body to a fourth resistance state different from the first resistance state, different from the second resistance state, and different from the third resistance state by supplying the second current to the first conductive layer while setting the first magnetic layer to a fourth potential different from the third potential.

Configuration 4

The magnetic memory device according to Configuration 3, wherein the fourth potential is the same as the second potential.

Configuration 5

The magnetic memory device according to Configuration 3 or 4, wherein
in the first operation and the third operation, a current flows in one of a direction from the first magnetic layer toward the second magnetic layer or a direction from the second magnetic layer toward the first magnetic layer, and
in the second operation and the fourth operation, a current flows in the other of the direction from the first magnetic layer toward the second magnetic layer or the direction from the second magnetic layer toward the first magnetic layer.

Configuration 6

The magnetic memory device according to Configuration 3 or 4, wherein the first potential is higher than a potential of the second region in the first operation, the second potential is lower than a potential of the first region in the second operation, the third potential is higher than the potential of the first region in the third operation, and the fourth potential is lower than the potential of the second region in the fourth operation.

Configuration 7

The magnetic memory device according to Configuration 6, wherein the first potential is higher than the potential of the first region in the first operation, the second potential is lower than the potential of the second region in the second operation, the third potential is higher than the potential of the second region in the third operation, and the fourth potential is lower than the potential of the first region in the fourth operation.

Configuration 8

The magnetic memory device according to any one of Configurations 1 to 7, wherein a first magnetization of the first magnetic layer is tilted with respect to the first direction.

Configuration 9

The magnetic memory device according to any one of Configurations 1 to 8, wherein a first magnetization of the first magnetic layer has a component perpendicular to the first direction, and an angle between the second direction and a direction of the component is not less than 5 degrees and not more than 40 degrees, not less than 50 degrees and not more than 85 degrees, not less than 95 degrees and not more than 130 degrees, not less than 140 degrees and not more than 175 degrees, not less than 185 degrees and not more than 220 degrees, not less than 230 degrees and not more than 265 degrees, not less than 275 degrees and not more than 310 degrees, or not less than 320 degrees and not more than 355 degrees.

Configuration 10

The magnetic memory device according to any one of Configurations 1 to 9, wherein the second magnetic layer has a first length along the second direction, and a second length along a third direction crossing a plane including the first direction and the second direction, a length along a first diagonal direction of the second magnetic layer is longer than the first length and longer than the second length, the first diagonal direction is perpendicular to the first direction and tilted with respect to the second direction, a length along a second diagonal direction of the second magnetic layer is longer than the first length and longer than the second length, and the second diagonal direction is perpendicular to the first direction, is tilted with respect to the second direction, and crosses the first diagonal direction.

Configuration 11

The magnetic memory device according to any one of Configurations 1 to 9, wherein the second magnetic layer has a first length along the second direction, and a second length along a third direction crossing a plane including the first direction and the second direction, a length along a first concave portion direction of the second magnetic layer is shorter than the first length and shorter than the second length, the first concave portion direction is perpendicular to the first direction, an angle between the first concave portion direction and the second direction is 22.5 degrees, a length along a second concave portion direction of the second magnetic layer is shorter than the first length and shorter than the second length, the second concave portion direction is perpendicular to the first direction, and an angle between the second concave portion direction and the third direction is 22.5 degrees.

Configuration 12

The magnetic memory device according to any one of Configurations 1 to 11, wherein the second magnetic layer includes:

a first magnetic film;

a second magnetic film provided between the first magnetic film and the first nonmagnetic layer; and a nonmagnetic film provided between the first magnetic film and the second magnetic film, and the nonmagnetic film includes Ir and has a thickness of not less than 0.3 nm and not more than 0.5 nm, or the nonmagnetic film includes Ru and has a thickness of not less than 0.3 nm and not more than 0.5 nm.

Configuration 13

The magnetic memory device according to any one of Configurations 1 to 12, further comprising:

a first cell transistor including a first end portion, a second end portion, and a first gate; and a first conductive layer transistor including a third end portion, a fourth end portion, and a second gate, the first end portion being electrically connected to the first magnetic layer, the second end portion and the first gate being electrically connected to the controller, the third end portion being electrically connected to one of the first region or the second region, the fourth end portion and the second gate being electrically connected to the controller, a direction from the first end portion toward the second end portion and a direction from the third end portion toward the fourth end portion being aligned with the first direction.

Configuration 14

The magnetic memory device according to Configuration 13, further comprising a second conductive layer transistor including a fifth end portion, a sixth end portion, and a third gate, the fifth end portion being electrically connected to the other of the first region or the second region, the sixth end portion and the third gate being electrically connected to the controller, a direction from the fifth end portion toward the sixth end portion being aligned with the first direction.

Configuration 15

The magnetic memory device according to any one of Configurations 1 to 12, further comprising:

a first conductive layer transistor including a third end portion, a fourth end portion, and a second gate; and a second conductive layer transistor including a fifth end portion, a sixth end portion, and a third gate, the third end portion being electrically connected to one of the first region or the second region, the fourth end portion and the second gate being electrically connected to the controller, the fifth end portion being electrically connected to the other of the first region or the second region, the sixth end portion and the third gate being electrically connected to the controller, a direction from the third end portion toward the fourth end portion and a direction from the fifth end portion toward the sixth end portion being aligned with the first direction.

Configuration 16

A magnetic memory device, comprising:
a first conductive layer including a first region, a second region, and a third region between the first region and the second region;
a first stacked body including
a first magnetic layer,
a second magnetic layer provided between the third region and the first magnetic layer in a first direction crossing a second direction, the second direction being from the first region toward the second region, and
a first nonmagnetic layer provided between the first magnetic layer and the second magnetic layer; and
a controller electrically connected to the first region, the second region, and the first magnetic layer,
the first nonmagnetic layer having a crystal structure of a cubic crystal,
a lattice length of the cubic crystal along the first direction being different from a lattice length of the cubic crystal along a direction perpendicular to the first direction,
the controller performing at least first to fourth operations,
in the first operation, the controller setting the first stacked body to a first resistance state by setting the first magnetic layer to a first potential,
in the second operation, the controller setting the first stacked body to a second resistance state different from the first resistance state by setting the first magnetic layer to a second potential different from the first potential,
in the third operation, the controller setting the first stacked body to a third resistance state different from the first resistance state and different from the second resistance state by supplying a first current to the first conductive layer in an orientation from the first region toward the second region,
in the fourth operation, the controller setting the first stacked body to a fourth resistance state different from the first resistance state, different from the second resistance state, and different from the third resistance state by supplying a second current to the first conductive layer in an orientation from the second region toward the first region.

Configuration 17

The magnetic memory device according to any one of Configurations 1 to 12, further comprising a second stacked body,
the first conductive layer further including a fourth region and a fifth region,
the second region being provided between the first region and the fourth region,
the fifth region being provided between the second region and the fourth region,
the second stacked body including:
a third magnetic layer;
a fourth magnetic layer provided between the fifth region and the third magnetic layer in the first direction; and
a second nonmagnetic layer provided between the third magnetic layer and the fourth magnetic layer,
the controller being further electrically connected to the third magnetic layer.

Configuration 18

The magnetic memory device according to Configuration 17, further comprising:
a first cell transistor including a first end portion, a second end portion, and a first gate;
a second cell transistor including a seventh end portion, an eighth end portion, and a fourth gate; and
a first middle interconnect,
the first end portion being electrically connected to the first magnetic layer,
the second end portion and the first gate being electrically connected to the controller,
the seventh end portion being electrically connected to the third magnetic layer,
the eighth end portion and the fourth gate being electrically connected to the controller,
the first middle interconnect being electrically connected to the second region and the controller,
a direction from the first end portion toward the second end portion and a direction from the seventh end portion toward the eighth end portion being aligned with the first direction.

Configuration 19

The magnetic memory device according to Configuration 18, further comprising:
a second conductive layer including a sixth region, a seventh region, and an eighth region between the sixth region and the seventh region, a direction from the sixth region toward the seventh region being aligned with the second direction;
a third stacked body including
a fifth magnetic layer,
a sixth magnetic layer provided between the eighth region and the fifth magnetic layer in the first direction, and
a third nonmagnetic layer provided between the fifth magnetic layer and the sixth magnetic layer; and
a third cell transistor including a ninth end portion, a tenth end portion, and a fifth gate,
the controller being further electrically connected to the sixth region, the seventh region, and the fifth magnetic layer,
a position in the first direction of the first gate being different from a position in the first direction of the fifth gate.

Configuration 20

The magnetic memory device according to Configuration 19, further comprising:
a first conductive layer transistor including a third end portion, a fourth end portion, and a second gate; and
a third conductive layer transistor including an eleventh end portion, a twelfth end portion, and a sixth gate,
the third end portion being electrically connected to one of the first region or the second region,
the fourth end portion and the second gate being electrically connected to the controller,
the eleventh end portion being electrically connected to one of the sixth region or the seventh region,
the twelfth end portion and the sixth gate being electrically connected to the controller,
a direction from the third end portion toward the fourth end portion and a direction from the eleventh end portion toward the twelfth end portion being aligned with the first direction,
a position in the first direction of the second gate being different from a position in the first direction of the sixth gate.

According to the embodiments, a magnetic memory device can be provided in which the storage density can be increased.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as conductive layers, stacked bodies, magnetic layers, nonmagnetic layers, transistors, interconnects, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
a first conductive layer including a first region, a second region, and a third region between the first region and the second region;
a first stacked body including
a first magnetic layer,
a second magnetic layer provided between the third region and the first magnetic layer in a first direction crossing a second direction, the second direction being from the first region toward the second region, and
a first nonmagnetic layer provided between the first magnetic layer and the second magnetic layer; and
a controller electrically connected to the first region, the second region, and the first magnetic layer,
the controller being configured to perform at least first to third operations,
in the first operation, the controller setting the first stacked body to a first resistance state by supplying a first current to the first conductive layer in an orientation from the first region toward the second region while setting the first magnetic layer to a first potential,
in the second operation, the controller setting the first stacked body to a second resistance state different from the first resistance state by supplying the first current to the first conductive layer while setting the first magnetic layer to a second potential different from the first potential,
in the third operation, the controller setting the first stacked body to a third resistance state different from the first resistance state and different from the second resistance state by supplying a second current to the first conductive layer in an orientation from the second region toward the first region while setting the first magnetic layer to a third potential different from the second potential.

2. The device according to claim 1, wherein the third potential is the same as the first potential.

3. The device according to claim 1, wherein
the controller further performs a fourth operation, and
in the fourth operation, the controller sets the first stacked body to a fourth resistance state different from the first resistance state, different from the second resistance state, and different from the third resistance state by supplying the second current to the first conductive layer while setting the first magnetic layer to a fourth potential different from the third potential.

4. The device according to claim 3, wherein the fourth potential is the same as the second potential.

5. The device according to claim 3, wherein
in the first operation and the third operation, a current flows in one of a direction from the first magnetic layer toward the second magnetic layer or a direction from the second magnetic layer toward the first magnetic layer, and
in the second operation and the fourth operation, a current flows in the other of the direction from the first magnetic layer toward the second magnetic layer or the direction from the second magnetic layer toward the first magnetic layer.

6. The device according to claim 3, wherein
the first potential is higher than a potential of the second region in the first operation,
the second potential is lower than a potential of the first region in the second operation,
the third potential is higher than the potential of the first region in the third operation, and
the fourth potential is lower than the potential of the second region in the fourth operation.

7. The device according to claim 6, wherein
the first potential is higher than the potential of the first region in the first operation,
the second potential is lower than the potential of the second region in the second operation,
the third potential is higher than the potential of the second region in the third operation, and
the fourth potential is lower than the potential of the first region in the fourth operation.

8. The device according to claim 1, wherein a first magnetization of the first magnetic layer is tilted with respect to the first direction.

9. The device according to claim 1, wherein
a first magnetization of the first magnetic layer has a component perpendicular to the first direction, and
an angle between the second direction and a direction of the component is not less than 5 degrees and not more than 40 degrees, not less than 50 degrees and not more than 85 degrees, not less than 95 degrees and not more than 130 degrees, not less than 140 degrees and not more than 175 degrees, not less than 185 degrees and not more than 220 degrees, not less than 230 degrees and not more than 265 degrees, not less than 275 degrees and not more than 310 degrees, or not less than 320 degrees and not more than 355 degrees.

10. The device according to claim 1, wherein
the second magnetic layer has a first length along the second direction, and a second length along a third direction crossing a plane including the first direction and the second direction,
a length along a first diagonal direction of the second magnetic layer is longer than the first length and longer than the second length,
the first diagonal direction is perpendicular to the first direction and tilted with respect to the second direction,
a length along a second diagonal direction of the second magnetic layer is longer than the first length and longer than the second length, and
the second diagonal direction is perpendicular to the first direction, is tilted with respect to the second direction, and crosses the first diagonal direction.

11. The device according to claim 1, wherein
the second magnetic layer has a first length along the second direction, and a second length along a third direction crossing a plane including the first direction and the second direction,
a length along a first concave portion direction of the second magnetic layer is shorter than the first length and shorter than the second length,
the first concave portion direction is perpendicular to the first direction,
an angle between the first concave portion direction and the second direction is 22.5 degrees,
a length along a second concave portion direction of the second magnetic layer is shorter than the first length and shorter than the second length,
the second concave portion direction is perpendicular to the first direction, and
an angle between the second concave portion direction and the third direction is 22.5 degrees.

12. The device according to claim 1, wherein
the second magnetic layer includes:
a first magnetic film;
a second magnetic film provided between the first magnetic film and the first nonmagnetic layer; and
a nonmagnetic film provided between the first magnetic film and the second magnetic film, and
the nonmagnetic film includes Ir and has a thickness of not less than 0.3 nm and not more than 0.5 nm, or the nonmagnetic film includes Ru and has a thickness of not less than 0.3 nm and not more than 0.5 nm.

13. The device according to claim 1, further comprising:
a first cell transistor including a first end portion, a second end portion, and a first gate; and
a first conductive layer transistor including a third end portion, a fourth end portion, and a second gate,
the first end portion being electrically connected to the first magnetic layer,
the second end portion and the first gate being electrically connected to the controller,
the third end portion being electrically connected to one of the first region or the second region,
the fourth end portion and the second gate being electrically connected to the controller,
a direction from the first end portion toward the second end portion and a direction from the third end portion toward the fourth end portion being aligned with the first direction.

14. The device according to claim 13, further comprising a second conductive layer transistor including a fifth end portion, a sixth end portion, and a third gate,
the fifth end portion being electrically connected to the other of the first region or the second region,
the sixth end portion and the third gate being electrically connected to the controller,
a direction from the fifth end portion toward the sixth end portion being aligned with the first direction.

15. The device according to claim 1, further comprising:
a first conductive layer transistor including a third end portion, a fourth end portion, and a second gate; and
a second conductive layer transistor including a fifth end portion, a sixth end portion, and a third gate,
the third end portion being electrically connected to one of the first region or the second region,
the fourth end portion and the second gate being electrically connected to the controller,
the fifth end portion being electrically connected to the other of the first region or the second region,
the sixth end portion and the third gate being electrically connected to the controller,
a direction from the third end portion toward the fourth end portion and a direction from the fifth end portion toward the sixth end portion being aligned with the first direction.

16. The device according to claim 1, further comprising a second stacked body,
the first conductive layer further including a fourth region and a fifth region,
the second region being provided between the first region and the fourth region,
the fifth region being provided between the second region and the fourth region,
the second stacked body including:
a third magnetic layer;
a fourth magnetic layer provided between the fifth region and the third magnetic layer in the first direction; and
a second nonmagnetic layer provided between the third magnetic layer and the fourth magnetic layer,
the controller being further electrically connected to the third magnetic layer.

17. The device according to claim 16, further comprising:
a first cell transistor including a first end portion, a second end portion, and a first gate;
a second cell transistor including a seventh end portion, an eighth end portion, and a fourth gate; and
a first middle interconnect,
the first end portion being electrically connected to the first magnetic layer,
the second end portion and the first gate being electrically connected to the controller,
the seventh end portion being electrically connected to the third magnetic layer,
the eighth end portion and the fourth gate being electrically connected to the controller,
the first middle interconnect being electrically connected to the second region and the controller,
a direction from the first end portion toward the second end portion and a direction from the seventh end portion toward the eighth end portion being aligned with the first direction.

18. The device according to claim 17, further comprising:
a second conductive layer including a sixth region, a seventh region, and an eighth region between the sixth region and the seventh region, a direction from the sixth region toward the seventh region being aligned with the second direction;
a third stacked body including
a fifth magnetic layer,
a sixth magnetic layer provided between the eighth region and the fifth magnetic layer in the first direction, and
a third nonmagnetic layer provided between the fifth magnetic layer and the sixth magnetic layer; and
a third cell transistor including a ninth end portion, a tenth end portion, and a fifth gate,
the controller being further electrically connected to the sixth region, the seventh region, and the fifth magnetic layer,
a position in the first direction of the first gate being different from a position in the first direction of the fifth gate.

19. The device according to claim 18, further comprising:
a first conductive layer transistor including a third end portion, a fourth end portion, and a second gate; and
a third conductive layer transistor including an eleventh end portion, a twelfth end portion, and a sixth gate,
the third end portion being electrically connected to one of the first region or the second region,
the fourth end portion and the second gate being electrically connected to the controller,
the eleventh end portion being electrically connected to one of the sixth region or the seventh region,
the twelfth end portion and the sixth gate being electrically connected to the controller,
a direction from the third end portion toward the fourth end portion and a direction from the eleventh end portion toward the twelfth end portion being aligned with the first direction,
a position in the first direction of the second gate being different from a position in the first direction of the sixth gate.

20. A magnetic memory device, comprising:
a first conductive layer including a first region, a second region, and a third region between the first region and the second region;
a first stacked body including
a first magnetic layer,
a second magnetic layer provided between the third region and the first magnetic layer in a first direction crossing a second direction, the second direction being from the first region toward the second region, and
a first nonmagnetic layer provided between the first magnetic layer and the second magnetic layer; and
a controller electrically connected to the first region, the second region, and the first magnetic layer,
the first nonmagnetic layer having a crystal structure of a cubic crystal,
a lattice length of the cubic crystal along the first direction being different from a lattice length of the cubic crystal along a direction perpendicular to the first direction,
the controller being configured to perform at least first to fourth operations,
in the first operation, the controller setting the first stacked body to a first resistance state by setting the first magnetic layer to a first potential,
in the second operation, the controller setting the first stacked body to a second resistance state different from the first resistance state by setting the first magnetic layer to a second potential different from the first potential,
in the third operation, the controller setting the first stacked body to a third resistance state different from the first resistance state and different from the second resistance state by supplying a first current to the first conductive layer in an orientation from the first region toward the second region,
in the fourth operation, the controller setting the first stacked body to a fourth resistance state different from the first resistance state, different from the second resistance state, and different from the third resistance state by supplying a second current to the first conductive layer in an orientation from the second region toward the first region.

* * * * *